(12) United States Patent
Yamazaki et al.

(10) Patent No.: US 12,230,172 B2
(45) Date of Patent: Feb. 18, 2025

(54) SEMICONDUCTOR DEVICE AND ELECTRONIC DEVICE

(71) Applicant: SEMICONDUCTOR ENERGY LABORATORY CO., LTD., Atsugi (JP)

(72) Inventors: Shunpei Yamazaki, Tokyo (JP); Yosuke Tsukamoto, Kanagawa (JP); Koji Kusunoki, Kanagawa (JP); Hisao Ikeda, Kanagawa (JP); Akio Endo, Kanagawa (JP); Yoshiaki Oikawa, Kanagawa (JP); Hideki Uochi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/263,159

(22) PCT Filed: Jan. 18, 2022

(86) PCT No.: PCT/IB2022/050369
§ 371 (c)(1),
(2) Date: Jul. 27, 2023

(87) PCT Pub. No.: WO2022/162497
PCT Pub. Date: Aug. 4, 2022

(65) Prior Publication Data
US 2024/0087487 A1    Mar. 14, 2024

(30) Foreign Application Priority Data

Jan. 28, 2021   (JP) ................................. 2021-011946
Apr. 30, 2021   (JP) ................................. 2021-077238

(51) Int. Cl.
*G09G 3/00*     (2006.01)
*G02B 27/01*    (2006.01)
(Continued)

(52) U.S. Cl.
CPC ......... *G09G 3/001* (2013.01); *G02B 27/0172* (2013.01); *G02B 27/0179* (2013.01);
(Continued)

(58) Field of Classification Search
CPC ................ G09G 3/001; G09G 3/3233; G09G 2300/0465; G09G 2300/0842;
(Continued)

(56) References Cited

U.S. PATENT DOCUMENTS 7,248,232 B1   7/2007   Yamazaki et al.
9,916,690 B2   3/2018   Nobori et al.
(Continued)

FOREIGN PATENT DOCUMENTS

CN   104704818 A   6/2015
EP   3013042 A     4/2016
(Continued)

OTHER PUBLICATIONS

International Search Report (Application No. PCT/IB2022/050369) Dated May 10, 2022.
(Continued)

*Primary Examiner* — Robert J Michaud
(74) *Attorney, Agent, or Firm* — Fish & Richardson P.C.

(57) ABSTRACT

A semiconductor device having favorable display quality is provided. The semiconductor device is provided with a display portion, a line-of-sight sensor portion, a control portion, and an arithmetic portion. The line-of-sight sensor portion has a function of obtaining first information showing a direction of a user's line of sight. The arithmetic portion has a function of determining a first region including a gaze point of the user on the display portion with use of the first information and a function of increasing a definition of an image displayed on the first region. Light emitted from the
(Continued)

display portion may be used to obtain the first information showing the direction of the line of sight.

13 Claims, 19 Drawing Sheets

(51) Int. Cl.
*G06F 3/01* (2006.01)
*G09G 3/3233* (2016.01)

(52) U.S. Cl.
CPC ............ *G06F 3/013* (2013.01); *G09G 3/3233* (2013.01); *G02B 2027/0178* (2013.01); *G02B 2027/0187* (2013.01); *G09G 2300/0465* (2013.01); *G09G 2300/0842* (2013.01); *G09G 2340/0407* (2013.01); *G09G 2354/00* (2013.01)

(58) Field of Classification Search
CPC ....... G09G 2340/0407; G09G 2354/00; G02B 27/0172; G02B 27/0179; G02B 2027/0178; G02B 2027/0187; G06F 3/013
See application file for complete search history.

(56) References Cited

U.S. PATENT DOCUMENTS

| | | | |
|---|---|---|---|
| 11,079,599 | B1 | 8/2021 | Wheelwright et al. |
| 2014/0268336 | A1 | 9/2014 | Hiraide |
| 2015/0192777 | A1 | 7/2015 | Bae et al. |
| 2015/0235427 | A1* | 8/2015 | Nobori ................ G02B 27/017 345/629 |
| 2016/0116748 | A1 | 4/2016 | Carollo et al. |
| 2016/0195726 | A1 | 7/2016 | Fujishiro |
| 2019/0346918 | A1 | 11/2019 | Akkaya et al. |
| 2020/0013371 | A1 | 1/2020 | Yang et al. |
| 2020/0057330 | A1 | 2/2020 | Yamazaki et al. |
| 2020/0211153 | A1* | 7/2020 | Kawaguchi ............ G06T 3/047 |
| 2020/0271961 | A1 | 8/2020 | Ardisana, II et al. |
| 2020/0285055 | A1 | 9/2020 | Shirko |
| 2020/0348755 | A1* | 11/2020 | Gebauer ................ G06V 10/82 |
| 2021/0072821 | A1 | 3/2021 | von und Zu Liechtenstein |
| 2021/0165484 | A1* | 6/2021 | Suguhara ................ G09G 5/00 |
| 2021/0168229 | A1* | 6/2021 | Kallman ............... G06F 1/1643 |

FOREIGN PATENT DOCUMENTS

| | | |
|---|---|---|
| JP | 2000-002856 A | 1/2000 |
| JP | 2018-151443 A | 9/2018 |
| KR | 2019-0100097 A | 8/2019 |
| WO | WO-2014/203440 | 12/2014 |
| WO | WO-2020/039933 | 2/2020 |
| WO | WO-2020/183054 | 9/2020 |

OTHER PUBLICATIONS

Written Opinion (Application No. PCT/IB2022/050369) Dated May 10, 2022.

\* cited by examiner

| Group | Algorithm | Quality | Processing speed |
|---|---|---|---|
| A | Nearest neighbor | Lowest | High ↕ Low |
| A | Bilinear | low | |
| A | Bicubic | Medium | |
| B | RAISR | High | |
| B | ANR | High | |
| B | A+ | Higher | |
| C | SRCNN | Highest | |

FIG. 19A
| Amorphous | Intermediate state<br>New crystalline phase<br>Crystalline | Crystal |
|---|---|---|
| ·completely<br>amorphous | ·CAAC<br>·nc<br>·CAC<br>excluding<br>single crystal<br>and poly crystal | ·single crystal<br>·poly crystal |
FIG. 19B
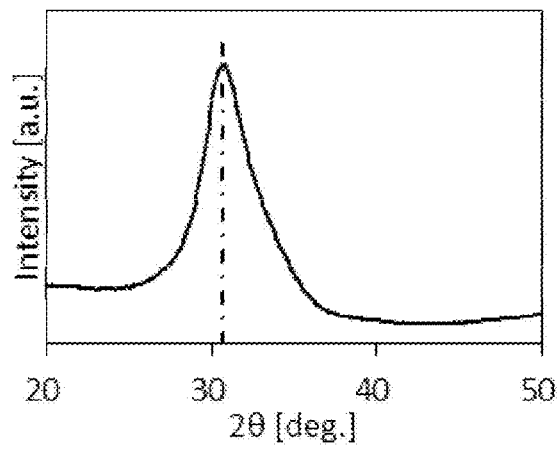
FIG. 19C
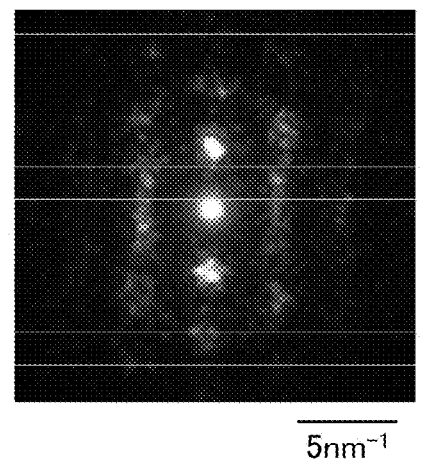

SEMICONDUCTOR DEVICE AND ELECTRONIC DEVICE

CROSS REFERENCE TO RELATED APPLICATIONS

This application is a U.S. National Phase Application under 35 U.S.C. § 371 of International Application PCT/IB2022/050369, filed on Jan. 18, 2022, which is incorporated by reference and claims the benefit of foreign priority applications filed in Japan on Jan. 28, 2021, as Application No. 2021-011946, and on Apr. 30, 2021, as Application No. 2021-077238.

TECHNICAL FIELD

One embodiment of the present invention relates to an electronic device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display apparatus, a light-emitting apparatus, a power storage device, a memory device, a driving method thereof, and a manufacturing method thereof.

BACKGROUND ART

As electronic devices provided with display apparatuses for augmented reality (AR) or virtual reality (VR), wearable electronic devices and stationary electronic devices are becoming widespread. Examples of wearable electronic devices include a head-mounted display (HMD) and an eyeglass-type electronic device. Examples of stationary electronic devices include a head-up display (HUD).

When using an electronic device such as an HMD with a short distance between a display portion and a user, the user is likely to perceive pixels and strongly feels granularity, whereby the sense of immersion and realistic sensation of AR or VR might be diminished. Thus, an HMD is preferably provided with a display apparatus that has minute pixels so that the pixels are not perceived by the user. Patent Document 1 discloses a method in which an HMD including minute pixels is achieved by using transistors capable of high-speed operation.

REFERENCE

[Patent Document]
[Patent Document 1] Japanese Published Patent Application No. 2000-2856

SUMMARY OF THE INVENTION

Problems to be Solved by the Invention

In the HMD, although the sense of immersion and realistic sensation can be improved by providing a display apparatus for the right eye and a display apparatus for the left eye, reductions in power consumption and production costs are difficult. Being mounted on user's head, the HMD is desired to be lightweight to prevent fatigue due to long-time use.

An object of one embodiment of the present invention is to provide a display apparatus, a semiconductor device, an electronic device, or the like having favorable display quality. Another object is to provide a highly reliable display apparatus, semiconductor device, electronic device, or the like. Another object is to provide a display apparatus, a semiconductor device, an electronic device, or the like with low power consumption. Another object is to provide a lightweight display apparatus, semiconductor device, electronic device, or the like. Another object is to provide a display apparatus, a semiconductor device, an electronic device, or the like with high productivity. Another object is to provide a novel display apparatus, semiconductor device, an electronic device, or the like.

Note that the description of these objects does not preclude the existence of other objects. One embodiment of the present invention does not have to achieve all these objects. Note that other objects will be apparent from the description of the specification, the drawings, the claims, and the like, and other objects can be derived from the description of the specification, the drawings, the claims, and the like.

Means for Solving the Problems

One embodiment of the present invention is a semiconductor device including a display portion, a line-of-sight sensor portion, and an arithmetic portion. The line-of-sight sensor portion has a function of obtaining first information showing a direction of a user's line of sight, and the arithmetic portion has a function of determining a first region including a gaze point of the user on the display portion with use of the first information and a function of increasing a definition of an image displayed on the first region.

The arithmetic portion may have a function of determining a second region adjacent to an outside of the first region. The definition of the image displayed on the first region is preferably higher than a definition of an image displayed on the second region.

The first information may be obtained with use of light emitted from the display portion. The arithmetic portion preferably has a function of increasing the definition of the image displayed on the first region with use of a neural network. The definition of the image displayed on the first region may be determined in accordance with an image scene.

The above-described semiconductor device can be used in a glasses-type or goggle-type electronic device, together with an optical member.

Another embodiment of the present invention is an electronic device including a display apparatus provided with a plurality of pixels in a display region, a first lens, a second lens, and a first to fourth mirrors. The display region includes a first display region and a second display region. The first lens is placed between the first display region and the first mirror. A first image displayed on the first display region is projected onto the first mirror through the first lens. The first mirror reflects the projected first image toward the third mirror. The third mirror transmits first external light and reflects the first image. The second lens is placed between the second display region and the second mirror. A second image displayed on the second display region is projected onto the second mirror through the second lens. The second mirror reflects the projected second image toward the fourth mirror. The fourth mirror transmits second external light and reflects the second image. A user of the electronic device of one embodiment of the present invention can see the first external light, the second external light, the first image, and the second image at the same time.

Another embodiment of the present invention is an electronic device including: a display apparatus including a plurality of pixels in a display region; a first lens; a second lens; a first mirror; a second mirror; a third mirror; and a fourth mirror. The display region includes a first display region and a second display region, the first lens is placed between the first display region and the first mirror, the first mirror has a function of reflecting a first image displayed on the first display region to the third mirror, the third mirror has a function of reflecting the first image and a function of transmitting first external light, the second lens is placed between the second display region and the second mirror, the second mirror has a function of reflecting a second image displayed on the second display region to the fourth mirror, and the fourth mirror has a function of reflecting the second image and a function of transmitting second external light.

Convex mirrors may be used as the first mirror and the second mirror. Concave mirrors may be used as the third mirror and the fourth mirror.

A user can see the first external light, the second external light, the first image, and the second image at the same time. A definition of the display region is preferably 4K, further preferably 8K. A resolution of the display region is preferably higher than or equal to 1000 ppi and lower than or equal to 10000 ppi. For example, the resolution may be higher than or equal to 2000 ppi and lower than or equal to 6000 ppi, or higher than or equal to 3000 ppi and lower than or equal to 5000 ppi. An aspect ratio of the display region is, for example, 16:9.

Effect of the Invention

With one embodiment of the present invention, a display apparatus, a semiconductor device, an electronic device, or the like having favorable display quality can be provided. A highly reliable display apparatus, semiconductor device, electronic device, or the like can be provided. A display apparatus, a semiconductor device, an electronic device, or the like with low power consumption can be provided. A lightweight display apparatus, semiconductor device, electronic device, or the like can be provided. A display apparatus, a semiconductor device, an electronic device, or the like with high productivity can be provided. A novel display apparatus, semiconductor device, an electronic device, or the like can be provided.

Note that the description of these effects does not preclude the existence of other effects. One embodiment of the present invention does not have to have all these effects. Note that other effects will be apparent from the description of the specification, the drawings, the claims, and the like, and other effects can be derived from the description of the specification, the drawings, the claims, and the like.

BRIEF DESCRIPTION OF THE DRAWINGS

FIG. 3A and FIG. 3B1 to FIG. 3B5 are diagrams illustrating structure examples of a display apparatus.
FIG. 8 is a diagram illustrating an example of an algorithm.
FIG. 19A is a diagram showing the classification of crystal structures.
FIG. 19B is a graph showing an XRD spectrum of a CAAC-IGZO film.
FIG. 19C is an image showing a nanobeam electron diffraction pattern of a CAAC-IGZO film.

MODE FOR CARRYING OUT THE INVENTION

Figure 1A:
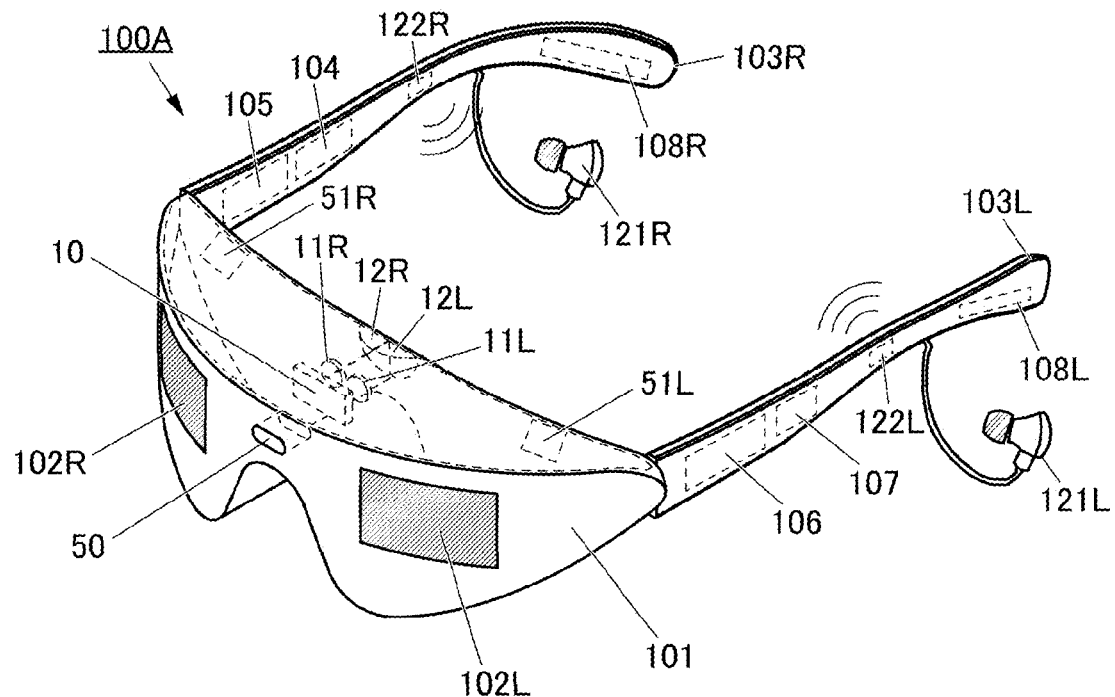
FIG. 1A and FIG. 1B are diagrams illustrating a structure example of an electronic device.

In this specification and the like, a semiconductor device refers to a device that utilizes semiconductor characteristics, and means a circuit including a semiconductor element (a transistor, a diode, a photodiode, or the like), a device including the circuit, and the like. In addition, the semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than that shown in the drawings or the text is regarded as being disclosed in the drawings or the text. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, or a load) can be connected between X and Y. Note that a switch is controlled to be in an on state or an off state. That is, a switch has a function of controlling whether or not current flows by being in a conduction state (on state) or a non-conduction state (off state).

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; a control circuit; or the like) can be connected between X and Y. Note that for example, even when another circuit is sandwiched between X and Y, X and Y are functionally connected when a signal output from X is transmitted to Y.

Note that an explicit description that X and Y are electrically connected includes the case where X and Y are electrically connected (i.e., the case where X and Y are connected with another element or another circuit sandwiched therebetween) and the case where X and Y are directly connected (i.e., the case where X and Y are connected without another element or another circuit sandwiched therebetween).

In addition, it can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by using an expression method similar to these examples, a source (or a first terminal or the like) and a drain (or a second terminal or the like) of a transistor can be distinguished from each other to specify the technical scope. Note that these expressions are just examples and expressions are not limited to these expressions. Here, each of X and Y denotes an object (e.g., a device, an element, a circuit, a wiring, an electrode, a terminal, a conductive film, or a layer).

Note that even when a circuit diagram shows that independent components are electrically connected to each other, one component has functions of a plurality of components in some cases. For example, when part of a wiring also functions as an electrode, one conductive film has functions of both components: a function of the wiring and a function of the electrode. Thus, electrical connection in this specification also includes such a case where one conductive film has functions of a plurality of components, in its category.

In addition, in this specification and the like, for a "resistor", a circuit element, a wiring, or the like having a resistance value higher than 0Ω can be used, for example. Therefore, in this specification and the like, a "resistor" includes a wiring having a resistance value, a transistor in which current flows between its source and drain, a diode, a coil, and the like. Thus, the term "resistor" can be replaced with the term such as "resistance", "load", or "region having a resistance value"; conversely, the term "resistance", "load", or "region having a resistance value" can be replaced with the term such as "resistor". The resistance value can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance value may be higher than or equal to 1Ω and lower than or equal to $1\times10^9$ Ω.

In the case where a wiring is used for a resistor, the resistance value is sometimes determined depending on the length of the wiring. Alternatively, a conductor with resistivity different from that of a conductor used for a wiring is sometimes used for a resistor. Alternatively, the resistance value is sometimes determined by doping a semiconductor with an impurity.

In addition, in this specification and the like, a "capacitor" can be, for example, a circuit element having an electrostatic capacitance value higher than 0 F, a region of a wiring having an electrostatic capacitance value higher than 0 F, parasitic capacitance, gate capacitance of a transistor, or the like. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. Furthermore, the term such as "capacitor", "parasitic capacitance", or "gate capacitance" can be replaced with the term such as "capacitance"; conversely, the term "capacitance" can be replaced with the term such as "capacitor", "parasitic capacitance", or "gate capacitance". Moreover, the term "pair of electrodes" of "capacitor" can be replaced with "pair of conductors", "pair of conductive regions", "pair of regions", and the like. Note that the electrostatic capacitance value can be higher than or equal to 0.05 fF and lower than or equal to 10 pF, for example. As another example, the electrostatic capacitance value may be higher than or equal to 1 pF and lower than or equal to 10 μF.

In addition, in this specification and the like, a transistor includes three terminals called a gate, a source, and a drain. The gate functions as a control terminal for controlling the conduction state of the transistor. Two terminals functioning as the source and the drain are input/output terminals of the transistor. One of the two input/output terminals serves as the source and the other serves as the drain depending on the conductivity type (n-channel type or p-channel type) of the transistor and the levels of potentials applied to the three terminals of the transistor. Thus, the terms "source" and "drain" can be replaced with each other in this specification and the like. Furthermore, in this specification and the like, expressions "one of a source and a drain" (or a first electrode or a first terminal) and "the other of the source and the drain" (or a second electrode or a second terminal) are used in the description of the connection relation of a transistor. Note that depending on the transistor structure, a transistor may include a back gate in addition to the above three terminals. In that case, in this specification and the like, one of the gate and the back gate of the transistor is sometimes referred to as a first gate, and the other of the gate and the back gate of the transistor is sometimes referred to as a second gate. Moreover, the terms "gate" and "back gate" can be replaced with each other in one transistor in some cases. In the case where a transistor includes three or more gates, the gates may be sometimes referred to as a first gate, a second gate, and a third gate, for example, in this specification and the like.

In this specification and the like, "node" can be referred to as a terminal, a wiring, an electrode, a conductive layer, a conductor, an impurity region, or the like depending on a circuit structure, a device structure, or the like. Furthermore, a terminal, a wiring, or the like can be referred to as "node".

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, change with a change of the reference potential.

In this specification and the like, the terms "high-level potential" (also referred to as "H potential" or "H") and "low-level potential" (also referred to as "L potential" or "L") do not mean a particular potential. For example, in the case where two wirings are both described as "functioning as a wiring for supplying a high-level potential", the levels of the high-level potentials supplied from these wirings are not necessarily equal to each other. Similarly, in the case where two wirings are both described as "functioning as a wiring for supplying a low-level potential", the levels of the low-level potentials supplied from these wirings are not necessarily equal to each other.

"Current" is a charge transfer phenomenon (electrical conduction); for example, the description "electrical conduction of positively charged particles occurs" can be rephrased as "electrical conduction of negatively charged particles occurs in an opposite direction". Therefore, unless otherwise specified, "current" in this specification and the like refers to a charge transfer phenomenon (electrical conduction) accompanied by carrier movement. Examples of a carrier here include an electron, a hole, an anion, a cation, and a complex ion, and the carrier differs between current flow systems (e.g., a semiconductor, a metal, an electrolyte solution, and a vacuum). In addition, "direction of current" in a wiring or the like refers to a direction in which a positive carrier moves, and the amount of current is expressed as a positive value. In other words, a direction in which a negative carrier moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. Furthermore, the description "current is input to element A" can be rephrased as "current is output from element A", for example.

In addition, ordinal numbers such as "first", "second", and "third" in this specification and the like are used to avoid confusion among components. Thus, the ordinal numbers do not limit the number of components. Furthermore, the ordinal numbers do not limit the order of components. For example, a "first" component in one embodiment in this specification and the like can be referred to as a "second" component in other embodiments, the scope of claims, or the like. For another example, a "first" component in one embodiment in this specification and the like can be omitted in other embodiments, the scope of claims, or the like.

In this specification and the like, terms for describing arrangement, such as "over", "under", "above", and "below" are sometimes used for convenience to describe the positional relation between components with reference to drawings. The positional relation between components is changed as appropriate in accordance with a direction in which each component is described. Thus, the positional relation is not limited to the terms described in the specification and the like, and can be described with another term as appropriate depending on the situation. For example, the expression "an insulator positioned over (on) the top surface of a conductor" can be replaced with the expression "an insulator positioned under (on) a bottom surface of a conductor" when the direction of a drawing showing these components is rotated by 180°. Moreover, the expression "an insulator positioned over (on) a top surface of a conductor" can be replaced with the expression "an insulator positioned on a left surface (or a right surface) of a conductor" when the direction of a drawing showing these components is rotated by 90°. Each of the terms "over" and "under" in this specification and the like does not necessarily mean that a component is placed directly on or directly under and directly in contact with another component. For example, the expression "electrode B over insulating layer A" does not necessarily mean that the electrode B is formed on and in direct contact with the insulating layer A, and does not exclude the case where another component is provided between the insulating layer A and the electrode B.

Each of the terms "adjacent" and "proximity" in this specification and the like does not necessarily mean that a component is directly in contact with another component. For example, the expression "electrode B adjacent to insulating layer A" does not necessarily mean that the electrode B is formed in direct contact with the insulating layer A and does not exclude the case where another component is provided between the insulating layer A and the electrode B.

Furthermore, the term "overlap", for example, in this specification and the like does not limit a state such as the stacking order of components. For example, the expression "electrode B overlapping with insulating layer A" does not necessarily mean the state where "electrode B is formed over insulating layer A", and does not exclude the state where "electrode B is formed under insulating layer A" and the state where "electrode B is formed on the right side (or the left side) of insulating layer A".

In this specification and the like, the terms "film", "layer", and the like can be interchanged with each other depending on the situation. For example, the term "conductive layer" can be changed into the term "conductive film" in some cases. As another example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. Furthermore, for example, the term "insulating layer" or "insulating film" can be changed into the term "insulator" in some cases.

In this specification and the like, the term such as "electrode", "wiring", or "terminal" does not limit the function of a component. For example, an "electrode" is used as part of a "wiring" in some cases, and vice versa. Furthermore, the term "electrode" or "wiring" also includes the case where a plurality of "electrodes" or "wirings" are formed in an integrated manner, for example. For example, a "terminal" is used as part of a "wiring" or an "electrode" in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the term such as "electrode", "wiring", or "terminal" is sometimes replaced with the term such as "region" depending on the case.

In this specification and the like, the term such as "wiring", "signal line", or "power supply line" can be interchanged with each other depending on the case or the situation. For example, the term "wiring" can be changed into the term "signal line" in some cases. Furthermore, for example, the term "wiring" can be changed into the term such as "power supply line" in some cases. Conversely, the term such as "signal line" or "power supply line" can be changed into the term "wiring" in some cases. The term such as "power supply line" can be changed into the term such as "signal line" in some cases. Conversely, the term such as "signal line" can be changed into the term such as "power supply line" in some cases. Moreover, the term "potential" that is applied to a wiring can sometimes be changed into the term such as "signal" depending on the case or the situation. Conversely, the term such as "signal" can be changed into the term "potential" in some cases.

In this specification and the like, an impurity in a semiconductor refers to, for example, an element other than a main component of a semiconductor layer. For example, an element with a concentration lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, in the case where the semiconductor is a silicon layer, examples of an impurity that changes characteristics of the semiconductor include oxygen, Group 1 elements except hydrogen, Group 2 elements, Group 13 elements, and Group 15 elements.

In this specification and the like, a switch has a function of controlling whether current flows or not by being in a conduction state (an on state) or a non-conduction state (an off state). Alternatively, a switch has a function of selecting and changing a current path. For example, an electrical switch, a mechanical switch, or the like can be used. That is, a switch can be any element capable of controlling current, and is not limited to a certain element.

Examples of the electrical switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case where a transistor is used as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (Micro Electro Mechanical Systems) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Accordingly, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. In addition, "perpendicular" indicates a state where two straight lines are placed at an angle greater than or equal to 80° and less than or equal to 100°. Accordingly, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Note that in this specification and the like, the terms "identical", "the same", "equal", "uniform", and the like used in describing calculation values and measurement values or in describing objects, methods, events, and the like that can be converted into calculation values or measurement values allow for a margin of error of ±20% unless otherwise specified.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used as a semiconductor layer of a transistor, the metal oxide is referred to as an oxide semiconductor or a metal oxide semiconductor in some cases. That is, when a channel of a transistor that has at least one of an amplifying function, a rectifying function, and a switching function is formed in a metal oxide, the metal oxide can be referred to as an oxide semiconductor or a metal oxide semiconductor. In the case where an "OS transistor" is mentioned, the "OS transistor" can also be referred to as a transistor including a metal oxide or an oxide semiconductor.

In this specification and the like, a metal oxide containing nitrogen is also collectively referred to as a metal oxide in some cases. Furthermore, a metal oxide containing nitrogen may be referred to as a metal oxynitride.

In this specification and the like, one embodiment of the present invention can be constituted by combining, as appropriate, a structure described in each embodiment with any of the structures described in the other embodiments. Furthermore, in the case where a plurality of structure examples are described in one embodiment, the structure examples can be combined with each other as appropriate.

Embodiments described in this specification are described with reference to the drawings. Note that the embodiments can be implemented in many different modes, and it will be readily understood by those skilled in the art that the modes and details can be changed in various ways without departing from the spirit and scope thereof. Therefore, the present invention should not be construed as being limited to the description in the embodiments. Note that in the structures of the invention in the embodiments, the same reference numerals are used in common for the same portions or portions having similar functions in different drawings, and repeated description thereof is omitted in some cases. Moreover, some components are omitted in a perspective view, a top view, and the like for easy understanding of the drawings in some cases. For easy understanding of the drawings, indication such as hatching is omitted, in some cases.

In the drawings in this specification, the size, the layer thickness, or the region is exaggerated for clarity in some cases. Therefore, embodiments of the present invention are not limited to the size, aspect ratio, and the like shown in the drawings. Note that the drawings schematically show ideal examples, and embodiments of the present invention are not limited to shapes, values, and the like shown in the drawings. For example, variation in signal, voltage, or current due to noise or variation in signal, voltage, or current due to difference in timing can be included.

In this specification and the like, when a plurality of components are denoted by the same reference numerals, and in particular need to be distinguished from each other, an identification character such as "A", "a", "_1", "[i]", or "[m,n]" is sometimes added to the end of each reference numeral. For example, a plurality of light-emitting elements 70 are sometimes shown individually as a light-emitting element 70R, a light-emitting element 70G, and a light-emitting element 70B. In other words, in the cases where matters that apply to the light-emitting element 70R, the light-emitting element 70G, and the light-emitting element 70B are described and they do not need to be differentiated from each other, the light-emitting elements may be simply referred to as the light-emitting element 70.

Embodiment 1

An electronic device 100A and an electronic device 100B of one embodiment of the present invention are described with reference to drawings.
<Electronic Device 100A>
FIG. 1 is a diagram illustrating a structure example of the electronic device 100A of one embodiment of the present invention. FIG. 1A is a perspective external view of the electronic device 100A of one embodiment of the present invention. The electronic device 100A is a glasses-type electronic device. The electronic device 100A includes a housing 101 and wearing portions 103 (a wearing portion 103R and a wearing portion 103L). The electronic device 100A is a wearable electronic device for augmented reality (AR) applications.

Furthermore, the electronic device 100A is provided with a sensor portion 50, sensor portions 51 (a sensor portion 51R and a sensor portion 51L), a power supply portion (a battery 104 and a voltage generation portion 105), a control portion 106, a communication portion 107, and antennas 108 (an antenna 108R and an antenna 108L). For example, in the electronic device 100A, the wearing portion 103R is provided with the battery 104, the voltage generation portion 105, and the antenna 108R, and the wearing portion 103L is provided with the control portion 106, the communication portion 107, and the antenna 108L.

Furthermore, the electronic device 100A is provided with earphones 121 (an earphone 121R, an earphone 121L). Instead of the earphones 121, bone conduction acoustic devices 122 (an acoustic device 122R, an acoustic device 122L) may be provided. Either one or both of the earphones 121 and the bone conduction acoustic devices 122 may be provided. For example, in the electronic device 100A, the wearing portion 103R is provided with the bone conduction acoustic device 122R, and the wearing portion 103L is provided with the bone conduction acoustic device 122L. With the bone conduction acoustic devices 122, a user can catch an acoustic signal transmitted from the electronic device 100A and an ambient sound at the same time. [Sensor portion] The sensor portion 50 and the sensor portions 51 have a function of obtaining information on one or more of the senses of sight, hearing, touch, taste, and smell of the user. Specifically, the sensor portion 50 and the sensor portions 51 have a function of sensing or measuring force, displacement, position, speed, acceleration, angular velocity, rotational frequency, distance, light, magnetism, temperature, sound, time, electric field, current, voltage, electric power, radiation, humidity, gradient, oscillation, a smell, and infrared rays. The electronic device 100A may be provided with one or more sensor portions 50. The electronic device 100A may be provided with one or more sensor portions 51.

For example, a picture of the surrounding scenery can be taken with the sensor portion 50 and displayed on a display apparatus 10, which is a kind of semiconductor device. Furthermore, ambient temperature, humidity, illumination, bad smell, and the like can be measured with the sensor portion 50.

Moreover, with the sensor portions 51, for example, the number of blinks, eyelid behavior, pupil size, body temperature, pulse, oxygen saturation in blood, and the like of the user can be measured, so that user's fatigue level, health condition, and the like can be sensed. The electronic device 100A can sense the user's fatigue level, health condition, and the like and display an alert or the like on the display apparatus 10. Furthermore, with the sensor portions 51, images of user's eyes may be captured and a user's line of sight may be sensed. The accuracy of sensing the fatigue level can be increased by taking the user's line of sight into consideration.

A user's focus area can be found by sensing the user's line of sight. For example, a combination of the sense of the focus area with the number of blinks per unit time enables an operation of selecting an icon displayed on a display region of the display apparatus 10. In other words, an operation of clicking an icon with a mouse can be achieved by sensing a user's line of sight and a movement of eyelids. In other words, an operation of the electronic device 100 can be controlled by sensing a user's line of sight and a movement of eyelids. Since the user does not use both hands to operate the electronic device 100A, an input operation or the like can be performed with holding nothing in both hands (in a state where both hands are free).

The sensor portion 50 and/or the sensor portions 51 preferably have a function of measuring brain waves in addition to the above functions. For example, the sensor portion 50 and/or the sensor portions 51, which has a plurality of electrodes in contact with the user's head, can have a mechanism of measuring brain waves from a weak current flowing through the electrodes. When the sensor portion 50 or the sensor portions 51 has/have a function of measuring brain waves, an operation of displaying an image or a part of an image at a place the user expects the image or the part of the image to be displayed on the display region can be achieved. In this case also, since the user does not use both hands to operate the electronic device 100A, an input operation or the like can be performed with holding nothing in both hands. [Power supply portion] The battery 104 has a function of storing electric power needed for the operation of the electronic device 100A and a function of supplying electric power needed for the operation. The voltage generation portion 105 has a function of generating a voltage needed for the operation of the electronic device 100A and a function of keeping the voltage constant. A primary battery or a secondary battery can be used as the battery 104. Note that a lithium-ion secondary battery can be used as the secondary battery, for example. The battery 104 and the voltage generation portion 105 can be collectively referred to as the power supply portion.

Although FIG. 1A illustrates the structure including the battery 104, one embodiment of the present invention is not limited thereto. The electronic device 100A may have a structure without the battery 104, in which electric power is directly supplied from an external power supply. Alternatively, the electronic device 100A may be provided with the battery 104 and have a function of being supplied with electric power from the outside. [Control portion] The control portion 106 has a function of controlling the operation of the electronic device 100A. The control portion 106 can be provided with a CPU, a memory, or the like. The memory has a function of retaining a variety of programs used in the electronic device 100A, data needed for the operation of the electronic device 100A, and the like.

The control portion 106 has a function of supplying an image signal to the display apparatus 10. Furthermore, the control portion 106 can perform processing to increase the definition of an image signal (upconversion) or processing to decrease the definition of an image signal (downconversion). Thus, low-definition image data can be unconverted in accordance with the definition of the display region (also referred to as "display portion"). High-definition image data can be downconverted. Therefore, an image with high display quality can be displayed on the display apparatus 10.

The control portion 106 may be provided with a GPU or the like as necessary. The control portion 106 can function as an application processor having functions needed for the operation of the electronic device 100A.

[Communication Portion]

The communication portion 107 has a wireless or wired communication function. In particular, the communication portion 107 preferably has a wireless communication function, in which case the number of parts such as a connection cable can be omitted.

In the case where the communication portion 107 has a wireless communication function, the communication portion 107 can perform communication via the antennas 108. As a communication protocol or a communication technology, a communications standard such as LTE (Long Term Evolution), GSM (Global System for Mobile Communication: registered trademark), EDGE (Enhanced Data Rates for GSM Evolution), CDMA2000 (Code Division Multiple Access 2000), or W-CDMA (registered trademark), or a communications standard developed by IEEE such as Wi-Fi (registered trademark), Bluetooth (registered trademark), or ZigBee (registered trademark) can be used. The third-generation mobile communication system (3G), the fourth-generation mobile communication system (4G), or the fifth-generation mobile communication system (5G) defined by the International Telecommunication Union (ITU) or the like can be used.

The communication portion 107 can perform input/output of information by connecting the electronic device 100A to another device via a computer network such as the Internet, which is an infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network).

When the plurality of antennas 108 are provided, the stability of wireless communication can be enhanced.

The communication portion 107 may be electrically connected to an external port (not illustrated) provided in the electronic device 100. The external port can be connected to an external device such as a computer or a printer through a cable, for example. A USB terminal is atypical example. As the external port, a LAN connection terminal, a digital broadcast-receiving terminal, an AC adaptor connection terminal, or the like may be provided. Without limitation to wired communication, a transceiver for optical communication using infrared rays, visible light, ultraviolet rays, or the like may be provided. The communication portion 107 may be electrically connected to one or more buttons or switches (also referred to as "housing switches". Not illustrated) provided in the electronic device 100, for example.

Figure 1B:
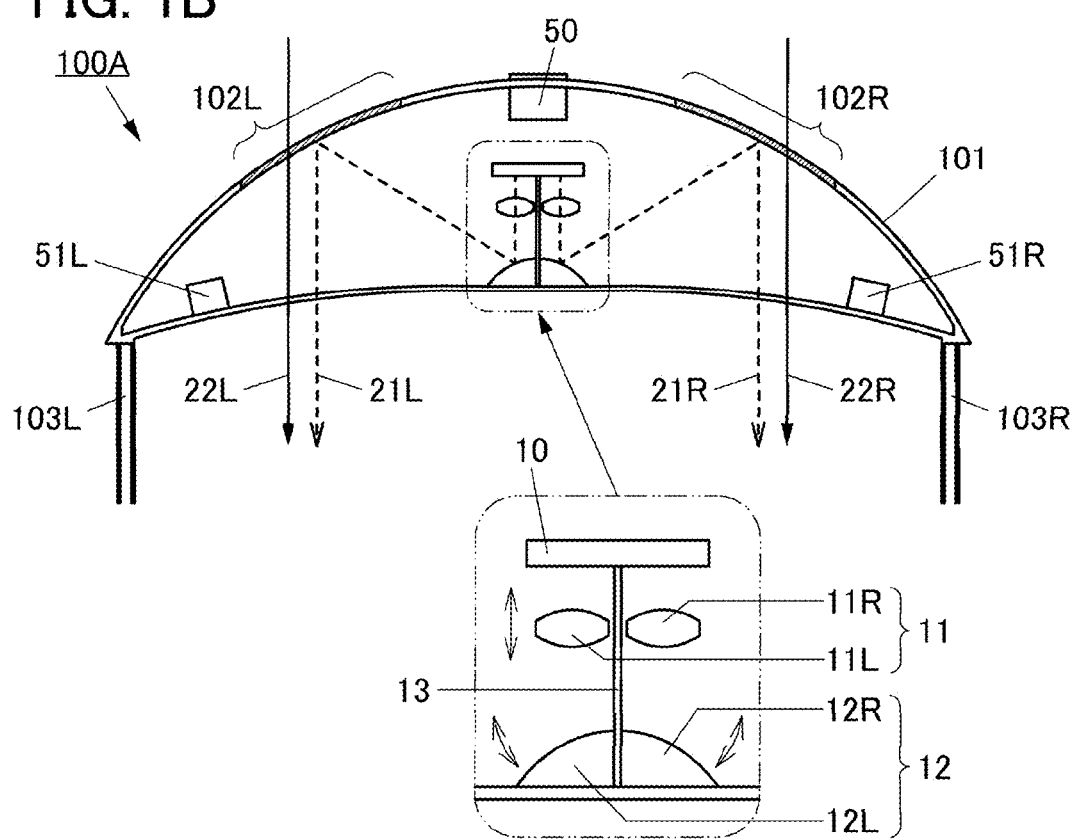

FIG. 1B is a top view of the inside of the housing 101 provided in the electronic device 100A. The electronic device 100A includes, on the front side of the housing 101, the sensor portion 50 and a pair of display regions 102 (a display region 102R and a display region 102L). The display regions 102 function as half mirrors. Furthermore, the electronic device 100A is provided with the display apparatus 10, lenses 11 (a lens 11R and a lens 11L), mirrors 12 (a mirror 12R and a mirror 12L), and a separator 13 inside the housing 101. The mirrors 12 are curved mirrors and function as total reflection convex mirrors. Depending on the purpose or the like, concave mirrors or plane mirrors may be used as the mirrors 12. The same as the mirrors 12 can apply to the display regions 102 functioning as half mirrors.

Figure 3A:
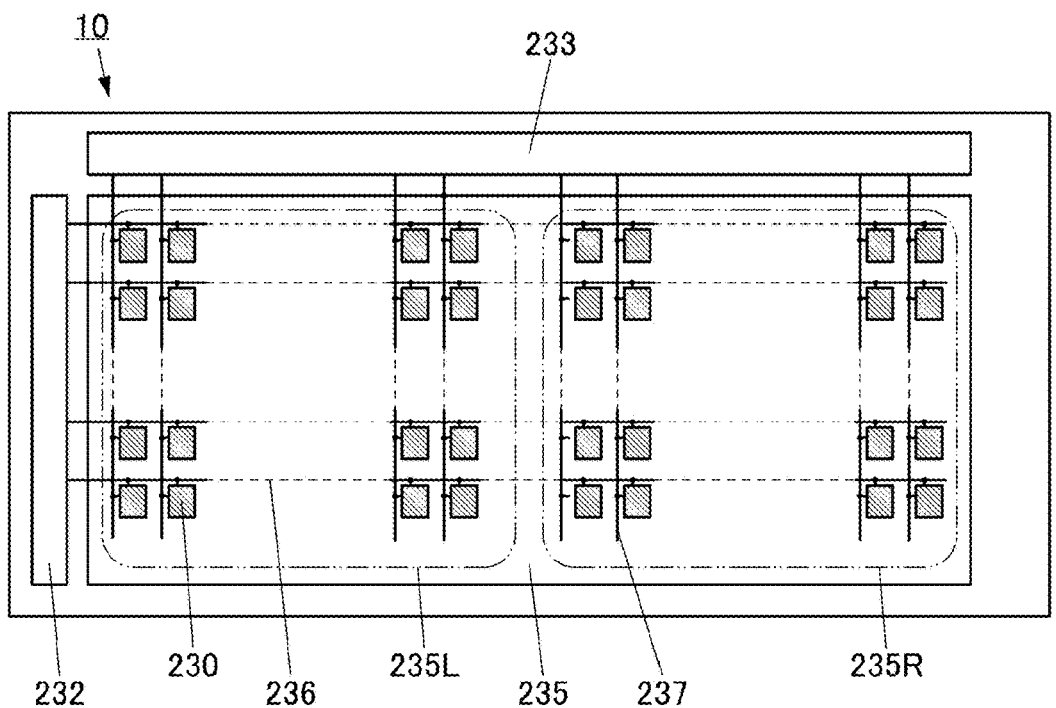
Figure 3A:
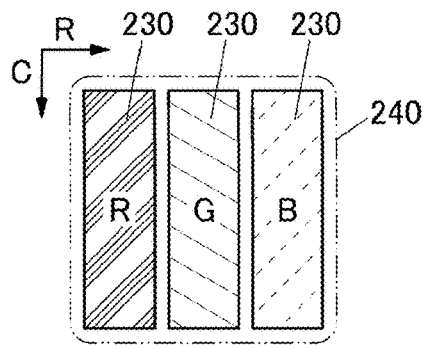
Figure 3A:
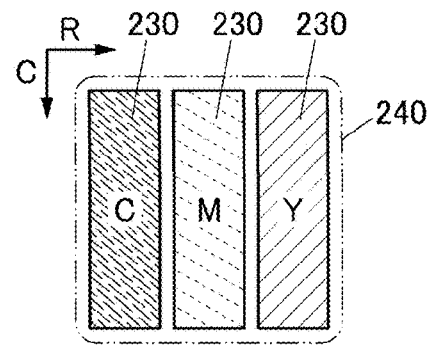
Figure 3A:
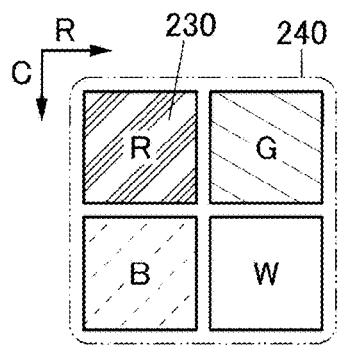
Figure 3A:
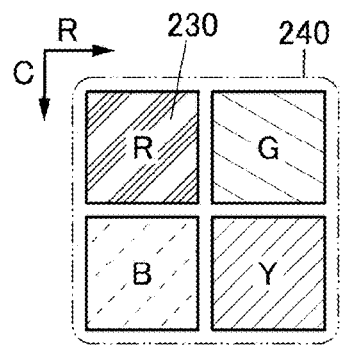
Figure 3A:
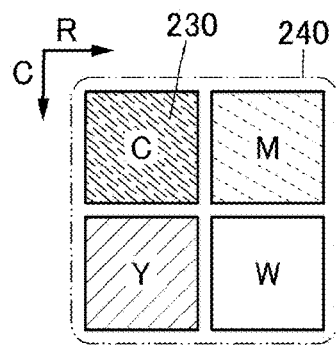

FIG. 3A is a block diagram illustrating a structure of the display apparatus 10. The display apparatus 10 is provided with a display region 235, a peripheral circuit region 232, and a peripheral circuit region 233. The display region 235 is provided with a plurality of pixels 230 arranged in a matrix. The light emission amount of each of the pixels 230 is controlled, so that an image can be displayed on the display region 235. The display region 235 is provided with a display region 235R and a display region 235L. Note that the structure of the display apparatus 10 is described later.

The lens 11R has a function of projecting an image displayed on the display region 235R (also referred to as "light 21R") onto the mirror 12R (see FIG. 1B). The light 21R projected onto the mirror 12R is reflected by the mirror 12R, which is a convex mirror, and enlarged and projected onto the display region 102R. The display region 102R is the half mirror and functions as, for example, a concave mirror. The display region 102R transmits external light 22R incident from the outside of the housing 101, and further reflects the light 21R reflected by the mirror 12R. The light 21R and the external light 22R are emitted in a rearward direction of the housing 101 (to the user side).

The lens 11L has a function of projecting an image displayed on the display region 235L (also referred to as "light 21L") onto the mirror 12L. The light 21L projected onto the mirror 12L is reflected by the mirror 12L, which is a convex mirror, and enlarged and projected onto the display region 102L. The display region 102L is the half mirror and functions as, for example, a concave mirror. The display region 102L transmits external light 22L incident from the outside of the housing 101, and further reflects the light 21L reflected by the mirror 12L. The light 21L and the external light 22L are emitted in a rearward direction of the housing 101 (to the user side).

The position and the angle of each of the lenses 11 and the mirrors 12 can be adjusted if needed. When the position and the angle of each of the lens 11R and the mirror 12R are adjusted, the emission position of the light 21R can be controlled. When the position and the angle of each of the lens 11L and the mirror 12L are adjusted, the emission position of the light 21L can be controlled.

Members having a function of refracting, reflecting, coloring, polarizing, or reducing light, such as the lenses 11, the mirrors 12, and the display regions 102 functioning as the half mirrors, are sometimes referred to as optical members. The optical members used in the electronic device 100A are not limited to the lenses 11, the mirrors 12, and the display regions 102. The electronic device 100A may be provided with an optical member other than the lenses 11, the mirrors 12, and the display regions 102. Furthermore, at least part of the lenses 11, the mirrors 12, and the display regions 102 may be replaced by another optical member. For example, the lenses 11 may be formed of a combination of a plurality of lenses.

The lenses used in the electronic device 100A are preferably aspherical lenses. An aspherical lens can cause less aberration than a spherical lens and thereby increase the display quality of the electronic device 100A.

The separator 13 is provided to overlap with a boundary between the display region 235R and the display region 235L and extend in a rearward direction of the housing 101. The separator 13 has a function of preventing an image displayed on the display region 235R from being reflected on the mirror 12L. Furthermore, the separator 13 has a function of preventing an image displayed on the display region 235L from being reflected on the mirror 12R.

The user of the electronic device 100A can see the light 21R and the external light 22R with the right eye and see the light 21L and the external light 22L with the left eye. The user can see the image displayed on the display apparatus 10 and the scenery superimposed on each other owing to the display regions 102 functioning as the half mirrors.

In the electronic device 100A of one embodiment of the present invention, the display apparatus 10 is provided between the both eyes of the user. Thus, the user of the electronic device 100A can see the scenery and the images displayed on the display regions 102 without the display apparatus 10 blocking a user's line of sight. If the operation of the electronic device 100A is stopped, seeing the scenery is possible. The electronic device 100A is not provided with a display apparatus for the right eye and a display apparatus for the left eye and can generate images for the right eye and the left eye with one display apparatus. Thus, reductions in power consumption and production costs can be achieved. In addition, a reduction in the weight of the electronic device 100A can be easily achieved, and the electronic device 100A can be worn more comfortably.

Figure 2A:
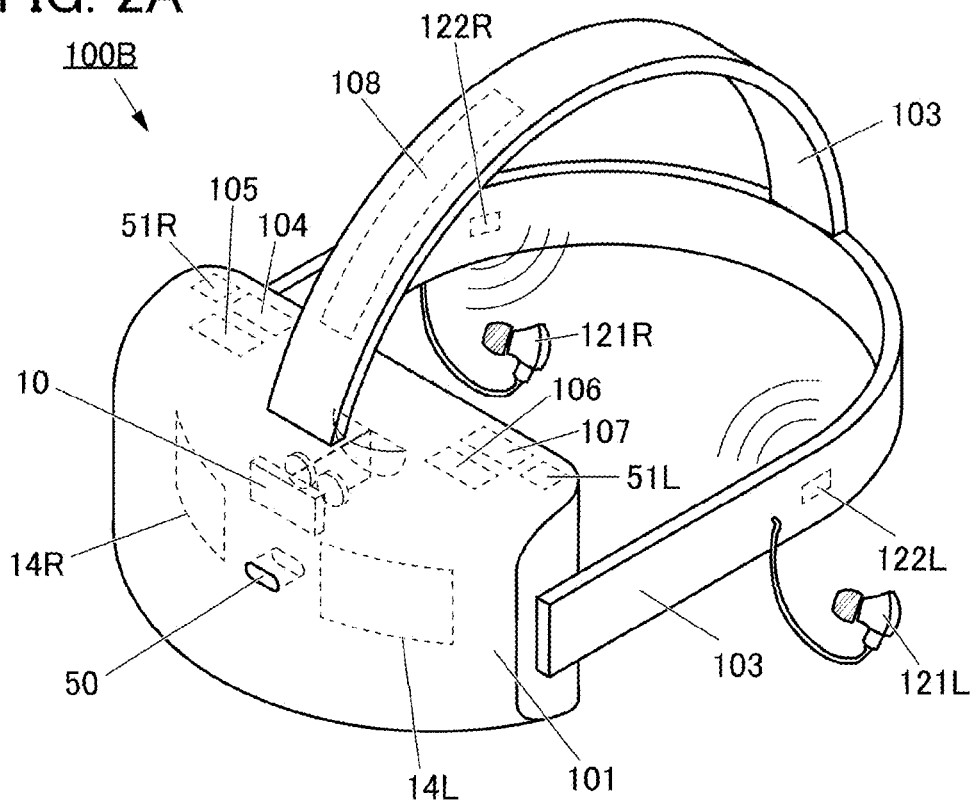
FIG. 2A and FIG. 2B are diagrams illustrating a structure example of an electronic device.
Figure 2B:
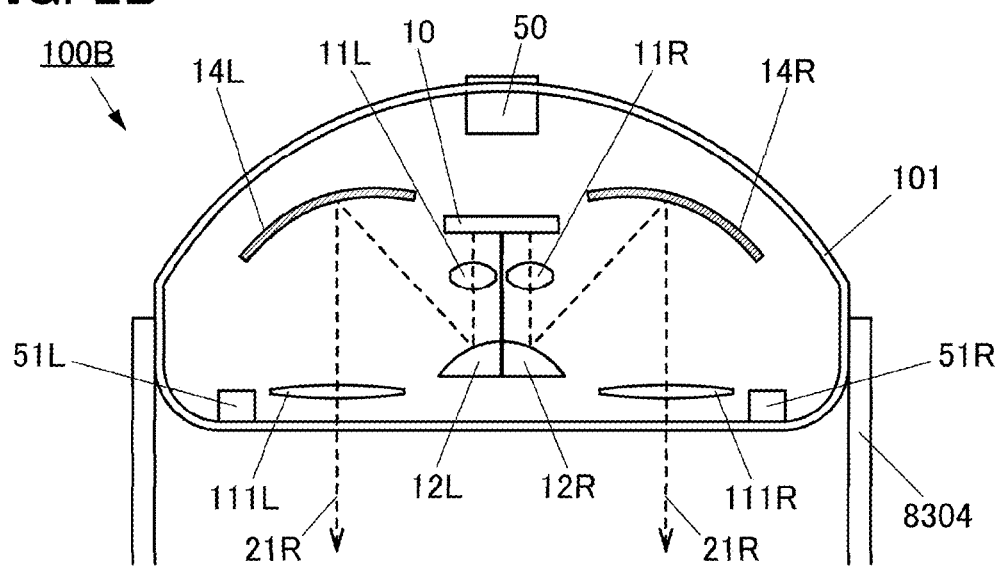

<Electronic Device 100B>FIG. 2 is a diagram illustrating a structure example of the electronic device 100B of one embodiment of the present invention. FIG. 2A is a perspective external view of the electronic device 100B of one embodiment of the present invention. FIG. 2B is a top view of the inside of the housing 101 provided in the electronic device 100B. The electronic device 100B is a modification example of the electronic device 100A. To avoid repeated description, points regarding the electronic device 100B which are different from those of the electronic device 100A are mainly described.

The electronic device 100B is a goggle-type electronic device for virtual reality (VR) applications. The electronic device 100B is provided with, instead of the display regions 102 provided in the electronic device 100A, mirrors 14 (a mirror 14R, a mirror 14L). The mirrors 14 are provided inside the housing 101. The electronic device 100B is provided with the wearing portion 103 having a belt shape around and on top of the head. The length of the wearing portion 103 can be adjusted as appropriate.

The mirrors 14 are curved mirrors and function as total reflection concave mirrors. Depending on the purpose or the like, convex mirrors or plane mirrors may be used as the mirrors 14.

The electronic device 100B is provided with, inside the housing 101, the battery 104, the voltage generation portion 105, the control portion 106, and the communication portion 107. The antennas 108 are provided in part of the wearing portion 103.

A lens 111L may be provided between the mirror 14L and the user. A lens 111R may be provided between the mirror 14R and the user. The positions of the lenses 111 (the lens 111L, the lens 111R) can be adjusted as appropriate. The user can see images displayed on the mirrors 14 through the lenses 111.

Since the electronic device 100B has a structure in which external light does not enter the inside of the housing 101, the user can feel a high sense of immersion. An image capture element may be used as the sensor portion 50 so that a picture of the surrounding scenery is taken and displayed on the display apparatus 10. The electronic device 100B can also display information superimposed on the image of the surrounding scenery. Thus, the electronic device 100B can also function as a wearable electronic device for augmented reality (AR) applications.

In the electronic device 100B of one embodiment of the present invention, the display apparatus 10 is provided between the both eyes of the user, as in the electronic device 100A. Thus, the user of the electronic device 100B can see the images displayed on the mirrors 14 with the display apparatus 10. The electronic device 100B is also not provided with a display apparatus for the right eye and a display apparatus for the left eye and can generate images for the right eye and the left eye with one display apparatus. Thus, reductions in power consumption and production costs can be achieved. In addition, a reduction in the weight of the electronic device 100B can be easily achieved, and the electronic device 100B can be worn more comfortably.

<Structure Example of Display Apparatus>

A structure example of the display device 10 will be described. FIG. 3A is a block diagram illustrating the display apparatus 10. As described above, the display apparatus 10 is provided with the display region 235, the peripheral circuit region 232, and the peripheral circuit region 233. Furthermore, the display region 235 is provided with the display region 235R and the display region 235L.

A circuit included in the peripheral circuit region 232 functions as, for example, a scan line driver circuit. A circuit included in the peripheral circuit region 232 functions as, for example, a signal line driver circuit. Some sort of circuit may be provided at a position facing the peripheral circuit region 232 with the display region 235 sandwiched therebetween. As described above, the circuits included in the peripheral circuit region 232 and the peripheral circuit region 233 are collectively referred to as a "peripheral driver circuit" in some cases.

Any of various circuits such as a shift register, a level shifter, an inverter, a latch, an analog switch, and a logic circuit can be used as the peripheral driver circuit. In the peripheral driver circuit, a transistor, a capacitor, and the like can be used. A transistor included in the peripheral driver circuit can be formed in the same steps as the transistors included in the pixels 230.

The display apparatus 10 includes m wirings 236 which are arranged substantially parallel to each other and whose potentials are controlled by the circuits included in the peripheral circuit region 232, and n wirings 237 which are arranged substantially parallel to each other and whose potentials are controlled by the circuits included in the peripheral circuit region 233. The display region 235 includes a plurality of pixels 230 arranged in a matrix. Full-color display can be achieved by making the pixel 230 that controls red light, the pixel 230 that controls green light, and the pixel 230 that controls blue light collectively function as one pixel 240 and by controlling the light emission amount (light emission luminance) of each of the pixels 230. Thus, the three pixels 230 each function as a subpixel. That is, three subpixels control the emission amount or the like of red light, green light, and blue light (see FIG. 3B1). The light colors controlled by the three subpixels are not limited to a combination of red (R), green (G), and blue (B) and may be cyan (C), magenta (M), and yellow (Y) (see FIG. 3B2).

Four subpixels may collectively function as one pixel 240. For example, a subpixel that controls white light (W) may be added to the three subpixels that control red light, green light, and blue light (see FIG. 3B3). The addition of the subpixel that controls white light can increase the luminance of a display region. Alternatively, a subpixel that controls yellow light may be added to the three subpixels that control red light, green light, and blue light (see FIG. 3B4). Alternatively, a subpixel that controls white light may be added to the three subpixels that control cyan light, magenta light, and yellow light (see FIG. 3B5).

When the number of subpixels functioning as one pixel is increased and subpixels that control light of red, green, blue, cyan, magenta, yellow, and the like are used in an appropriate combination, the reproducibility of halftones can be increased. Thus, display quality can be increased.

The display apparatus of one embodiment of the present invention can reproduce the color gamut of various standards. For example, the display apparatus of one embodiment of the present invention can reproduce the color gamut of the PAL (Phase Alternating Line) standard and the NTSC (National Television System Committee) standard used for TV broadcasting; the sRGB (standard RGB) standard and the Adobe RGB standard widely used for display apparatuses used in electronic devices such as personal computers, digital cameras, and printers; the ITU-R BT.709 (International Telecommunication Union Radiocommunication Sector Broadcasting Service (Television) 709) standard used for HDTV (High Definition Television, also referred to as Hi-Vision); the DCI-P3 (Digital Cinema Initiatives P3) standard used for digital cinema projection; the ITU-R BT.2020 (REC.2020 (Recommendation 2020)) standard used for UHDTV (Ultra High Definition Television, also referred to as Super Hi-Vision); and the like.

The definition of the display region 235 can be HD (number of pixels: 1280×720), FHD (number of pixels: 1920×1080), or WQHD (number of pixels: 2560×1440), for example. Furthermore, the display region 235 preferably has a resolution as extremely high as WQXGA (number of pixels: 2560×1600), 4K2K (number of pixels: 3840×2160, also referred to as "4K"), or 8K4K (number of pixels: 7680×4320, also referred to as "8K"). In particular, definition of 4K2K, 8K4K, or higher is preferable.

The pixel density (resolution) of the display region 235 is preferably higher than or equal to 1000 ppi and lower than or equal to 10000 ppi. For example, the pixel density may be higher than or equal to 2000 ppi and lower than or equal to 6000 ppi, or higher than or equal to 3000 ppi and lower than or equal to 5000 ppi.

Note that there is no particular limitation on the screen ratio (aspect ratio) of the display region 235. For example, the display region 235 of the display apparatus 10 is compatible with a variety of screen ratios such as 1:1 (a square), 4:3, 16:9, and 16:10.

The refresh rate of the display apparatus of one embodiment of the present invention can be variable. For example, the refresh rate is adjusted (adjusted in the range from 0.01 Hz to 240 Hz, for example) in accordance with contents displayed on the display apparatus, whereby power consumption can be reduced. Moreover, driving with a lowered refresh rate that reduces the power consumption of the display apparatus may be referred to as idling stop (IDS) driving.

<Pixel Circuit Structure Examples>

Figure 4A:
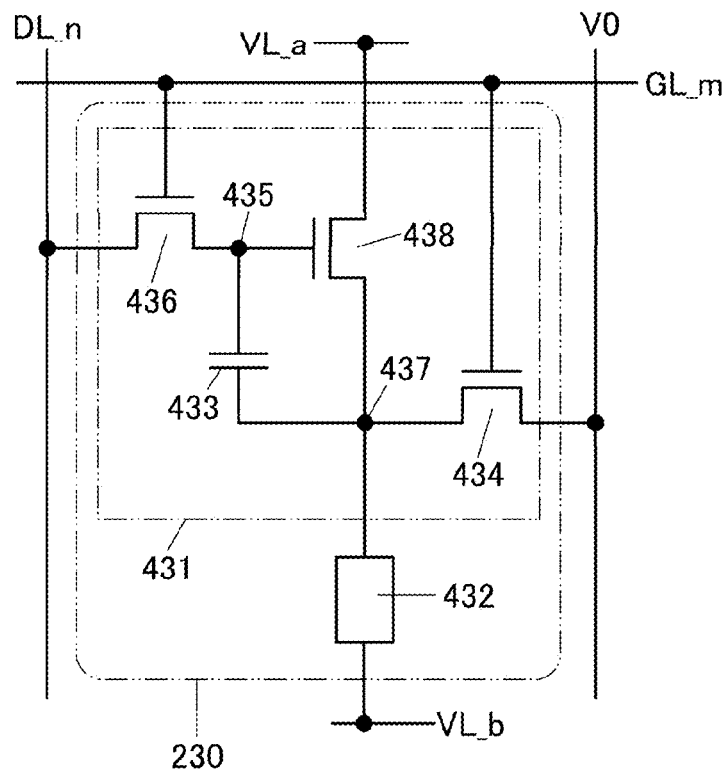
FIG. 4A to FIG. 4C are diagrams illustrating structure examples of a pixel circuit.

FIG. 4A is a diagram illustrating a circuit structure example of the pixel 230. The pixel 230 includes a pixel circuit 431 and a display element 432.

Each of the wirings 236 is electrically connected to the n pixel circuits 431 arranged in the corresponding row among the pixel circuits 431 arranged in m rows and n columns in the display region 235. Each of the wirings 237 is electrically connected to the m pixel circuits 431 arranged in the corresponding column among the pixel circuits 431 arranged in m rows and n columns. Note that m and n are each an integer of 1 or more.

The pixel circuit 431 includes a transistor 436, a capacitor 433, a transistor 438, and a transistor 434. The pixel circuit 431 is electrically connected to the display element 432.

In this specification and the like, the term "element" can be replaced with the term "device" in some cases. For example, a display element, a light-emitting element, and a liquid crystal element can be rephrased as a display device, a light-emitting device, and a liquid crystal device, respectively.

One of a source electrode and a drain electrode of the transistor 436 is electrically connected to a wiring to which a data signal (also referred to as "video signal") is supplied (hereinafter referred to as a signal line DL_n). A gate electrode of the transistor 436 is electrically connected to a wiring to which a gate signal is supplied (hereinafter referred to as a scan line GL_m). The signal line DL_n and the scan line GL_m correspond to the wiring 237 and the wiring 236, respectively.

The transistor 436 has a function of controlling writing of the data signal to a node 435.

One of a pair of electrodes of the capacitor 433 is electrically connected to the node 435, and the other is electrically connected to a node 437. The other of the source electrode and the drain electrode of the transistor 436 is electrically connected to the node 435.

The capacitor 433 has a function of a storage capacitor for storing data written to the node 435.

One of a source electrode and a drain electrode of the transistor 438 is electrically connected to a potential supply line VL_a, and the other is electrically connected to the node 437. A gate electrode of the transistor 438 is electrically connected to the node 435.

One of a source electrode and a drain electrode of the transistor 434 is electrically connected to a potential supply line VO, and the other is electrically connected to the node 437. Furthermore, a gate electrode of the transistor 434 is electrically connected to the scan line GL_m.

One of an anode and a cathode of the display element 432 is electrically connected to a potential supply line VL_b, and the other is electrically connected to the node 437.

As the display element 432, an organic electroluminescent element (also referred to as an organic EL element) or the like can be used, for example. Note that the display element 432 is not limited thereto; an inorganic EL element formed of an inorganic material may be used, for example. Note that an "organic EL element" and an "inorganic EL element" are collectively referred to as "EL element" in some cases.

The emission color of the EL element can be white, red, green, blue, cyan, magenta, yellow, or the like depending on the material contained in the EL element.

Examples of a method for achieving color display include a method in which the display element 432 whose emission color is white is combined with a coloring layer and a method in which the display element 432 with a different emission color is provided in each pixel. The former method is more productive than the latter method. In contrast, the latter method, which requires separate formation of the display element 432 pixel by pixel, is less productive than the former method. However, the latter method can provide higher color purity of the emission color than the former method. When the display element 432 has a microcavity structure in addition to the latter method, the color purity can be further increased.

For the display element 432, a low-molecular compound or a high-molecular compound can be used, and an inorganic compound may be included. The layers included in the display element 432 can each be formed by a method such as an evaporation method (including a vacuum evaporation method), a transfer method, a printing method, an inkjet method, or a coating method.

The display element 432 may contain an inorganic compound such as quantum dots. For example, when used for the display element 432, the quantum dots can function as a light-emitting material.

Note that as a power supply potential, a potential on the relatively high potential side or a potential on the relatively low potential side can be used, for example. A power supply potential on the high potential side is referred to as a high power supply potential (also referred to as "VDD"), and a power supply potential on the low potential side is referred to as a low power supply potential (also referred to as "VSS"). A ground potential can be used as the high power supply potential or the low power supply potential. For example, in the case where the high power supply potential is a ground potential, the low power supply potential is a potential lower than the ground potential, and in the case where the low power supply potential is a ground potential, the high power supply potential is a potential higher than the ground potential.

A high power supply potential VDD is supplied to one of the potential supply line VL_a and the potential supply line VL_b, and a low power supply potential VSS is supplied to the other, for example.

In the display apparatus including the pixel circuits 431, the pixel circuits 431 are sequentially selected row by row by the circuit included in the peripheral driver circuit, whereby the transistors 436 and the transistors 434 are brought into an on state and a data signal is written to the nodes 435.

When the transistors 436 and the transistors 434 are brought into an off state, the pixel circuits 431 in which the data has been written to the nodes 435 are brought into a retention state. Furthermore, the amount of current flowing between the source electrode and the drain electrode of the transistor 438 is controlled in accordance with the potential of the data written to the node 435, and the display element 432 emits light with a luminance corresponding to the amount of current flow. This operation is sequentially performed row by row; thus, an image can be displayed.

Figure 4B:
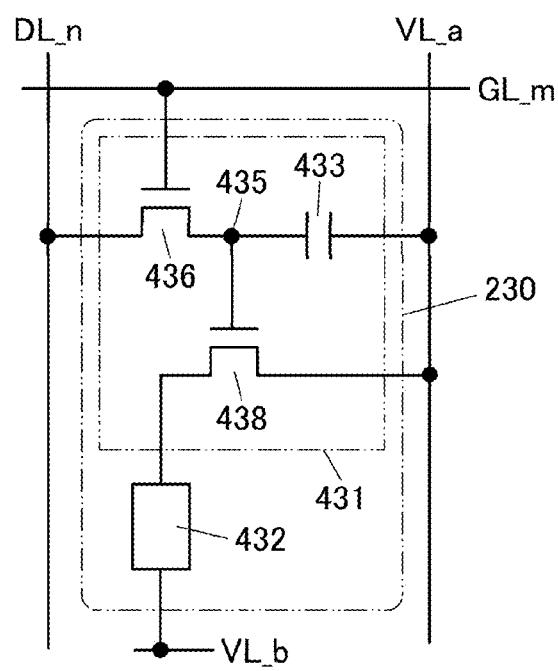

FIG. 4B is a modification example of the circuit structure of the pixel 230 illustrated in FIG. 4A. The circuit structure illustrated in FIG. 4B has a structure where the transistor 434 and the potential supply line VO are eliminated from the circuit structure illustrated in FIG. 4A. The other structures can be understood by referring to the description of the circuit structure illustrated in FIG. 4A. To avoid repeated description, detailed description of the circuit structure illustrated in FIG. 4B is omitted.

Figure 4C:
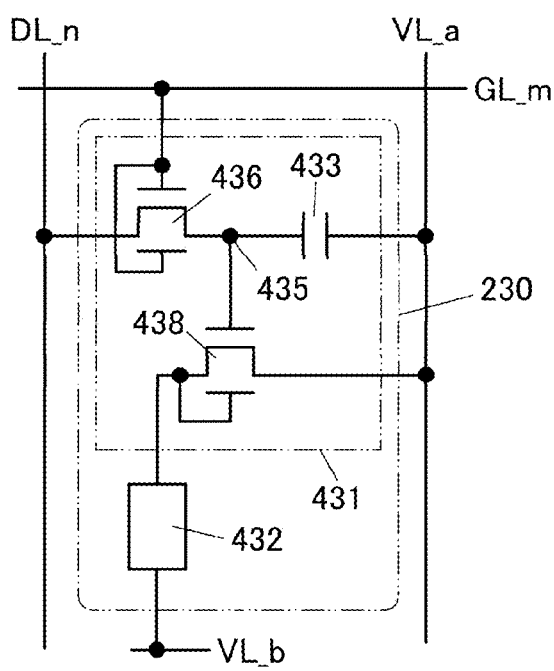

Furthermore, some or all of the transistors included in the pixel circuit 431 may include backgates. For example, as illustrated in FIG. 4C, a transistor including a backgate may be used as the transistor 436 and the backgate and the gate may be electrically connected to each other. Moreover, like the transistor 438 illustrated in FIG. 4C, the backgate and one of the source and the drain of the transistor may be electrically connected to each other.

Figure 5A:
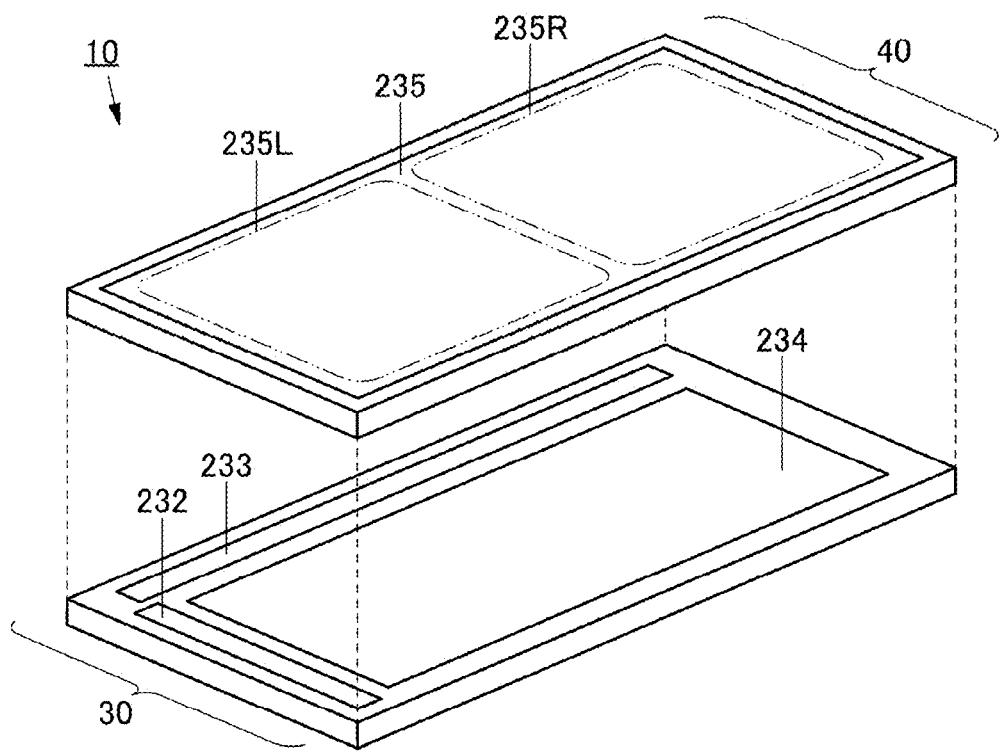
FIG. 5A and FIG. 5B are diagrams illustrating a structure example of a display apparatus.

As illustrated in a perspective view of FIG. 5A, the display apparatus 10 may have a stacked structure of a layer 30 and a layer 40. An interlayer insulator or a conductor for electrical connection between different layers can be provided between the layer 30 and the layer 40.

The area of the display region 235 can be maximized by providing the peripheral driver circuits in the layer 30 and the display region 235 including the pixels 230 in the layer 40. Thus, the definition of the display apparatus 10 can be increased. Under a fixed definition, the area occupied by one pixel can be increased. The aperture ratio of the pixel 230 can be increased. By the expansion of the area occupied by one pixel, the density of current supplied to the pixels can be lowered. Thus, the load on the pixels can be reduced and the reliability of the display apparatus 10 can be increased.

A transistor provided in the layer 30 can be a transistor containing silicon in its channel formation region (also referred to as a "Si transistor"), for example. The transistor can be, for example, a transistor containing single crystal silicon in its channel formation region (also referred to as a "c-Si transistor"). In particular, the use of a c-Si transistor as the transistor provided in the layer 30 can increase the on-state current of the transistor. Thus, the circuit included in the layer can be driven at a high speed.

The Si transistor can be formed by microfabrication to have a channel length of 3 nm to 10 nm; therefore, a functional circuit region 234 including a CPU, a GPU, a memory circuit, and/or the like can be provided in the layer 30. Thus, the display apparatus 10 can be a display apparatus provided with an application processor or the like. Note that the CPU, the GPU, the memory circuit, and the like are referred to as a "functional circuit", in some cases.

A transistor provided in the layer 40 can be an OS transistor, for example. In particular, a transistor including an oxide including at least one of indium, an element M (the element M is aluminum, gallium, yttrium, or tin), and zinc in a channel formation region is preferably used as the OS transistor. Such an OS transistor has a characteristic of an extremely low off-state current. Thus, it is preferable to use the OS transistor as a transistor used in the pixel circuit 431, in which case data written into the pixel circuit 431 can be retained for a long period. In particular, when an OS transistor is used as the transistor 436, data written to the node 435 can be retained for a long period.

Since the OS transistor has high withstand voltage between the source and the drain, the OS transistor is preferably used as the transistor 438. The transistor 438 is a transistor controlling a current that flows through the display element 432 (also referred to as "driving transistor"), in which a relatively high voltage is applied between the source and the drain. The use of an OS transistor as the transistor 438 can increase the reliability of the display apparatus 10.

As the transistors provided in the layer 30 and the layer 40, both a Si transistor and an OS transistor may be used. Examples of a material used in the Si transistor include single crystal silicon, polycrystalline silicon, and amorphous silicon. In particular, a transistor containing low-temperature polysilicon (LTPS) in its semiconductor layer (also referred to as "LTPS transistor") can be used. The LTPS transistor has high field-effect mobility and favorable frequency characteristics.

With the use of Si transistors such as LTPS transistors, a circuit required to be driven at a high frequency (e.g., a source driver circuit) can be formed on the same substrate as the display portion. Thus, external circuits mounted on the display apparatus can be simplified, and costs of parts and mounting costs can be reduced.

An OS transistor has extremely higher field-effect mobility than amorphous silicon. In addition, the OS transistor has an extremely low leakage current between a source and a drain in an off state (hereinafter, also referred to as off-state current), and charge accumulated in a capacitor that is connected in series to the transistor can be held for a long period. Furthermore, power consumption of the display apparatus can be reduced with an OS transistor.

The off-state current value per micrometer of channel width of the OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor at room temperature is higher than or equal to 1 fA ($1\times10^{-15}$ A) and lower than or equal to 1 pA ($1\times10^{-12}$ A). In other words, the off-state current of an OS transistor is lower than that of a Si transistor by approximately ten orders of magnitude. For example, LTPS transistors are used as the transistors included in the peripheral circuit region 232 and the peripheral circuit region 233, and an OS transistor may be used as the transistor included in the display region 235.

To increase the emission luminance of the light-emitting device included in the pixel circuit, the amount of current fed through the light-emitting device needs to be increased. For this, it is necessary to increase the source—drain voltage of a driving transistor included in the pixel circuit. Since an OS transistor has a higher withstand voltage between the source and the drain than a Si transistor, a high voltage can be applied between the source and the drain of the OS transistor. Accordingly, when an OS transistor is used as the driving transistor in the pixel circuit, the amount of current flowing through the light-emitting device can be increased, so that the emission luminance of the light-emitting device can be increased.

When transistors operate in a saturation region, a change in source—drain current relative to a change in gate—source voltage can be smaller in an OS transistor than in a Si transistor. Accordingly, when an OS transistor is used as the driving transistor in the pixel circuit, the amount of current flowing between the source and the drain can be set minutely by a change in gate—source voltage; hence, the amount of current flowing through the light-emitting device can be controlled. Accordingly, the gray level in the pixel circuit can be increased.

Regarding saturation characteristics of current flowing when the transistor operates in a saturation region, the OS transistor can make current (saturation current) flow more stably than the Si transistor even when the source—drain voltage gradually increases. Thus, by using an OS transistor as the driving transistor, a stable current can be fed through a light-emitting device that contains an EL material even when the current—voltage characteristics of the light-emitting device vary, for example. In other words, when the OS transistor operates in the saturation region, the source—drain current hardly changes with an increase in the source—drain voltage; hence, the emission luminance of the light-emitting device can be stable.

As described above, with use of an OS transistor as a driving transistor included in the pixel circuit, it is possible to achieve "inhibition of black floating", "increase in emission luminance", "increase in gray level", "inhibition of variation in light-emitting devices", and the like.

Figure 5B:
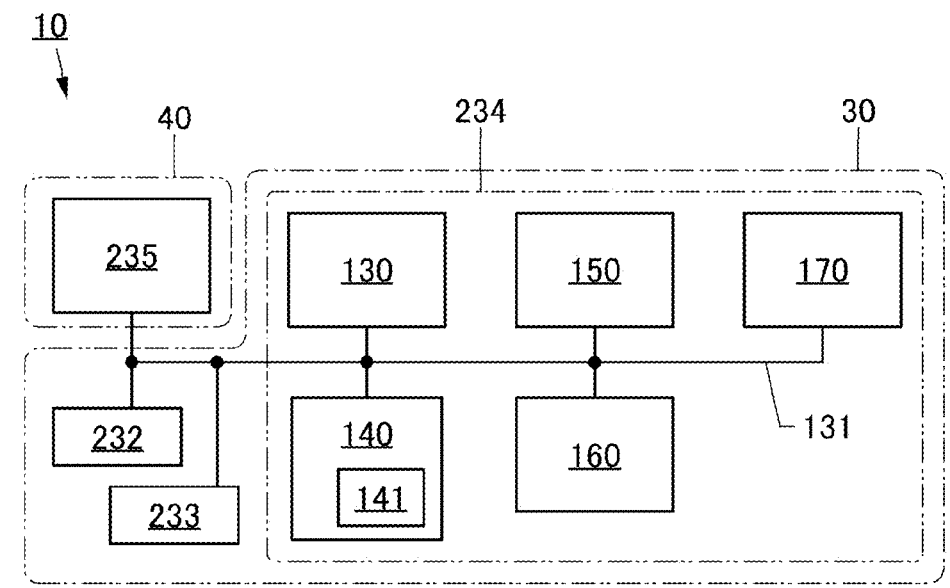

FIG. 5B is a block diagram illustrating a structure example of the display apparatus 10 which is one kind of semiconductor devices. In FIG. 5B, a control portion 130, an arithmetic portion 140, a memory portion 150, an input/output portion 160, and a line-of-sight sensor portion 170 are illustrated as functional circuits provided in the functional circuit region 234. The control portion 130, the arithmetic portion 140, the memory portion 150, the input/output portion 160, and the line-of-sight sensor portion 170 are electrically connected to each other through a bus line 131.

[Control Portion 130]

The control portion 130 has a function of controlling the operation of the whole display apparatus 10. The control portion 130 controls the operation of the display region 235, the peripheral circuit region 232, the peripheral circuit region 233, the arithmetic portion 140, the memory portion 150, the input/output portion 160, and the line-of-sight sensor portion 170.

[Arithmetic Portion 140]

The arithmetic portion 140 has a function of executing an arithmetic operation associated with the operation of the whole display apparatus 10, and a central processing unit (CPU) or the like can be used, for example. The arithmetic portion 140 has a function of generating an image displayed on the display region 235.

A CPU and other microprocessors such as a DSP (Digital Signal Processor) and a GPU (Graphics Processing Unit) can be used alone or in combination as the arithmetic portion 140. A structure may be employed in which such a microprocessor is obtained with a PLD (Programmable Logic Device) such as an FPGA (Field Programmable Gate Array) or an FPAA (Field Programmable Analog Array).

The arithmetic portion 140 includes a neural network 141. The neural network 141 may be formed using software. As the neural network 141, one or more of a deep neural network, a convolutional neural network, a recurrent neural network, an autoencoder, a deep Boltzmann machine, and a deep belief network can be used.

The arithmetic portion 140 interprets and executes instructions from various programs with the use of a processor to process various kinds of data and control programs. Programs that might be executed by the processor may be stored in a memory region of the processor or may be stored in the memory portion 150.

The arithmetic portion 140 may include a main memory. The main memory can include a volatile memory such as a RAM (Random Access Memory) or a nonvolatile memory such as a ROM (Read Only Memory).

For example, a DRAM (Dynamic Random Access Memory) is used for the RAM provided in the main memory, in which case a memory space as a workspace for the arithmetic portion 140 is virtually allocated and used. An operating system, an application program, a program module, program data, and the like which are stored in the memory portion 150 are loaded into the RAM to be executed. The data, program, and program module which are loaded into the RAM are directly accessed and operated by the arithmetic portion 140.

Meanwhile, a BIOS (Basic Input/Output System), firmware, and the like for which rewriting is not needed can be stored in the ROM. As the ROM, a mask ROM, an OTPROM (One Time Programmable Read Only Memory), an EPROM (Erasable Programmable Read Only Memory), or the like can be used. Examples of the EPROM include a UV-EPROM (Ultra-Violet Erasable Programmable Read Only Memory) which can erase stored data by ultraviolet irradiation, an EEPROM (Electrically Erasable Programmable Read Only Memory), and a flash memory.

[Memory Portion 150]

As the memory portion 150, a memory device using a nonvolatile memory element, such as a flash memory, an MRAM (Magnetoresistive Random Access Memory), a PRAM (Phase change RAM), an ReRAM (Resistive RAM), or an FeRAM (Ferroelectric RAM); a memory device using a volatile memory element, such as a DRAM (Dynamic RAM) or an SRAM (Static RAM); or the like may be used, for example.

Note that the memory portion 150 is not incorporated in the display apparatus 10, and a memory device located outside the display apparatus 10 may be used as the memory portion 150. In that case, the memory portion 150 is electrically connected to the arithmetic portion 140 or the like through the input/output portion 160. Alternatively, a structure provided with a communication unit, by which data transmission and reception are wirelessly performed, may be employed.

A plurality of algorithms for performing upconversion (also referred to as "super-resolution"), a weight coefficient for each algorithm, and the like are stored in the memory portion 150. An image source displayed on the display region 235 may be stored in the memory portion 150.

[Input/Output Portion 160]

The input/output portion 160 is electrically connected to the control portion 106 of the electronic device 100. The input/output portion 160 may be electrically connected to the communication portion 107 of the electronic device 100. Information necessary for the operation of the display apparatus 10 is supplied to the display apparatus 10 through the input/output portion 160. The input/output portion 160 may be electrically connected to one or more buttons or switches (also referred to as "housing switches") provided in the electronic device 100, for example. The input/output portion 160 may be electrically connected to an external port to which other input components can be connected.

[Line-of-Sight Sensor Portion 170]

The line-of-sight sensor portion 170 has a function of sensing a user's line of sight in conjunction with the sensor portions 51. The user's line of sight can be sensed by an existing eye tracking method. For example, the sensing is possible by a pupil centre corneal reflection (PCCR) method, a bright/dark pupil effect method, or the like.

For example, a PCCR method is a method for sensing a user's line of sight from the position of the pupil center of a user and the relative position of a corneal reflection image (purkinje image) generated when light enters an eyeball. In the case where a user's line-of-sight is sensed by a PCCR method, an image of the user's pupil and a purkinje image can be taken with the sensor portions 51, and a user's line of sight can be sensed with the line-of-sight sensor portion 170. Note that the line-of-sight sensing method using the line-of-sight sensor portion 170 is not limited to the above-described sensing method. For example, the line-of-sight sensor portion 170 preferably has a function of sensing any one or more selected from the user's corneal, iris, crystalline lens, and retina.

As the light entering the eyeball to generate a purkinje image, light emitted from the display region 235 of the display apparatus 10 can be used. By using light emitted from the display apparatus 10, a light source for obtaining a purkinje image need not be provided additionally. Accordingly, the electronic device 100 can be reduced in weight and costs.

In the case where infrared light is used as a light source for obtaining a purkinje image, a light source may be additionally provided or the display apparatus 10 capable of emitting infrared light may be used.

This embodiment can be combined with the description of the other embodiments as appropriate.

Embodiment 2

In this embodiment, an example of upconversion is described as an example of an image processing operation in the electronic device 100 (the electronic device 100A and the electronic device 100B).

Here, an image processing operation for allowing the user to see a high-quality and high-definition image regardless of the image source is described. First, human visual field characteristics are described.

[Human Visual Field Characteristics]

In general, the human visual field is roughly classified into five visual fields, which are the discriminating visual field, the effective visual field, the stable visual field, the inducting visual field, and the supplementary visual field.

The discriminating visual field is in a region within approximately 5° from the center of vision, where visual performance such as eyesight and color identification is the most excellent.

The effective visual field is in a region that is horizontally within approximately 30° and vertically within approximately 20° from the center of vision and adjacent to the outside of the discriminating visual field, where instant identification of particular information is possible only with an eye movement.

The stable visual field is in a region that is horizontally within approximately 90° and vertically within approximately 70° from the center of vision and adjacent to the outside of the effective visual field, where identification of particular information is possible without any difficulty with a head movement.

The inducing visual field is in a region that is horizontally within approximately 100° and vertically within approximately 85° from the center of vision and adjacent to the outside of the stable visual field, where the existence of a particular target can be sensed but the identification ability is low.

The supplementary visual field is in a region that is horizontally within approximately 100 to 200° and vertically within approximately 85 to 130° from the center of vision and adjacent to the outside of the inducing visual field, where the identification ability for a particular target is significantly low to an extent that the existence of a stimulus can be sensed.

From the above, the quality of an image from the discriminating visual field to the effective visual field is important in image upconversion. It is particularly essential to increase the image quality in the discriminating visual field.

Figure 6A:
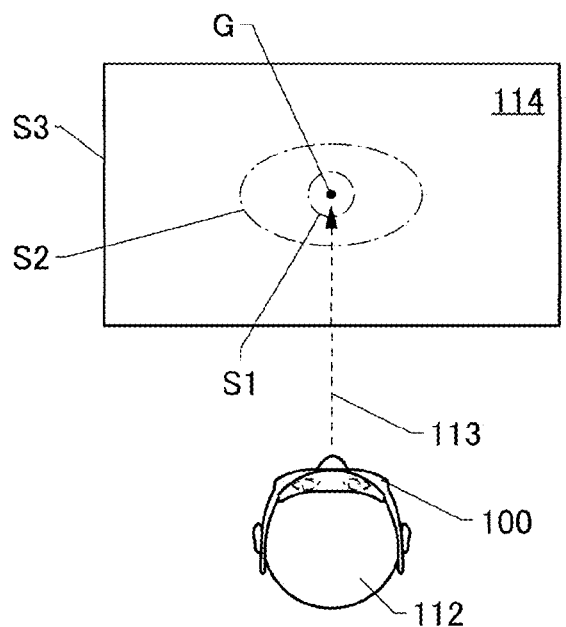
FIG. 6A to FIG. 6C are diagrams illustrating operation examples of an electronic device.

FIG. 6A is a schematic diagram illustrating the state where a user 112 sees an image 114 displayed on the display region of the display apparatus 10 from the front (image display surface) through the display regions 102 or the mirrors 14. Note that the image 114 illustrated in FIG. 6A corresponds to the display region 235R or the display region 235L. A gaze point G at the end of a line of sight 113 of the user 112 is illustrated on the image 114. In this specification and the like, a region including the discriminating visual field and a region including the effective visual field on the image 114 are referred to as "first region Si" and "second region S2", respectively. Furthermore, a region including the stable visual field, the inducing visual field, and the supplementary visual field is referred to as "third region S3".

Figure 6B:
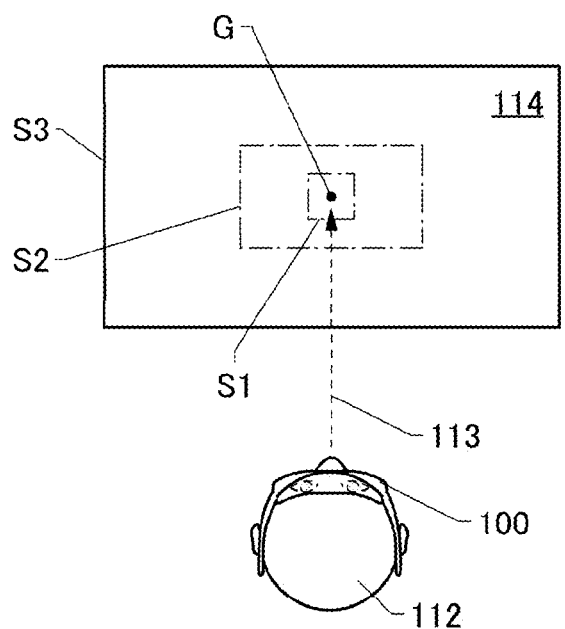
Figure 6C:
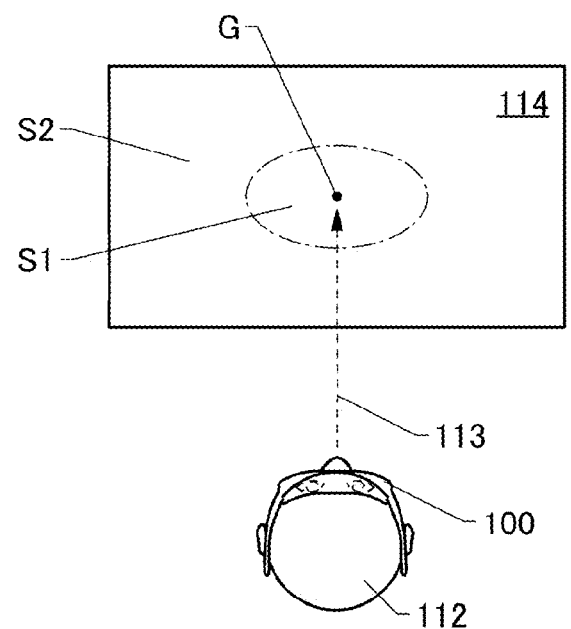

Although the boundary (outline) between the first region Si and the second region S2 is illustrated by a curved line in FIG. 6A, one embodiment of the present invention is not limited thereto. As illustrated in FIG. 6B, the boundary (outline) between the first region Si and the second region S2 may be a rectangular or polygonal. Alternatively, the boundary may have a shape in which a straight line and a curved line are combined. As illustrated in FIG. 6C, the display region of the display apparatus 10 may be divided into two regions; one of the regions including the discriminating visual field and the effective visual field may be referred to as the first region Si, and the other region may be referred to as the second region S2. In this case, the third region S3 is not formed.

Figure 7A:
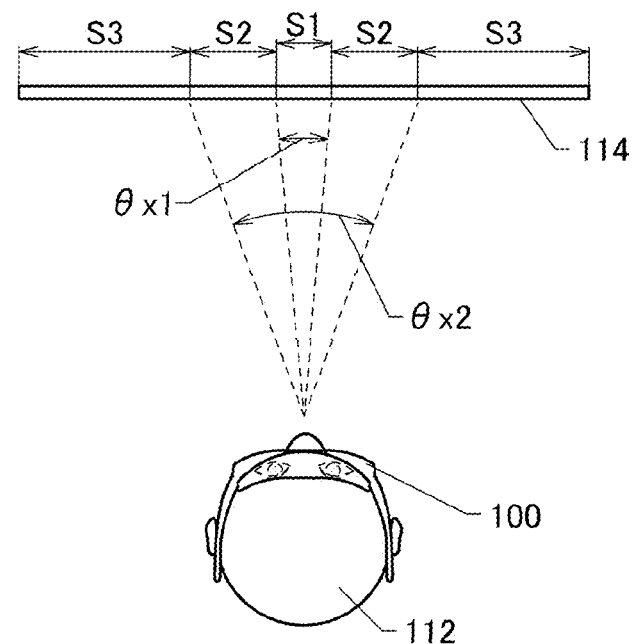
FIG. 7A and FIG. 7B are diagrams illustrating an operation example of an electronic device.
Figure 7B:
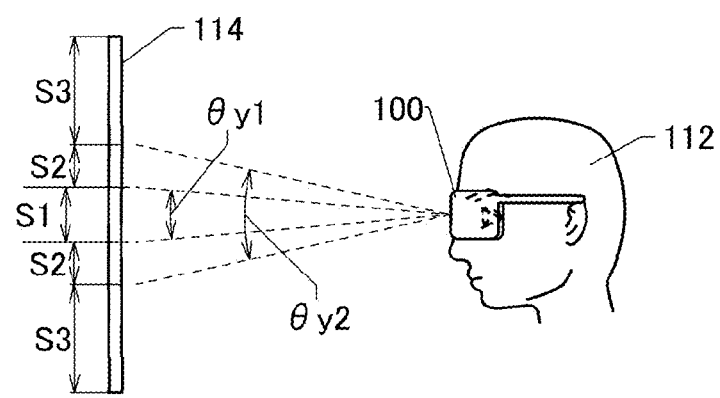

FIG. 7A is a top view of the image 114 displayed on the display region of the display apparatus 10 of the electronic device 100, and FIG. 7B is a side view of the image 114 displayed on the display region of the display apparatus 10 of the electronic device 100. In this specification and the like, the angle of the first region Si in the horizontal direction is shown by "angle θx1", and the angle of the second region S2 in the horizontal direction is shown by "angle θx2" (see FIG. 7A). In this specification and the like, the angle of the first region Si in the vertical direction is shown by "angle θy1", and the angle of the second region S2 in the vertical direction is shown by "angle θy2" (see FIG. 7B).

For example, by setting the angle θx1 to 10° and the angle θy1 to 10°, the area of the first region Si can be widened. In that case, part of the effective visual field is included in the first region Si. Furthermore, by setting the angle θx2 to 45° and the angle θy2 to 35°, the area of the second region S2 can be widened. In that case, part of the stable visual field is included in the second region S2.

The position of the gaze point G varies to some extent by a swing of the line of sight 113. Thus, the angle θx1 and the angle θy1 are each preferably greater than or equal to 5° and smaller than 20°. When the area of the first region Si is set larger than the discriminating visual field, the operation of the display apparatus 10 is stabilized and the image visibility is improved.

When the line of sight 113 of the user 112 moves, the first region Si and the second region S2 also move. For example, in the case where the fluctuation amount of the line of sight 113 exceeds a certain value, it is judged that the line of sight 113 is moving. In the case where the fluctuation amount of the line of sight 113 becomes lower than or equal to the certain value, it is judged that the line of sight 113 has stopped, and the first region S1 to the third region S3 are determined.

[Various Algorithms for Performing Upconversion]

FIG. 8 illustrates examples of the algorithm used for the upconversion. In FIG. 8, the algorithms are classified into Groups A, B, and C. Algorithms that perform upconversion with simple calculation belong to Group A. Algorithms that use artificial intelligence (AI) for upconversion belong to Group B and Group C. The algorithms in Group B perform upconversion with machine learning, and the algorithm in Group C performs upconversion with deep learning using neural networks.

A Nearest neighbor method, a Bilinear method, and a Bicubic method are shown in FIG. 8 as Group A. An RAISR (Rapid and Accurate Image Super-Resolution) method, an ANR (Anchored Neighborhood Regression) method, and an A+ method are shown as Group B. An SRCNN (Super-Resolution Convolutional Neural Network) method is shown as Group C.

Among these methods, in terms of image quality after upconversion, the Nearest neighbor method is the worst and the SRCNN method is the best. In FIG. 8, the order of the image qualities and the processing speeds obtained in the algorithms are shown in the case where the image quality obtained in the Nearest neighbor method is set as the "lowest" and the image quality obtained in the SRCNN method is set as the "highest". In general, the algorithm with better image quality after upconversion has a slower processing speed. In particular, high-quality images can be obtained in upconversion methods such as the SRCNN method which uses a multilayer neural network, but the processing time becomes longer.

By changing the algorithm used for upconversion in each of the first region S1, the second region S2, and the third region S3, the processing time of upconversion can be shortened. In addition, a user can see a high-quality image with increased definition. Furthermore, unnecessary upconversion processing is reduced; thus, power consumption of the electronic device can be reduced.

For example, the upconversion for the first region Si is performed by a method of Group B or C, and the upconversion for the second region S2 is performed by a method of Group A. Since it does not matter if the image quality is low in the third region S3, upconversion for the third region S3 may be performed by the Nearest neighbor method with the highest processing speed.

For example, as for an image where a background and a structure of the same color overlap each other, such as an image where a white background and a white structure overlap each other, in the case where the structure is in the first region S1, it is judged that the user is gazing at the structure, and upconversion processing with high display quality is performed for the first region S1.

Upconversion is performed by the arithmetic portion 140. An algorithm, a weight coefficient, and the like set in the arithmetic portion 140 for the upconversion are read from the memory portion 150 and stored in the arithmetic portion 140. Note that the algorithm, the weight coefficient, and the like may be stored in a memory region in the arithmetic portion 140 in advance. Alternatively, the upconversion may be performed by the control portion 106 described in the above embodiment. Alternatively, the upconversion may be performed by both the arithmetic portion 140 and the control portion 106.

An algorithm and a weight coefficient determined by an external device may be used as the algorithm, the weight coefficient, and the like. For example, the display device 100 and an external device may be connected to each other via the communication portion 107, and an algorithm, a weight coefficient, and the like determined by the external device may be stored in the memory portion 150 via the input/output portion 160.

The weight coefficient determined after learning by the external device is stored in the memory portion 150 before the factory shipment. The learning by the external device may be continued, and an updated weight coefficient and a new algorithm may be stored in the memory portion 150. A plurality of external devices may be used to generate a weight coefficient for updating. The weight coefficient can be transmitted and received via a recording medium, such as an SD card, various communication means, or the like. A new weight coefficient may be determined by using a weight coefficient in the memory portion 150 and a weight coefficient updated by the external device. The use of a new weight coefficient obtained by learning in the external device and a new algorithm enables interpolation processing with higher accuracy.

New images created in the first region S1 to the third region S3 by upconversion are combined to one image and displayed on the display region 235.

The position of the gaze point G, the shape of the first region S1 to the third region S3, and the algorithm to be used are not necessarily determined in each frame. The position of the gaze point G, the shape of the first region S1 to the third region S3, and the algorithm to be used may be determined every arbitrary number of frames. Alternatively, they may be determined when the line of sight 113 fluctuates more than a certain amount.

The algorithm to be used and the weight coefficient may be determined in accordance with the scene of the displayed image. An algorithm that is used and the weight coefficient may be switched between the case where an image (picture) that is displayed is of a scene that is relatively close to a still image such as the scenery and the case where an image (picture) that is displayed is of a scene with a fast-moving image such as sports, for example.

In the case where a user watches a TV program, the image scene may be estimated from a TV program listing. Using teacher data stored in the memory portion 150, the image scene may be estimated by the neural network 141.

The displayed image may be analyzed with AI and upconversion may be performed on a region that has been judged to be a highly possible target of a user's gaze. Alternatively, the movement of the user's line of sight may be predicted and upconversion may be performed on a region that has been judged to be a highly possible next gaze target.

The image processing operation described in this embodiment can be applied to not only upconversion but also an operation to decrease the definition (downconversion). Furthermore, the image processing operation can also be applied to image processing for adjusting the color phase, chroma, brightness, contrast, sharpness, and the like.

This embodiment can be combined with the description of the other embodiments as appropriate.

Embodiment 3

In this embodiment, a light-emitting element 70 (also referred to as "light-emitting device") that can be used as the display element 432 is described.

<Structure Example of Display Element>

Figure 9A:
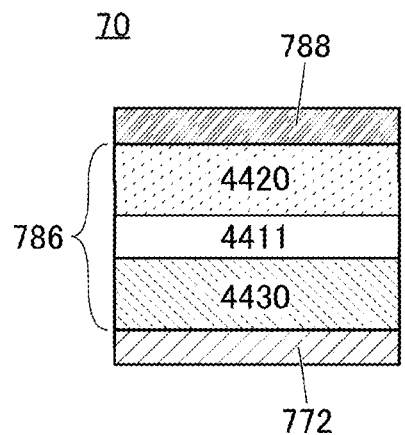
FIG. 9A to FIG. 9D are diagrams illustrating structure examples of a light-emitting element.

As illustrated in FIG. 9A, the light-emitting element 70 includes an EL layer 786 between a pair of electrodes (a conductor 772 and a conductor 788). The EL layer 786 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between the pair of electrodes, can serve as a single light-emitting unit, and the structure in FIG. 9A is referred to as a single structure in this specification and the like.

Figure 9B:
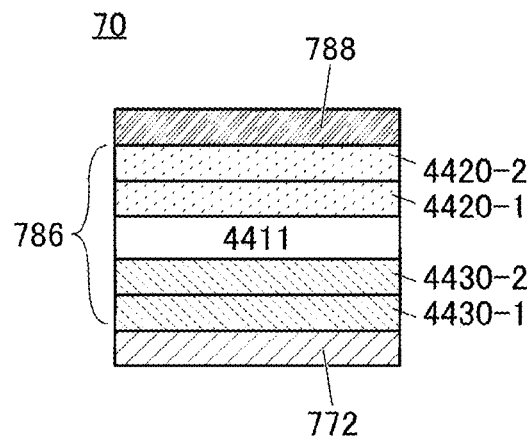

FIG. 9B illustrates a modification example of the EL layer 786 included in the light-emitting element 70 illustrated in FIG. 9A. Specifically, the light-emitting element 70 illustrated in FIG. 9B includes a layer 4430-1 over the conductor 772, a layer 4430-2 over the layer 4430-1, the light-emitting layer 4411 over the layer 4430-2, a layer 4420-1 over the light-emitting layer 4411, a layer 4420-2 over the layer 4420-1, and the conductor 788 over the layer 4420-2. For example, when the conductor 772 functions as an anode and the conductor 788 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the conductor 772 functions as a cathode and the conductor 788 functions as an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layer structure, carriers can be efficiently injected to the light-emitting layer 4411, and the efficiency of the recombination of carriers in the light-emitting layer 4411 can be enhanced.

Figure 9C:
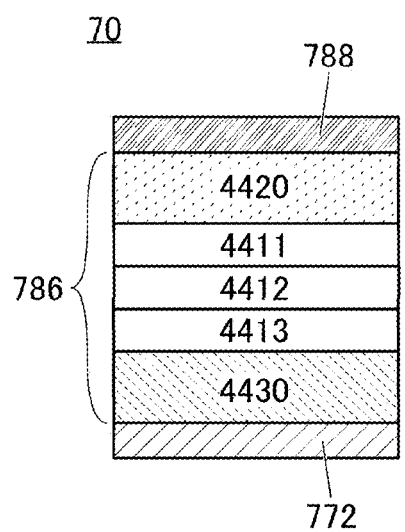
Figure 9D:
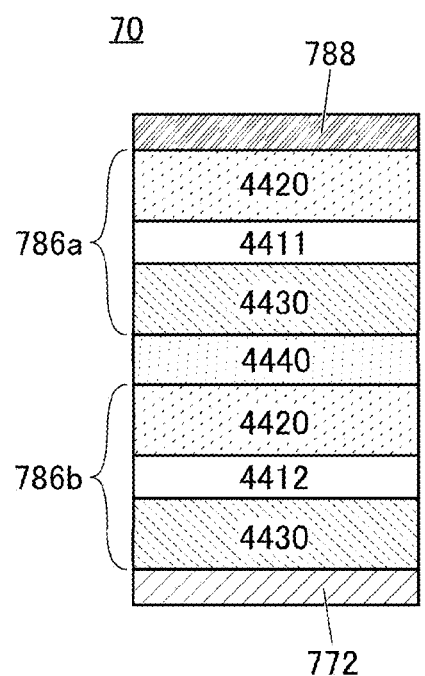

Note that the structure in which a plurality of light-emitting layers (the light-emitting layer 4411, a light-emitting layer 4412, and a light-emitting layer 4413) are provided between the layer 4420 and the layer 4430 as illustrated in FIG. 9C is also an example of the single structure. The structure in which a plurality of light-emitting units (an EL layer 786*a* and an EL layer 786*b*) are connected in series with an intermediate layer (charge-generation layer) 4440 therebetween as illustrated in FIG. 9D is referred to as a tandem structure or a stack structure in this specification and the like. The tandem structure enables a light-emitting element capable of high luminance light emission.

The emission color of the light-emitting element can be red, green, blue, cyan, magenta, yellow, white, or the like depending on the material that constitutes the EL layer 786. Furthermore, the color purity can be further increased when the light-emitting element has a microcavity structure.

The light-emitting layer may contain two or more light-emitting substances that emit light of red (R), green (G), blue (B), yellow (Y), orange (O), or the like. The light-emitting element that emits white light (also referred to as "white light-emitting device") preferably contains two or more kinds of light-emitting substances in the light-emitting layer. To obtain white light emission, two or more kinds of light-emitting substances are selected such that their emission colors are complementary. For example, when the emission color of a first light-emitting layer and the emission color of a second light-emitting layer have a relationship of complementary colors, it is possible to obtain the light-emitting element which emits white light as a whole. This can be applied to a light-emitting element including three or more light-emitting layers.

The light-emitting layer preferably contains two or more light-emitting substances that emit light of red (R), green (G), blue (B), yellow (Y), orange (O), or the like. Alternatively, the light-emitting layer preferably contains two or more light-emitting substances that emit light containing two or more of spectral components of R, G, and B.

<Formation Method of Light-Emitting Element 70>

A method for forming the light-emitting element 70 is described below.

Figure 10A:
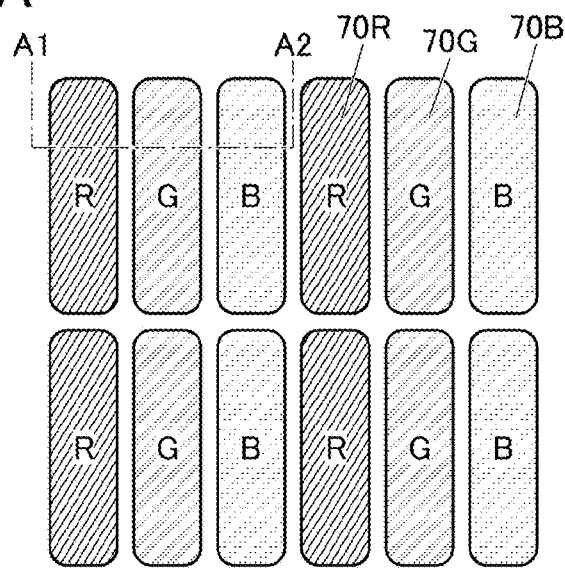
FIG. 10A to FIG. 10D are diagrams illustrating structure examples of a display apparatus.

FIG. 10A illustrates a schematic top view of the light-emitting element 70 of one embodiment of the present invention. The light-emitting element 70 includes a plurality of light-emitting elements 70R exhibiting red, a plurality of light-emitting elements 70G exhibiting green, and a plurality of light-emitting elements 70B exhibiting blue. In FIG. 10A, light-emitting regions of the light-emitting elements are denoted by R, G, and B to easily differentiate the light-emitting elements. Note that the structure of the light-emitting element 70 illustrated in FIG. 10A may be referred to as an SBS (Side By Side) structure. Although the structure illustrated in FIG. 10A has three colors of red (R), green (G), and blue (B), one embodiment of the present invention is not limited thereto. For example, the structure may have four or more colors.

The light-emitting elements 70R, the light-emitting elements 70G, and the light-emitting elements 70B are arranged in a matrix. FIG. 10A illustrates what is called a stripe arrangement, in which the light-emitting elements of the same color are arranged in one direction. Note that the arrangement method of the light-emitting elements is not limited thereto; another arrangement method such as a delta arrangement, a zigzag arrangement, or a PenTile arrangement may also be used.

As the light-emitting element 70R, the light-emitting element 70G, and the light-emitting element 70B, an organic EL device such as an OLED (Organic Light Emitting Diode) or a QLED (Quantum-dot Light Emitting Diode) is preferably used. As a light-emitting substance contained in the EL element, a substance that emits fluorescence (a fluorescent material), a substance that emits phosphorescence (a phosphorescent material), an inorganic compound (e.g., a quantum dot material), a substance that exhibits thermally activated delayed fluorescence (a thermally activated delayed fluorescent (TADF) material), and the like can be given.

Figure 10B:
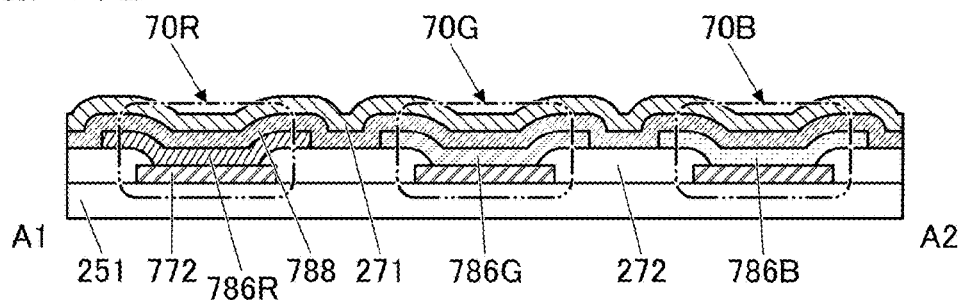

FIG. 10B is a schematic cross-sectional view taken along dashed-dotted line A1-A2 in FIG. 10A. FIG. 10B illustrates a cross section of the light-emitting element 70R, the light-emitting element 70G, and the light-emitting element 70B. The light-emitting element 70R, the light-emitting element 70G, and the light-emitting element 70B are each provided over an insulating layer 251 and include a conductor 772 functioning as a pixel electrode and a conductor 788 functioning as a common electrode. For the insulating layer 251, one or both of an inorganic insulating film and an organic insulating film can be used. An inorganic insulating film is preferably used as the insulating layer 251. As the inorganic insulating film, for example, an oxide insulating film and a nitride insulating film such as a silicon oxide film, a silicon oxynitride film, a silicon nitride oxide film, a silicon nitride film, an aluminum oxide film, an aluminum oxynitride film, or a hafnium oxide film can be given.

The light-emitting element 70R includes an EL layer 786R between the conductor 772 functioning as a pixel electrode and the conductor 788 functioning as a common electrode. The EL layer 786R contains at least a light-emitting organic compound that emits light with an intensity in a red wavelength range. An EL layer 786G included in the light-emitting element 70G contains at least a light-emitting organic compound that emits light with an intensity in a green wavelength range. An EL layer 786B included in the light-emitting element 70B contains at least a light-emitting organic compound that emits light with an intensity in a blue wavelength range.

The EL layer 786R, the EL layer 786G, and the EL layer 786B may each include one or more of an electron-injection layer, an electron-transport layer, a hole-injection layer, and a hole-transport layer in addition to the layer containing a light-emitting organic compound (the light-emitting layer).

The conductor 772 functioning as a pixel electrode is provided in each of the light-emitting elements. The conductor 788 functioning as a common electrode is provided as a continuous layer shared by the light-emitting elements. A conductive film that transmits visible light is used for either the conductor 772 functioning as a pixel electrode or the conductor 788 functioning as a common electrode, and a reflective conductive film is used for the other. When the conductor 772 functioning as a pixel electrode has a light-transmitting property and the conductor 788 functioning as a common electrode has a reflective property, a bottom-emission display apparatus can be obtained, whereas when the conductor 772 functioning as a pixel electrode has a reflective property and the conductor 788 functioning as a common electrode has a light-transmitting property, a top-emission display apparatus can be obtained. Note that when both the conductor 772 functioning as a pixel electrode and the conductor 788 functioning as a common electrode have a light-transmitting property, a dual-emission display apparatus can be obtained.

An insulating layer 272 is provided to cover end portions of the conductor 772 functioning as a pixel electrode. End portions of the insulating layer 272 are preferably tapered. For the insulating layer 272, a material similar to the material that can be used for the insulating layer 251 can be used.

The EL layer 786R, the EL layer 786G, and the EL layer 786B each include a region in contact with a top surface of the conductor 772 functioning as a pixel electrode and a region in contact with a surface of the insulating layer 272. End portions of the EL layer 786R, the EL layer 786G, and the EL layer 786B are positioned over the insulating layer 272.

As illustrated in FIG. 10B, there is a gap between the EL layers of two light-emitting elements for different colors. In this manner, the EL layer 786R, the EL layer 786G, and the EL layer 786B are preferably provided so as not to be in contact with each other. This suitably prevents unintentional light emission (also referred to as crosstalk) from being caused by a current flowing through two adjacent EL layers. As a result, the contrast can be increased to achieve a display apparatus with high display quality.

The EL layer 786R, the EL layer 786G, and the EL layer 786B can be formed separately by a vacuum evaporation method or the like using a shadow mask such as a metal mask. Alternatively, these layers may be formed separately by a photolithography method. The use of the photolithography method achieves a display apparatus with high resolution, which is difficult to obtain in the case of using a metal mask.

In this specification and the like, a device formed using a metal mask or an FMM (fine metal mask, high-resolution metal mask) is sometimes referred to as a device having an MM (metal mask) structure. In this specification and the like, a device formed without using a metal mask or an FMM is sometimes referred to as a device having an MML (metal maskless) structure. A display apparatus having an MML structure is formed without using a metal mask and thus has higher flexibility in designing the pixel arrangement, the pixel shape, and the like than a display apparatus having an FMM structure or an MM structure.

Note that in the method for manufacturing a display apparatus having an MML structure, an island-shaped EL layer is formed not by patterning with the use of a metal mask but by processing after formation of an EL layer over an entire surface. Accordingly, a high-resolution display apparatus or a display apparatus with a high aperture ratio, which has been difficult to be formed so far, can be achieved. Moreover, EL layers of different colors can be formed separately, enabling the display apparatus to perform extremely clear display with high contrast and high display quality. Moreover, providing the sacrificial layer over the EL layer can reduce damage to the EL layer in the manufacturing process of the display apparatus, resulting in an increase in the reliability of the light-emitting device.

The display apparatus of one embodiment of the present invention can have a structure not provided with an insulator that covers the end portion of the pixel electrode, that is, the structure not provided with an insulator between the pixel electrode and the EL layer. With such a structure, light can be efficiently extracted from the EL layer, leading to extremely low viewing angle dependence. For example, in the display apparatus of one embodiment of the present invention, the viewing angle (the maximum angle with a certain contrast ratio maintained when the screen is seen from an oblique direction) can be greater than or equal to 100° and less than 180°, preferably greater than or equal to 150° and less than or equal to 170°. Note that the viewing angle refers to that in both the vertical direction and the horizontal direction. The display apparatus of one embodiment of the present invention can have improved viewing angle dependence and high image visibility.

In the case where a display apparatus is formed using a fine metal mask (FMM) structure, the pixel arrangement structure or the like is limited in some cases. Here, the FMM structure will be described below.

In the FMM structure, a metal mask provided with an opening portion (also referred to as an FMM) is set to be opposed to a substrate so that an EL can be deposited to a desired region at the time of EL evaporation. Then, the EL is deposited to the desired region by EL evaporation through the FMM. When the size of the substrate at the time of EL evaporation is larger, the size of the FMM is increased and accordingly the weight thereof is also increased. In addition, heat or the like is applied to the FMM at the time of EL evaporation and may change the shape of the FMM. Furthermore, there is a method in which EL evaporation is performed while a certain level of tension is applied to the FMM. Therefore, the weight and strength of the FMM are important parameters.

The pixel arrangement structure with an FMM needs to be designed under certain restrictions; for example, the above-described parameters and the like need to be considered. In contrast, in the display apparatus of one embodiment of the present invention manufactured using an MML structure, an excellent effect such as higher flexibility in the pixel arrangement structure or the like than the FMM structure can be exhibited. This structure is highly compatible with a flexible device or the like, for example, and thus one or both of a pixel and a driver circuit can have a variety of circuit arrangements.

A protective layer 271 is provided over the conductor 788 functioning as a common electrode so as to cover the light-emitting element 70R, the light-emitting element 70G, and the light-emitting element 70B. The protective layer 271 has a function of preventing diffusion of impurities such as water into the light-emitting elements from above.

The protective layer 271 can have, for example, a single-layer structure or a stacked-layer structure at least including an inorganic insulating film. As the inorganic insulating film, for example, an oxide film or a nitride film such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide (IGZO) may be used for the protective layer 271. Note that the protective layer 271 may be formed by an atomic layer deposition (ALD) method, a chemical vapor deposition (CVD) method, or a sputtering method. Although the protective layer 271 includes an inorganic insulating film in this example, one embodiment of the present invention is not limited thereto. For example, the protective layer 271 may have a stacked-layer structure of an inorganic insulating film and an organic insulating film.

Note that in this specification, a nitride oxide refers to a compound that contains more nitrogen than oxygen. An oxynitride refers to a compound that contains more oxygen than nitrogen. The content of each element can be measured by Rutherford backscattering spectrometry (RBS), for example.

In the case where an indium gallium zinc oxide is used for the protective layer 271, the indium gallium zinc oxide can be processed by a wet etching method or a dry etching method. For example, in the case where IGZO is used as the protective layer 271, a chemical solution of oxalic acid, phosphoric acid, a mixed chemical solution (e.g., a mixed chemical solution of phosphoric acid, acetic acid, nitric acid, and water, which is also referred to as a mixed acid aluminum etchant), or the like can be used. Note that the volume ratio of phosphoric acid, acetic acid, nitric acid, and water mixed in the mixed acid aluminum etchant can be 53.3:6.7:3.3:36.7 or in the neighborhood thereof.

Figure 10C:
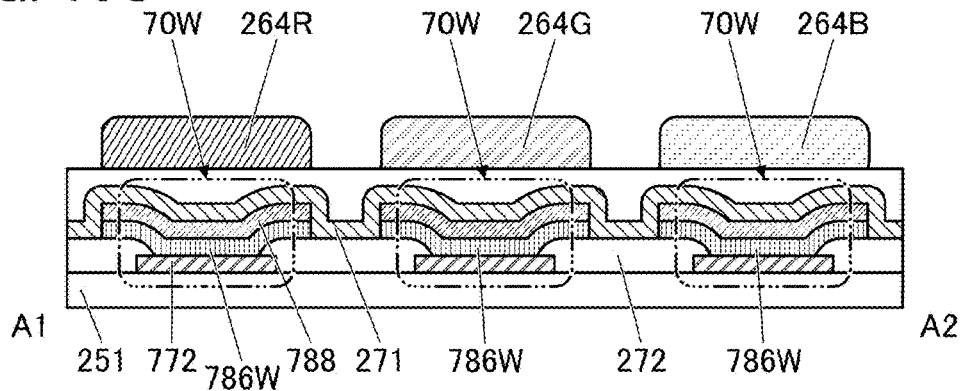

FIG. 10C illustrates an example different from the above. Specifically, in FIG. 10C, light-emitting elements 70W that emit white light are provided. The light-emitting elements 70W each include an EL layer 786W that emits white light between the conductor 772 functioning as a pixel electrode and the conductor 788 functioning as a common electrode.

The EL layer 786W can have, for example, a structure in which two or more light-emitting layers that are selected so as to emit light of complementary colors are stacked. It is also possible to use a stacked EL layer in which a charge-generation layer is provided between light-emitting layers.

FIG. 10C illustrates three light-emitting elements 70W side by side. A coloring layer 264R is provided above the left light-emitting element 70W. The coloring layer 264R functions as a band path filter that transmits red light. Similarly, a coloring layer 264G that transmits green light is provided above the middle light-emitting element 70W, and a coloring layer 264B that transmits blue light is provided above the right light-emitting element 70W. Thus, the display apparatus can display an image with colors.

Here, the EL layer 786W and the conductor 788 functioning as a common electrode are each separated between adjacent two light-emitting elements 70W. This can prevent unintentional light emission from being caused by a current flowing through the EL layers 786W of adjacent two light-emitting elements 70W. Particularly when stacked EL layers in which a charge-generation layer is provided between two light-emitting layers are used as the EL layer 786W, crosstalk is more significant as the resolution increases, i.e., as the distance between adjacent pixels decreases, leading to lower contrast. Thus, the above structure can achieve a display apparatus having both high resolution and high contrast.

The EL layer 786W and the conductor 788 functioning as a common electrode are preferably isolated by a photolithography method. This can reduce the distance between light-emitting elements, achieving a display apparatus with a higher aperture ratio than that formed using, for example, a shadow mask such as a metal mask.

Note that in the case of a bottom-emission light-emitting element, a coloring layer may be provided between the conductor 772 functioning as a pixel electrode and the insulating layer 251.

Figure 10D:
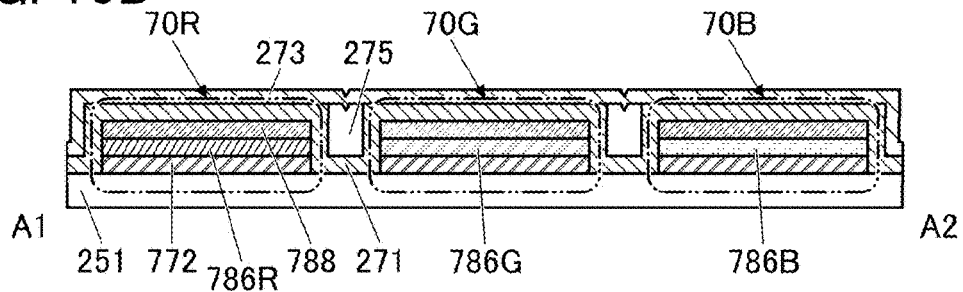

FIG. 10D illustrates an example different from the above. Specifically, in FIG. 10D, the insulating layers 272 are not provided between the light-emitting element 70R, the light-emitting element 70G, and the light-emitting element 70B. With such a structure, the display apparatus can have a high aperture ratio. The protective layer 271 covers side surfaces of the EL layer 786R, the EL layer 786G, and the EL layer 786B. With this structure, impurities (typically, water) can be inhibited from entering the EL layer 786R, the EL layer 786G, and the EL layer 786B through their side surfaces. In the structure illustrated in FIG. 10D, the top shapes of the conductor 772, the EL layer 786R, and the conductor 788 are substantially aligned with each other. This structure can be formed in such a manner that the conductor 772, the EL layer 786R, and the conductor 788 are formed and collectively processed using a resist mask or the like. In this process, the EL layer 786R and the conductor 788 are processed using the conductor 788 as a mask, and thus this process can be called self-alignment patterning. Although the EL layer 786R is described here, the EL layer 786G and the EL layer 786B can each have a similar structure.

In FIG. 10D, a protective layer 273 is further provided over the protective layer 271. For example, the protective layer 271 can be formed with an apparatus that can deposit a film with excellent coverage (typically, an ALD apparatus), and the protective layer 273 can be formed with an apparatus that can deposit a film with coverage inferior to that of the protective layer 271 (typically, a sputtering apparatus), whereby a region 275 can be provided between the protective layer 271 and the protective layer 273. In other words, the region 275 are positioned between the EL layer 786R and the EL layer 786G and between the EL layer 786G and the EL layer 786B.

Note that the region 275 includes, for example, any one or more selected from air, nitrogen, oxygen, carbon dioxide, and Group 18 elements (typically, helium, neon, argon, xenon, and krypton). Furthermore, for example, a gas used during the deposition of the protective layer 273 is sometimes included in the region 275. For example, in the case where the protective layer 273 is deposited using a sputtering method, any one or more of the above-described Group 18 elements is sometimes included in the region 275. In the case where a gas is included in the region 275, a gas can be identified with a gas chromatography method or the like. Alternatively, in the case where the protective layer 273 is deposited using a sputtering method, a gas used in the sputtering is sometimes contained in the protective layer 273. In this case, an element such as argon is sometimes detected when the protective layer 273 is analyzed by an energy dispersive X-ray analysis (EDX analysis) or the like.

In the case where the refractive index of the region 275 is lower than that of the protective layer 271, light emitted from the EL layer 786R, the EL layer 786G, or the EL layer 786B is reflected at the interface between the protective layer 271 and the region 275. Thus, light emitted from the EL layer 786R, the EL layer 786G, or the EL layer 786B can be inhibited from entering an adjacent pixel in some cases. This can inhibit color mixture of light emitted from adjacent pixels and thus can improve the display quality of the display apparatus.

The region 275 may be filled with an insulating layer or the like including an organic material. As the insulating layer including an organic material, an acrylic resin, a polyimide resin, an epoxy resin, a polyamide resin, a polyimide-amide resin, a siloxane resin, a benzocyclobutene-based resin, a phenol resin, precursors of these resins, or the like can be used, for example.

As the insulating layer for filling the region 275, a photosensitive resin (e.g., a resist material) may be used. As the photosensitive resin, a positive photosensitive material or a negative photosensitive material can be used. With the photosensitive resin, the insulating layer can be provided in the region 275 only by light exposure and development steps. The material for filling the region 275 preferably absorbs visible light. When the region 275 is filled with a material that absorbs visible light, light emitted from the EL layer can be absorbed by the region 275, so that light that might leak to the adjacent EL layer (stray light) can be inhibited. Accordingly, a display apparatus that has high display quality can be provided.

In the case of the structure illustrated in FIG. 10D, a region between the light-emitting element 70R and the light-emitting element 70G or a region between the light-emitting element 70G and the light-emitting element 70B (hereinafter simply referred to as a distance between the light-emitting elements) can be small. Specifically, the distance between the light-emitting elements can be less than or equal to 1 μm, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display apparatus includes a region in which an interval between the side surface of the EL layer 786R and the side surface of the EL layer 786G or an interval between the side surface of the EL layer 786G and the side surface of the EL layer 786B is less than or equal to 1 µm, preferably less than or equal to 0.5 lam (500 nm), further preferably less than or equal to 100 nm.

In the case where the region 275 includes air, for example, the structure illustrated in FIG. 10D can be referred to as an air isolation structure. The air isolation structure allows the light-emitting elements to be isolated from each other and color mixing of light or crosstalk between the light-emitting elements can be inhibited.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

Figure 11A:
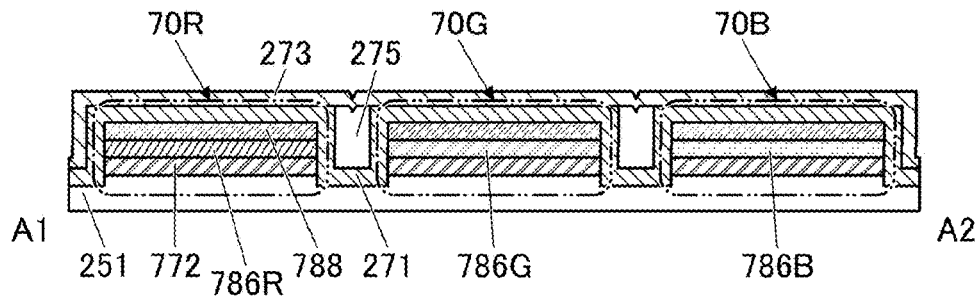
FIG. 11A to FIG. 11D are diagrams illustrating structure examples of a display apparatus.

FIG. 11A illustrates an example different from the above. Specifically, the structure illustrated in FIG. 11A is different from the structure illustrated in FIG. 10D in the structure of the insulating layer 251. The insulating layer 251 has a recessed portion in its top surface that is formed by being partially etched when the light-emitting element 70R, the light-emitting element 70G, and the light-emitting element 70B are processed. In addition, the protective layer 271 is formed in the recessed portion. In other words, in the cross-sectional view, a region is provided, in which the bottom surface of the protective layer 271 is positioned below the bottom surface of the conductor 772. With the region, impurities (typically, water or the like) can be suitably inhibited from entering the light-emitting element 70R, the light-emitting element 70G, and the light-emitting element 70B from the bottom. It is likely that the recessed portion can be formed when impurities (also referred to as residue) that could be attached to the side surfaces of the light-emitting element 70R, the light-emitting element 70G, and the light-emitting element 70B in processing of the light-emitting elements are removed by e.g., wet etching. After the residue is removed, the side surfaces of the light-emitting elements are covered with the protective layer 271, whereby a highly reliable display apparatus can be provided.

Figure 11B:
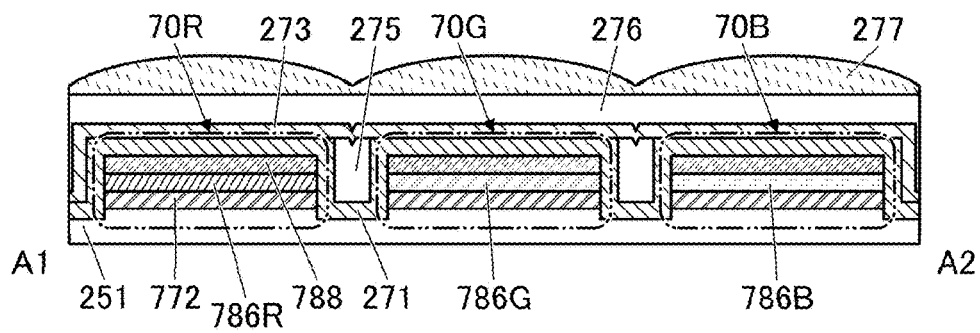

FIG. 11B illustrates an example different from the above. Specifically, the structure illustrated in FIG. 11B includes an insulating layer 276 and a microlens array 277 in addition to the structure illustrated in FIG. 11A. The insulating layer 276 functions as an adhesive layer. Note that when the refractive index of the insulating layer 276 is lower than that of the microlens array 277, the microlens array 277 can condense light emitted from the light-emitting element 70R, the light-emitting element 70G, and the light-emitting element 70B. This can increase the light extraction efficiency of the display apparatus. In particular, this is suitable, because a user can see bright images when the user sees the display surface from the front of the display apparatus. As the insulating layer 276, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

Figure 11C:
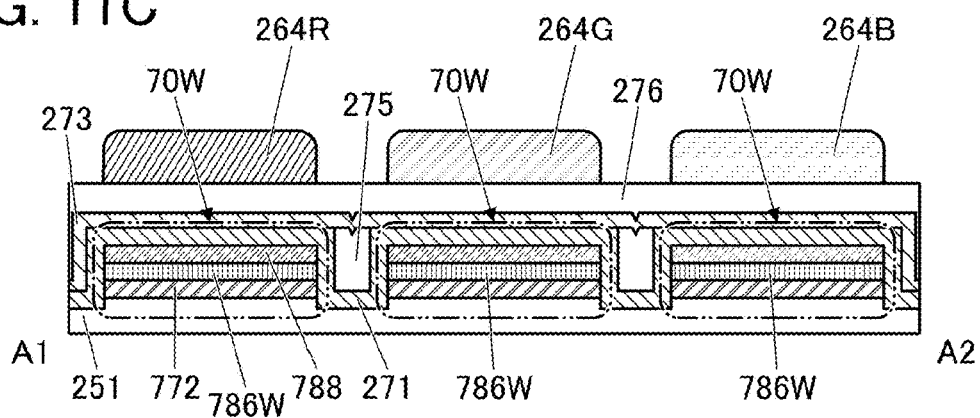

FIG. 11C illustrates an example different from the above. Specifically, the structure illustrated in FIG. 11C includes three light-emitting elements 70W instead of the light-emitting element 70R, the light-emitting element 70G, and the light-emitting element 70B in the structure illustrated in FIG. 11A. In addition, the insulating layer 276 is provided over the three light-emitting elements 70W, and the coloring layer 264R, the coloring layer 264G, and the coloring layer 264B are provided over the insulating layer 276. Specifically, the coloring layer 264R that transmits red light is provided at a position overlapping with the left light-emitting element 70W, the coloring layer 264G that transmits green light is provided at a position overlapping with the middle light-emitting element 70W, and the coloring layer 264B that transmits blue light is provided at a position overlapping with the right light-emitting element 70W. Thus, the semiconductor device can display an image with colors. The structure illustrated in FIG. 11C is also a modification example of the structure illustrated in FIG. 10C. Note that a coloring layer is sometimes referred to as "color filter".

The light-emitting elements 70W illustrated in FIG. 11C can have the above-described structure capable of white light emission (the single structure or the tandem structure). The tandem structure is preferable to obtain high-luminance light emission.

When the above-described structure capable of white light emission (one or both of the single structure and the tandem structure), color filters, and the MML structure of one embodiment of the present invention are combined, a display apparatus with a high contrast ratio can be obtained.

Figure 11D:
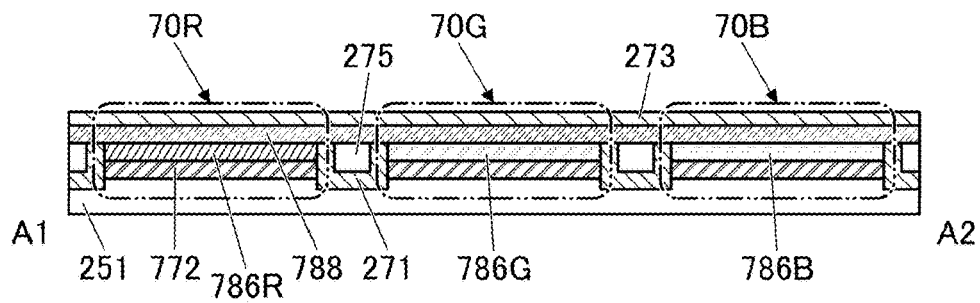

FIG. 11D illustrates an example different from the above. Specifically, in the structure illustrated in FIG. 11D, the protective layer 271 is provided adjacent to the side surfaces of the conductor 772 and the EL layer 786. The conductor 788 is provided as a common layer shared by the light-emitting elements. In the structure illustrated in FIG. 11D, the region 275 is preferably filled with a filler.

Furthermore, the color purity of emitted light can be further increased when the light-emitting element 70 has a microcavity structure. In order that the light-emitting element 70 has a microcavity structure, a product of a distance d between the conductor 772 and the conductor 788 and a refractive index n of the EL layer 786 (optical path length) is set to m times half of a wavelength λ (m is an integer of 1 or more). The distance d can be obtained by Formula 1.

$$d = m \times \lambda / (2 \times n)$$  Formula 1

According to Formula 1, in the light-emitting element 70 having the microcavity structure, the distance d is determined in accordance with the wavelength (emission color) of emitted light. The distance d corresponds to the thickness of the EL layer 786. Thus, the EL layer 786G is provided to have a larger thickness than the EL layer 786B, and the EL layer 786R is provided to have a larger thickness than the EL layer 786G in some cases.

To be exact, the distance d is a distance from a reflection region in the conductor 772 functioning as a reflective electrode to a reflection region in the conductor 788 functioning as a transflective electrode. For example, in the case where the conductor 772 is a stack of silver and ITO that is a transparent conductive film and the ITO is positioned on the EL layer 786 side, the distance d suitable for the emission color can be set by adjusting the thickness of the ITO. That is, even when the EL layer 786R, the EL layer 786G, and the EL layer 786B have the same thickness, the distance d suitable for the emission color can be obtained by adjusting the thickness of the ITO.

However, it is sometimes difficult to determine the exact position of the reflection region in each of the conductor 772 and the conductor 788. In this case, it is assumed that the effect of the microcavity structure can be fully obtained with a certain position in each of the conductor 772 and the conductor 788 being supposed as the reflection region.

The light-emitting element 70 includes a hole-transport layer, a hole-transport layer, a light-emitting layer, an electron-transport layer, an electron-injection layer, and the like. In order to increase the outcoupling efficiency in the microcavity structure, the optical path length from the conductor 772 functioning as a reflective electrode to the light-emitting layer is preferably set to an odd multiple of λ/4. In order to achieve this optical path length, the thicknesses of the layers in the light-emitting element 70 are preferably adjusted as appropriate.

In the case where light is emitted from the conductor 788 side, the reflectance of the conductor 788 is preferably higher than the transmittance thereof. The light transmittance of the conductor 788 is preferably higher than or equal to 2% and lower than or equal to 50%, further preferably higher than or equal to 2% and lower than or equal to 30%, still further preferably higher than or equal to 2% and lower than or equal to 10%. When the transmittance of the conductor 788 is set low (the reflectance is set high), the effect of the microcavity structure can be enhanced.

This embodiment can be combined with the description of the other embodiments as appropriate.

Embodiment 4

In this embodiment, an example of a cross-sectional structure of the display apparatus 10 that is one embodiment of the present invention will be described.

Figure 12:
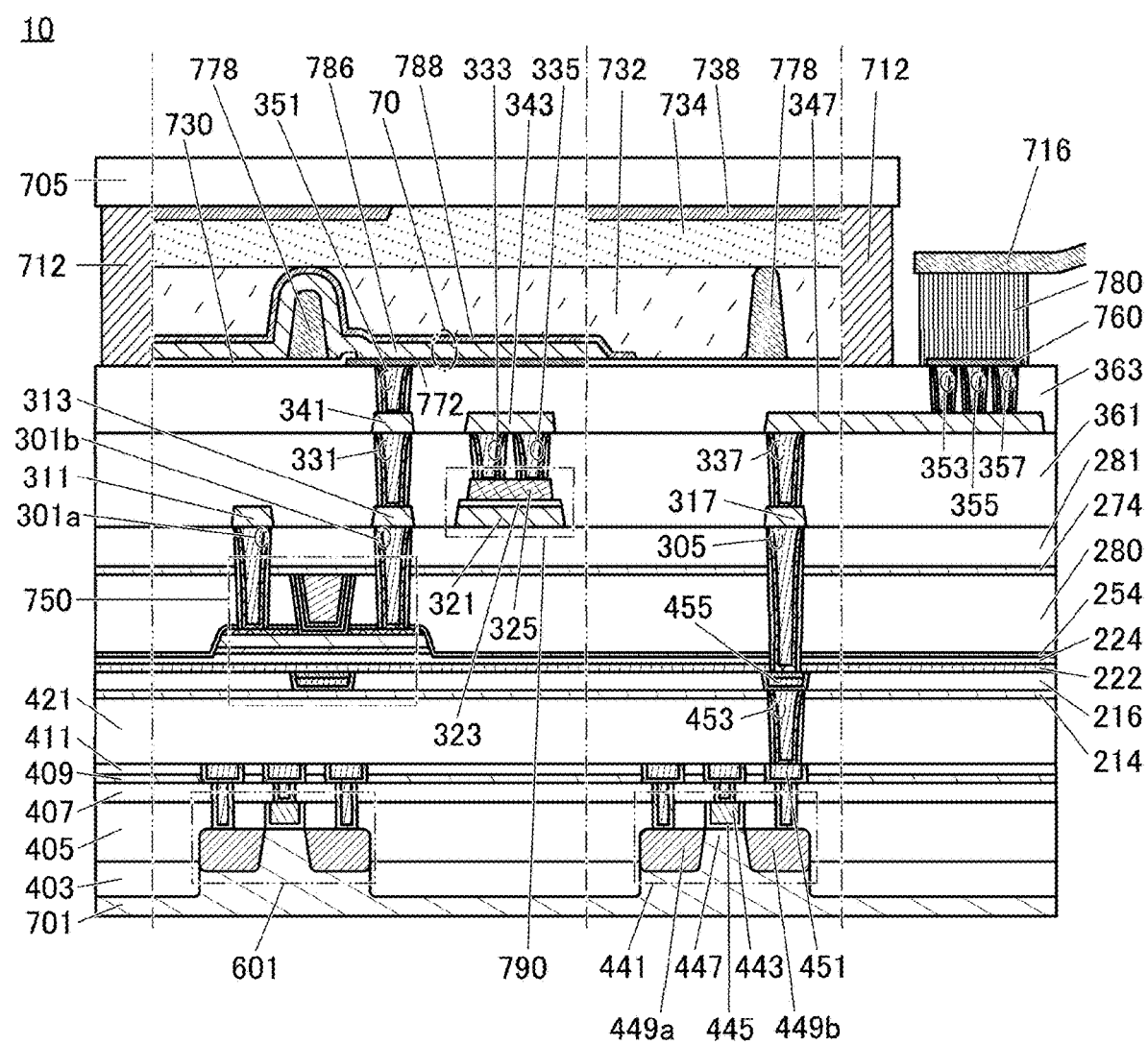
FIG. 12 is a cross-sectional view illustrating a structure example of a display apparatus.

FIG. 12 is a cross-sectional view illustrating a structure example of the display apparatus 10. The display apparatus 10 includes a substrate 701 and a substrate 705. The substrate 701 and the substrate 705 are attached to each other with a sealant 712.

As the substrate 701, a single crystal semiconductor substrate such as a single crystal silicon substrate can be used. Note that a semiconductor substrate other than a single crystal semiconductor substrate may be used as the substrate 701.

A transistor 441 and a transistor 601 are provided over the substrate 701. The transistor 441 and the transistor 601 can each be used as the transistor provided in the layer 30, which is described in the above embodiment.

The transistor 441 is formed of a conductor 443 having a function of a gate electrode, an insulator 445 having a function of a gate insulator, and part of the substrate 701 and includes a semiconductor region 447 including a channel formation region, a low-resistance region 449a having a function of one of a source region and a drain region, and a low-resistance region 449b having a function of the other of the source region and the drain region. The transistor 441 can be either a p-channel transistor or an n-channel transistor.

The transistor 441 is electrically isolated from other transistors by an element isolation layer 403. FIG. 12 illustrates the case where the transistor 441 and the transistor 601 are electrically isolated from each other by the element isolation layer 403. The element isolation layer 403 can be formed by a LOCOS (LOCal Oxidation of Silicon) method, an STI (Shallow Trench Isolation) method, or the like.

Here, in the transistor 441 illustrated in FIG. 12, the semiconductor region 447 has a projecting shape. Moreover, the conductor 443 is provided to cover the side surface and the top surface of the semiconductor region 447 with the insulator 445 therebetween. Note that FIG. 12 does not illustrate the state where the conductor 443 covers the side surface of the semiconductor region 447. A material adjusting the work function can be used for the conductor 443.

A transistor having a projecting semiconductor region, like the transistor 441, can be referred to as a fin-type transistor because a projecting portion of a semiconductor substrate is used. An insulator having a function of a mask for forming a projecting portion may be provided in contact with an upper portion of the projecting portion. Although FIG. 12 illustrates the structure in which the projecting portion is formed by processing part of the substrate 701, a semiconductor having a projecting shape may be formed by processing an SOI substrate.

Note that the structure of the transistor 441 illustrated in FIG. 12 is an example; the structure of the transistor 441 is not limited thereto and can be changed as appropriate in accordance with the circuit configuration, an operation method for the circuit, or the like. For example, the transistor 441 may be a planar transistor.

The transistor 601 can have a structure similar to that of the transistor 441.

An insulator 405, an insulator 407, an insulator 409, and an insulator 411 are provided over the substrate 701, in addition to the element isolation layer 403, the transistor 441, and the transistor 601. A conductor 451 is embedded in the insulator 405, the insulator 407, the insulator 409, and the insulator 411. Here, the top surface of the conductor 451 and the top surface of the insulator 411 can be substantially level with each other.

An insulator 421 and an insulator 214 are provided over the conductor 451 and the insulator 411. A conductor 453 is embedded in the insulator 421 and the insulator 214. Here, the top surface of the conductor 453 and the top surface of the insulator 214 can be substantially level with each other.

An insulator 216 is provided over the conductor 453 and the insulator 214. A conductor 455 is embedded in the insulator 216. Here, the top surface of the conductor 455 and the top surface of the insulator 216 can be substantially level with each other.

An insulator 222, an insulator 224, an insulator 254, an insulator 280, an insulator 274, and an insulator 281 are provided over the conductor 455 and the insulator 216. A conductor 305 is embedded in the insulator 222, the insulator 224, the insulator 254, the insulator 280, the insulator 274, and the insulator 281. Here, the top surface of the conductor 305 and the top surface of the insulator 281 can be substantially level with each other.

An insulator 361 is provided over the conductor 305 and the insulator 281. A conductor 317 and a conductor 337 are embedded in the insulator 361. Here, the top surface of the conductor 337 and the top surface of the insulator 361 can be substantially level with each other.

An insulator 363 is provided over the conductor 337 and the insulator 361. A conductor 347, a conductor 353, a conductor 355, and a conductor 357 are embedded in the insulator 363. Here, the top surfaces of the conductor 353, the conductor 355, and the conductor 357 and the top surface of the insulator 363 can be substantially level with each other.

A connection electrode 760 is provided over the conductor 353, the conductor 355, the conductor 357, and the insulator 363. An anisotropic conductor 780 is provided to be electrically connected to the connection electrode 760, and an FPC (Flexible Printed Circuit) 716 is provided to be electrically connected to the anisotropic conductor 780. A variety of signals and the like are supplied to the display apparatus 10 from outside of the display apparatus 10 through the FPC 716.

As illustrated in FIG. 12, the low-resistance region 449b having a function of the other of the source region and the drain region of the transistor 441 is electrically connected to the FPC 716 through the conductor 451, the conductor 453, the conductor 455, the conductor 305, the conductor 317, the conductor 337, the conductor 347, the conductor 353, the conductor 355, the conductor 357, the connection electrode 760, and the anisotropic conductor 780. Although FIG. 12 illustrates three conductors, which are the conductor 353, the conductor 355, and the conductor 357, as conductors having a function of electrically connecting the connection electrode 760 and the conductor 347, one embodiment of the present invention is not limited thereto. The number of conductors having a function of electrically connecting the connection electrode 760 and the conductor 347 may be one, two, or four or more. Providing a plurality of conductors having a function of electrically connecting the connection electrode 760 and the conductor 347 can reduce the contact resistance.

A transistor 750 is provided over the insulator 214. The transistor 750 can be a transistor provided in the layer 40 described in the above embodiment. For example, the transistor 750 can be a transistor provided in the pixel circuit 431. An OS transistor can be suitably used as the transistor 750. The OS transistor has a feature of extremely low off-state current. Consequently, the retention time for image data or the like can be increased, so that the frequency of the refresh operation can be reduced. Thus, power consumption of the display apparatus 10 can be reduced.

A conductor 301a and a conductor 301b are embedded in the insulator 254, the insulator 280, the insulator 274, and the insulator 281. The conductor 301a is electrically connected to one of a source and a drain of the transistor 750, and the conductor 301b is electrically connected to the other of the source and the drain of the transistor 750. Here, the top surfaces of the conductor 301a and the conductor 301b and the top surface of the insulator 281 can be substantially level with each other.

A conductor 311, a conductor 313, a conductor 331, a capacitor 790, a conductor 333, and a conductor 335 are embedded in the insulator 361. The conductor 311 and the conductor 313 are electrically connected to the transistor 750 and have a function of a wiring. The conductor 333 and the conductor 335 are electrically connected to the capacitor 790. Here, the top surfaces of the conductor 331, the conductor 333, and the conductor 335 and the top surface of the insulator 361 can be substantially level with each other.

A conductor 341, a conductor 343, and a conductor 351 are embedded in the insulator 363. Here, the top surface of the conductor 351 and the top surface of the insulator 363 can be substantially level with each other.

The insulator 405, the insulator 407, the insulator 409, the insulator 411, the insulator 421, the insulator 214, the insulator 280, the insulator 274, the insulator 281, the insulator 361, and the insulator 363 have a function of an interlayer film and may also have a function of a planarization film that covers unevenness thereunder. For example, the top surface of the insulator 363 may be planarized by planarization treatment using a chemical mechanical polishing (CMP) method or the like to have the increased planarity.

As illustrated in FIG. 12, the capacitor 790 includes a lower electrode 321 and an upper electrode 325. An insulator 323 is provided between the lower electrode 321 and the upper electrode 325. In other words, the capacitor 790 has a stacked-layer structure in which the insulator 323 functioning as a dielectric is provided between the pair of electrodes. Although FIG. 12 illustrates the example in which the capacitor 790 is provided over the insulator 281, the capacitor 790 may be provided over an insulator different from the insulator 281.

In the example illustrated in FIG. 12, the conductor 301a, the conductor 301b, and the conductor 305 are formed in the same layer. In the illustrated example, the conductor 311, the conductor 313, the conductor 317, and the lower electrode 321 are formed in the same layer. In the illustrated example, the conductor 331, the conductor 333, the conductor 335, and the conductor 337 are formed in the same layer. In the illustrated example, the conductor 341, the conductor 343, and the conductor 347 are formed in the same layer. In the illustrated example, the conductor 351, the conductor 353, the conductor 355, and the conductor 357 are formed in the same layer. Forming a plurality of conductors in the same layer simplifies the manufacturing process of the display apparatus 10 and thus the manufacturing cost of the display apparatus 10 can be reduced. Note that these conductors may be formed in different layers or may contain different types of materials.

The display apparatus 10 illustrated in FIG. 12 includes the light-emitting element 70. The light-emitting element 70 includes the conductor 772, the EL layer 786, and the conductor 788. The EL layer 786 contains an organic compound or an inorganic compound such as quantum dots. Examples of materials that can be used as an organic compound include a fluorescent material and a phosphorescent material. Examples of materials that can be used as quantum dots include a colloidal quantum dot material, an alloyed quantum dot material, a core-shell quantum dot material, and a core quantum dot material.

The conductor 772 is electrically connected to the other of the source and the drain of the transistor 750 through the conductor 351, the conductor 341, the conductor 331, the conductor 313, and the conductor 301b. The conductor 772 is formed over the insulator 363 and has a function of a pixel electrode.

A material that transmits visible light or a material that reflects visible light can be used for the conductor 772. As a light-transmitting material, for example, an oxide material containing indium, zinc, tin, or the like is preferably used. As a reflective material, for example, a material containing aluminum, silver, or the like is preferably used.

Although not illustrated in FIG. 12, an optical member (optical substrate) such as a polarizing member, a retardation member, or an anti-reflection member can be provided in the display apparatus 10, for example.

On the substrate 705 side, a light-blocking layer 738 and an insulator 734 that is in contact therewith are provided. The light-blocking layer 738 has a function of blocking light emitted from adjacent regions. Alternatively, the light-blocking layer 738 has a function of preventing external light from reaching the transistor 750 or the like.

In the display apparatus 10 illustrated in FIG. 12, an insulator 730 is provided over the insulator 363. Here, the insulator 730 can cover part of the conductor 772. Here, the light-emitting element 70 is a top-emission light-emitting element, which includes the conductor 788 with a light-transmitting property. Note that the light-emitting element 70 may have a bottom-emission structure in which light is emitted to the conductor 772 side or a dual-emission structure in which light is emitted towards both the conductor 772 and the conductor 788.

The light-blocking layer 738 is provided to have a region overlapping with the insulator 730. The light-blocking layer 738 is covered with the insulator 734. A space between the light-emitting element 70 and the insulator 734 is filled with a sealing layer 732.

A component 778 is provided between the insulator 730 and the EL layer 786. Moreover, the component 778 is provided between the insulator 730 and the insulator 734.

Note that the display apparatus 10 illustrated in FIG. 12 includes an OS transistor and a light-emitting device having an MML structure. With this structure, the leakage current that might flow through the transistor and the leakage current that might flow between adjacent light-emitting elements (also referred to as a lateral leakage current, a side leakage current, or the like) can become extremely low. With the structure, a viewer can notice any one or more of the image crispness, the image sharpness, a high chroma, and a high contrast ratio in an image displayed on the display apparatus. With the structure where the leakage current that might flow through the transistor and the lateral leakage current that might flow between light-emitting elements are extremely low, display with little leakage of light at the time of black display (i.e., with few phenomena in which the black image looks whitish) (such display is also referred to as deep black display) can be achieved.

In particular, in the case where a light-emitting device having an MML structure employs the above-described SBS structure, a layer provided between light-emitting elements (for example, also referred to as an organic layer or a common layer which is commonly used between the light-emitting elements) is disconnected; accordingly, display with no or extremely low side leakage can be achieved.

Figure 13:
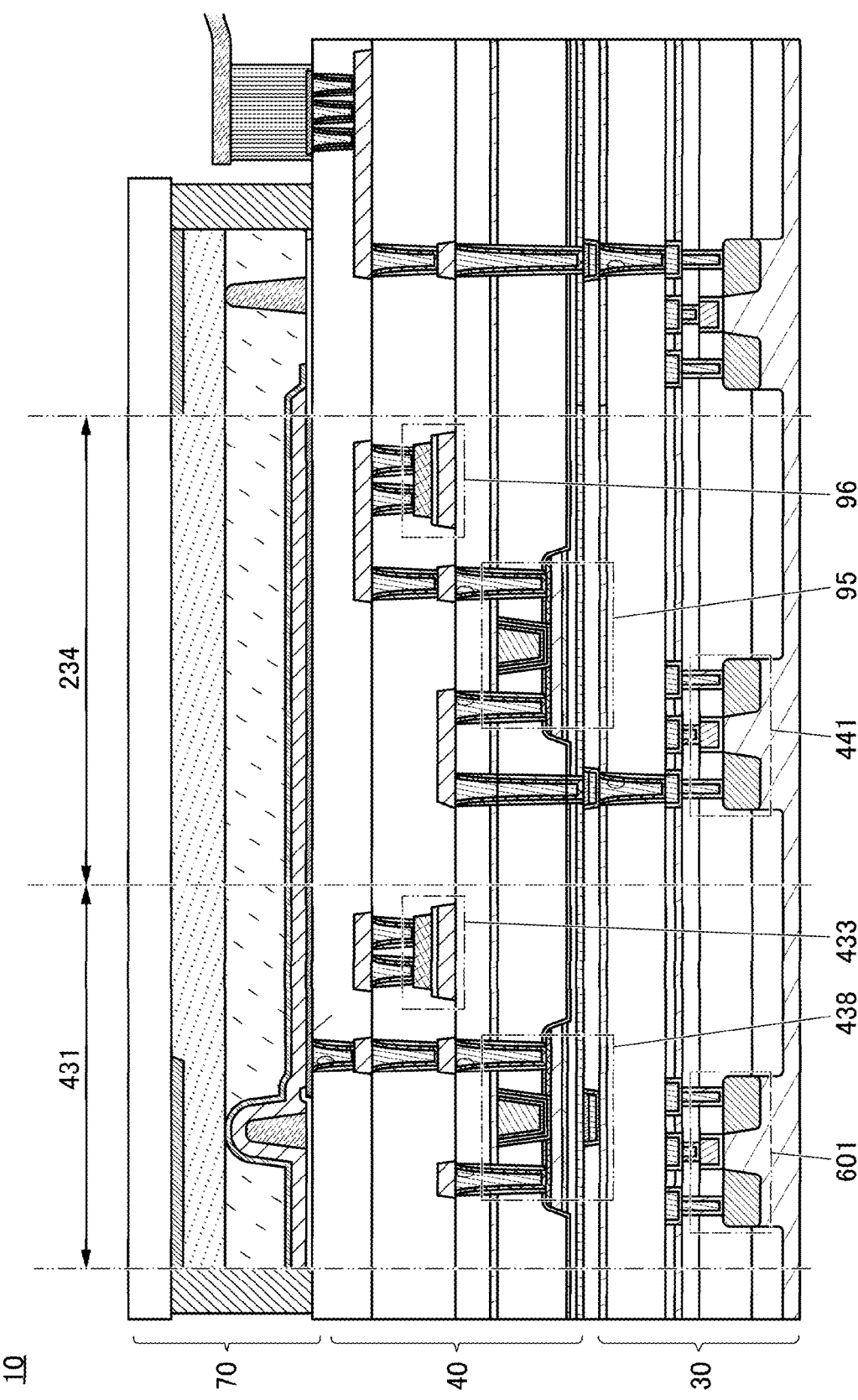
FIG. 13 is a cross-sectional view illustrating a structure example of a display apparatus.

FIG. 13 is a cross-sectional view including the S1 transistor included in the layer 30 and the OS transistor included in the layer 40. The description of the cross-sectional view illustrated in FIG. 13 is similar to that of the structures in the cross-sectional view illustrated in FIG. 12.

As illustrated in FIG. 13, the transistor 601 included in the peripheral driver circuit and the transistor 441 included in the functional circuit region 234 can be provided in the layer 30. The transistor 601 and the transistor 441 are S1 transistors, for example. As illustrated in FIG. 13, the transistor 438 and the capacitor 433, which are of the pixel circuit 431, and a transistor 95 and a capacitor 96, which are electrically connected to the transistor 441 and are of the functional circuit region 234, can be provided in the layer 40. The light-emitting element 70 can be provided in a layer above the layer 40.

For example, the transistor 95 can be a transistor of the memory circuit included in the functional circuit region 234. An OS transistor can be used as the transistor 95. The OS transistor has a feature of extremely low off-state current. Thus, data written into the memory circuit can be retained for a long time. In addition, data can be kept retained even in a period where power supply to the memory circuit is stopped.

Figure 14:
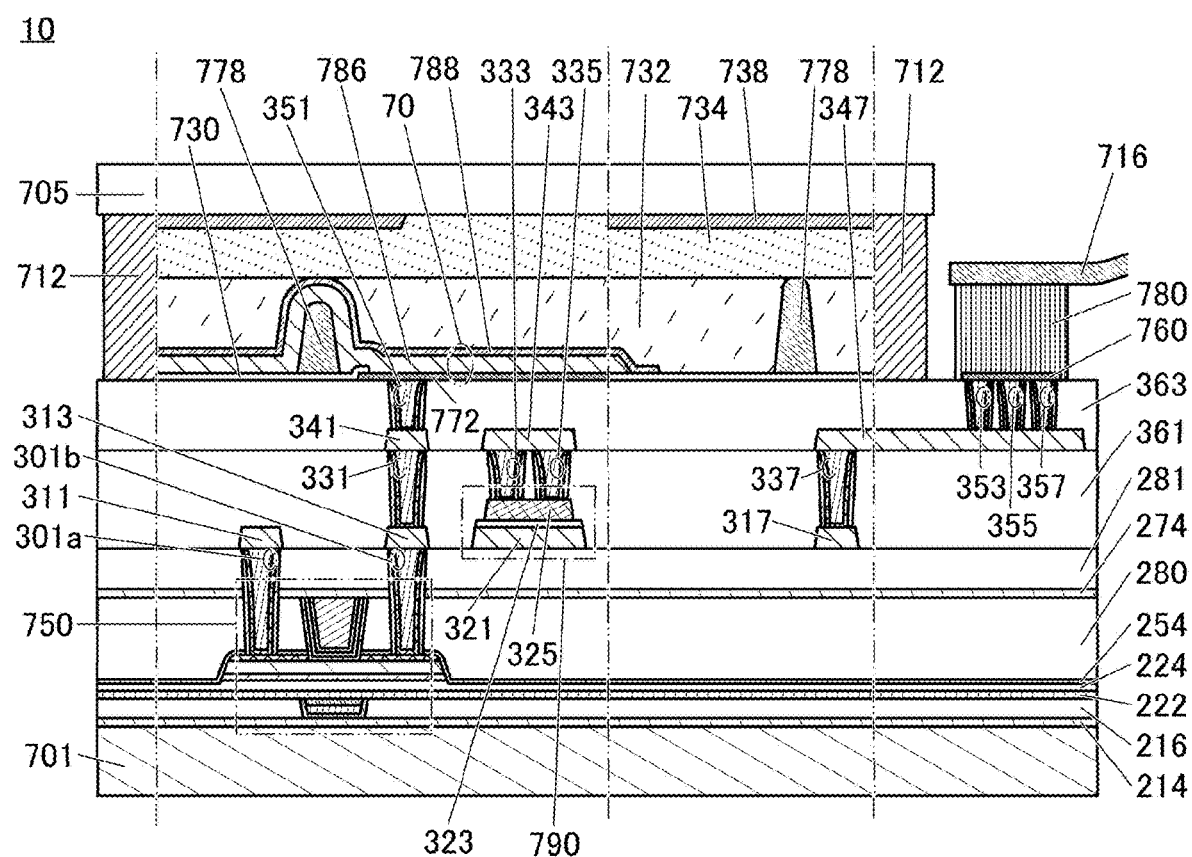
FIG. 14 is a cross-sectional view illustrating a structure example of a display apparatus.

FIG. 14 illustrates a variation example of the display apparatus 10 in FIG. 12. The display apparatus 10 in FIG. 14 is different from the display apparatus 10 illustrated in FIG. 12 in that the transistor 601 and the transistor 441 are not provided. As illustrated in FIG. 14, the display apparatus does not necessarily include S1 transistors and may include only OS transistors. It is preferable to use an OS transistor for the pixel circuit. Furthermore, at least part of the driver circuit may be formed with an OS transistor. In addition, at least part of the functional circuit may be formed with an OS transistor. Additionally, at least part of the driver circuit may be externally provided. At least part of the functional circuit may be externally provided. In the example illustrated in FIG. 14, the transistor 750 is provided over the substrate 701. As the substrate 701, a single crystal semiconductor substrate such as a single crystal silicon substrate, or another semiconductor substrate can be used as described above. In addition, a variety of insulator substrates such as a glass substrate or a sapphire substrate may be used as the substrate 701.

Figure 15:
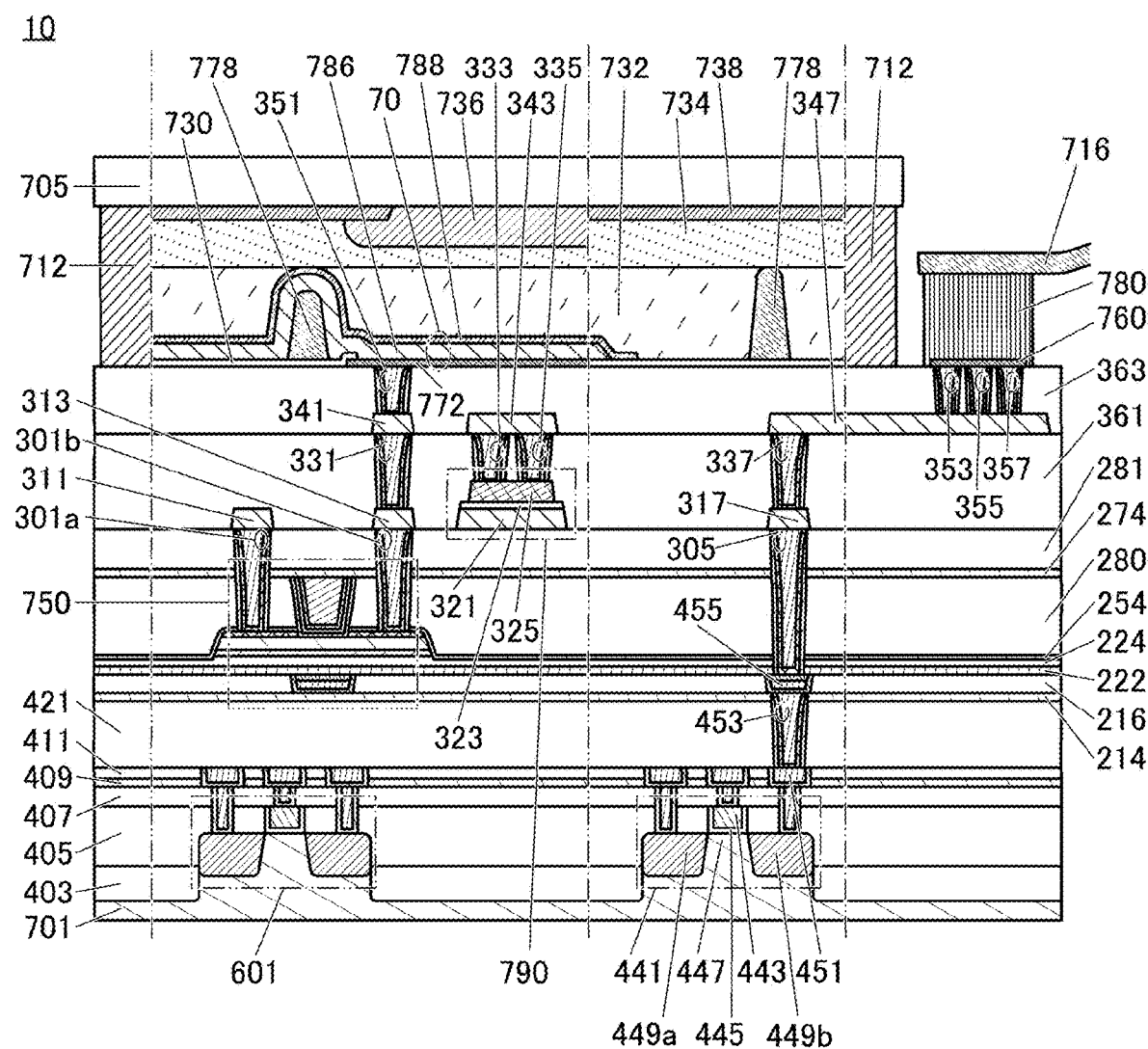
FIG. 15 is a cross-sectional view illustrating a structure example of a display apparatus.

FIG. 15 illustrates a variation example of the display apparatus 10 illustrated in FIG. 12. The display apparatus 10 illustrated in FIG. 15 is different from the display apparatus 10 illustrated in FIG. 12 in that a coloring layer 736 is provided. Note that the coloring layer 736 is provided to have a region overlapping with the light-emitting element 70. Providing the coloring layer 736 can improve the color purity of light extracted from the light-emitting element 70. Thus, the display apparatus 10 can display high-quality images. Furthermore, all the light-emitting elements 70, for example, in the display apparatus 10 can be light-emitting elements that emit white light; hence, the EL layers 786 are not necessarily formed separately for each color, leading to higher resolution of the display apparatus 10.

The light-emitting element 70 can have a micro optical resonator (microcavity) structure. Thus, light of predetermined colors (e.g., RGB) can be extracted without a coloring layer, and the display apparatus 10 can perform color display. The structure without a coloring layer can prevent light absorption by the coloring layer. As a result, the display apparatus 10 can display high-luminance images, and the power consumption of the display apparatus 10 can be reduced. A structure in which a coloring layer is not provided can be employed even when the EL layer 786 is formed into an island shape for each pixel or into a stripe shape for each pixel column, i.e., the EL layers 786 are formed separately for each color. Note that the luminance of the display apparatus 10 can be, for example, higher than or equal to 500 cd/m$^2$ and lower than or equal to 20000 cd/m$^2$, preferably higher than or equal to 1000 cd/m$^2$ and lower than or equal to 20000 cd/m$^2$, further preferably higher than or equal to 5000 cd/m$^2$ and lower than or equal to 20000 cd/m$^2$.

Figure 16:
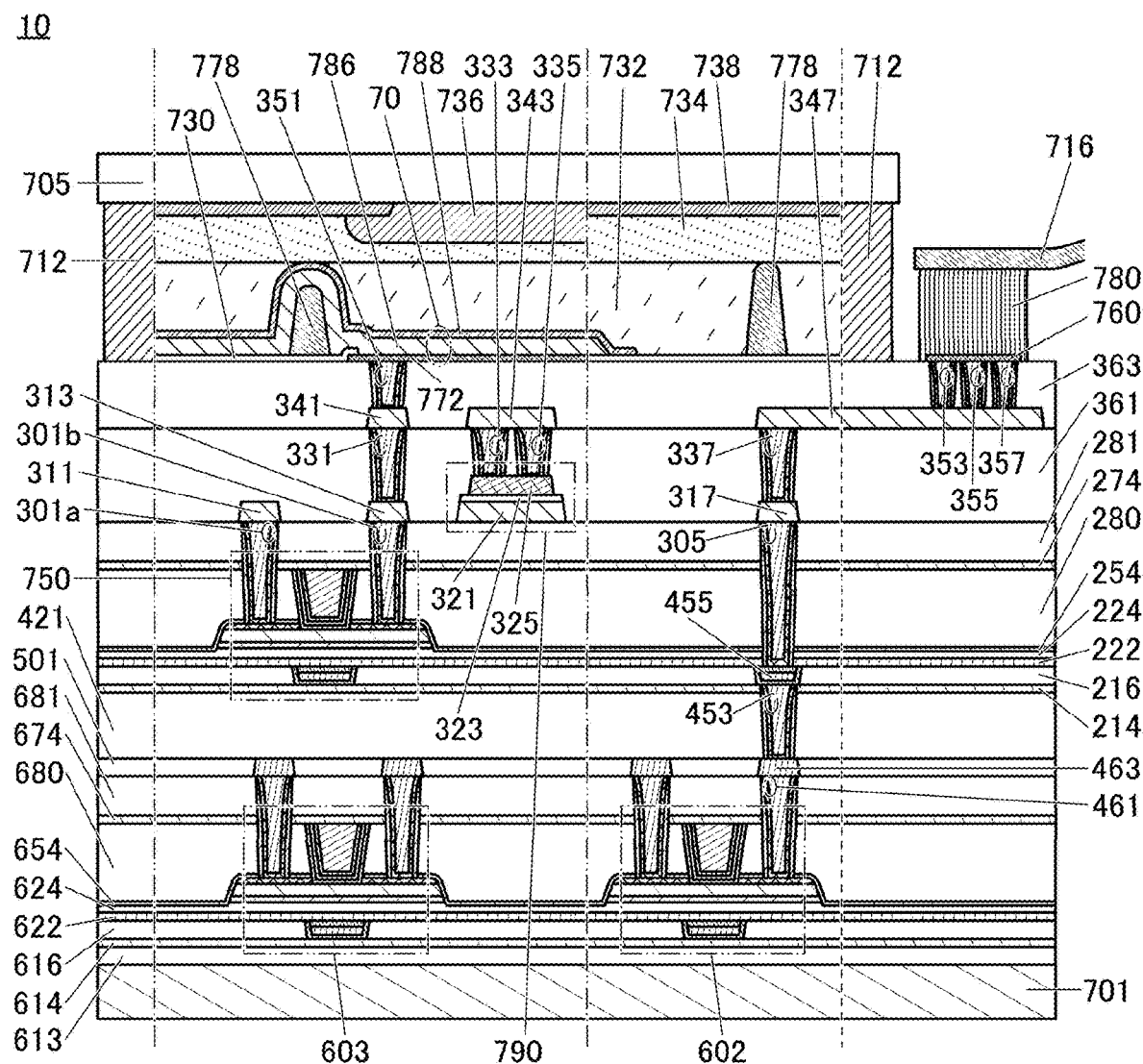
FIG. 16 is a cross-sectional view illustrating a structure example of a display apparatus.

Although FIG. 12 and FIG. 15 each illustrate a structure in which the transistor 441 and the transistor 601 are provided such that their channel formation regions are formed inside the substrate 701 and the OS transistor is stacked over the transistor 441 and the transistor 601, one embodiment of the present invention is not limited thereto. FIG. 16 illustrates a variation example of FIG. 15. The display apparatus 10 illustrated in FIG. 16 is different from the display apparatus 10 illustrated in FIG. 15 mainly in that a transistor 602 and a transistor 603 that are OS transistors are provided in place of the transistor 441 and the transistor 601. An OS transistor can be used as the transistor 750. That is, the display apparatus 10 illustrated in FIG. 16 includes a stack of OS transistors.

An insulator 613 and an insulator 614 are provided over the substrate 701, and the transistor 602 and the transistor 603 are provided over the insulator 614. Note that a transistor or the like may be provided between the substrate 701 and the insulator 613. For example, a transistor having a structure similar to those of the transistor 441 and the transistor 601 illustrated in FIG. 15 may be provided between the substrate 701 and the insulator 613.

The transistor 602 and the transistor 603 can be the transistors provided in the layer 30 described in the above embodiment. Thus, the transistor 602 and the transistor 603 can be OS transistors having a structure similar to that of the transistor 750. Note that the transistor 602 and the transistor 603 may be OS transistors having a structure different from that of the transistor 750.

An insulator 616, an insulator 622, an insulator 624, an insulator 654, an insulator 680, an insulator 674, and an insulator 681 are provided over the insulator 614, in addition to the transistor 602 and the transistor 603. A conductor 461 is embedded in the insulator 654, the insulator 680, the insulator 674, and the insulator 681. Here, the top surface of the conductor 461 and the top surface of the insulator 681 can be substantially level with each other.

An insulator 501 is provided over the conductor 461 and the insulator 681. A conductor 463 is embedded in the insulator 501. Here, the top surface of the conductor 463 and the top surface of the insulator 501 can be substantially level with each other.

The insulator 421 and the insulator 214 are provided over the conductor 463 and the insulator 501. The conductor 453 is embedded in the insulator 421 and the insulator 214. Here, the top surface of the conductor 453 and the top surface of the insulator 214 can be substantially level with each other.

As illustrated in FIG. 16, one of a source and a drain of the transistor 602 is electrically connected to the FPC 716 through the conductor 461, the conductor 463, the conductor 453, the conductor 455, the conductor 305, the conductor 317, the conductor 337, the conductor 347, the conductor 353, the conductor 355, the conductor 357, the connection electrode 760, and the anisotropic conductor 780.

The insulator 613, the insulator 614, the insulator 680, the insulator 674, the insulator 681, and the insulator 501 have a function of an interlayer film and may also have a function of a planarization film that covers unevenness thereunder.

When the display apparatus 10 has the structure illustrated in FIG. 16, all the transistors included in the display apparatus 10 can be OS transistors while the bezel and size of the display apparatus 10 are reduced. Accordingly, the transistors provided in the layer 30 and the transistors provided in the layer 40 can be manufactured using the same apparatus, for example. Consequently, the manufacturing cost of the display apparatus 10 can be reduced, making the display apparatus 10 inexpensive.

Figure 17:
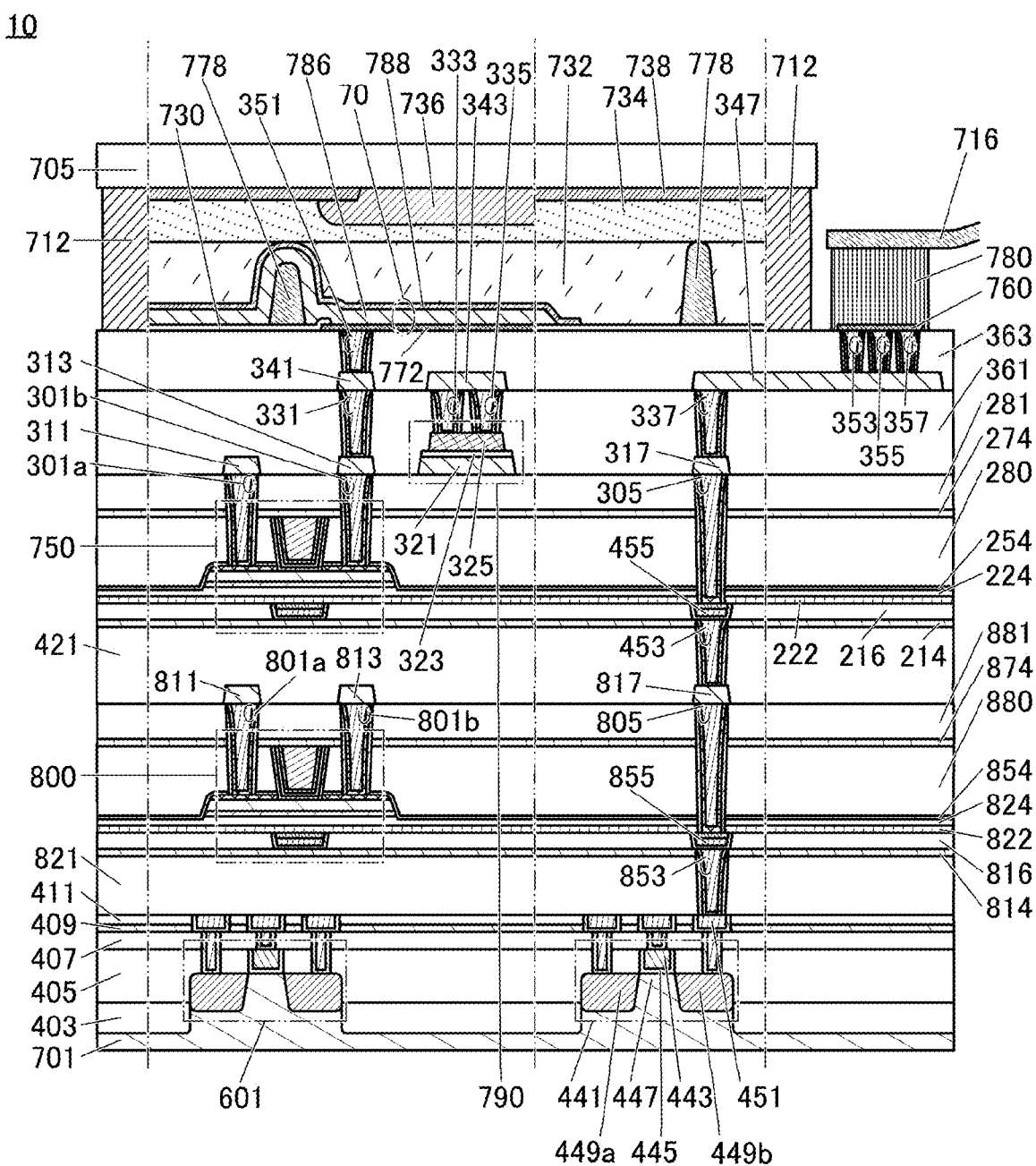
FIG. 17 is a cross-sectional view illustrating a structure example of a display apparatus.

FIG. 17 is a cross-sectional view illustrating a structure example of the display apparatus 10. The display apparatus 10 in FIG. 17 is different from the display apparatus 10 in FIG. 15 mainly in that a layer including a transistor 800 is provided between the layer including the transistor 750 and the layer including the transistor 601 and the transistor 441.

In the structure of FIG. 17, the layer 30 described in the above embodiment can include the layer including the transistor 601 and the transistor 441 and the layer including the transistor 800. The transistor 750 can be the transistor provided in the layer 40 described in the above embodiment.

An insulator 821 and an insulator 814 are provided over the conductor 451 and the insulator 411. A conductor 853 is embedded in the insulator 821 and the insulator 814. Here, the top surface of the conductor 853 and the top surface of the insulator 814 can be substantially level with each other.

An insulator 816 is provided over the conductor 853 and the insulator 814. A conductor 855 is embedded in the insulator 816. Here, the top surface of the conductor 855 and the top surface of the insulator 816 can be substantially level with each other.

An insulator 822, an insulator 824, an insulator 854, an insulator 880, an insulator 874, and an insulator 881 are provided over the conductor 855 and the insulator 816. A conductor 805 is embedded in the insulator 822, the insulator 824, the insulator 854, the insulator 880, the insulator 874, and the insulator 881. Here, the top surface of the conductor 805 and the top surface of the insulator 881 can be substantially level with each other.

The insulator 421 and the insulator 214 are provided over a conductor 817 and the insulator 881.

As illustrated in FIG. 17, the low-resistance region 449b functioning as the other of the source region and the drain region of the transistor 441 is electrically connected to the FPC 716 through the conductor 451, the conductor 853, the conductor 855, the conductor 805, the conductor 817, the conductor 453, the conductor 455, the conductor 305, the conductor 317, the conductor 337, the conductor 347, the conductor 353, the conductor 355, the conductor 357, the connection electrode 760, and the anisotropic conductor 780.

The transistor 800 is provided over the insulator 814. The transistor 800 is preferably an OS transistor, for example.

A conductor 801a and a conductor 801b are embedded in the insulator 854, the insulator 880, the insulator 874, and the insulator 881. The conductor 801a is electrically connected to one of a source and a drain of the transistor 800, and the conductor 801b is electrically connected to the other of the source and the drain of the transistor 800. Here, the top surfaces of the conductor 801a and the conductor 801b and the top surface of the insulator 881 can be substantially level with each other.

The insulator 405, the insulator 407, the insulator 409, the insulator 411, the insulator 821, the insulator 814, the insulator 880, the insulator 874, the insulator 881, the insulator 421, the insulator 214, the insulator 280, the insulator 274, the insulator 281, the insulator 361, and the insulator 363 have a function of an interlayer film and may also have a function of a planarization film that covers unevenness thereunder.

In the example illustrated in FIG. 17, the conductor 801a, the conductor 801b, and the conductor 805 are formed in the same layer. In the illustrated example, the conductor 811, the conductor 813, and the conductor 817 are formed in the same layer.

This embodiment can be combined with the description of the other embodiments as appropriate.

Embodiment 5

In this embodiment, transistors that can be used in the display apparatus of one embodiment of the present invention will be described.

<Structure Example of Transistor>

Figure 18A:
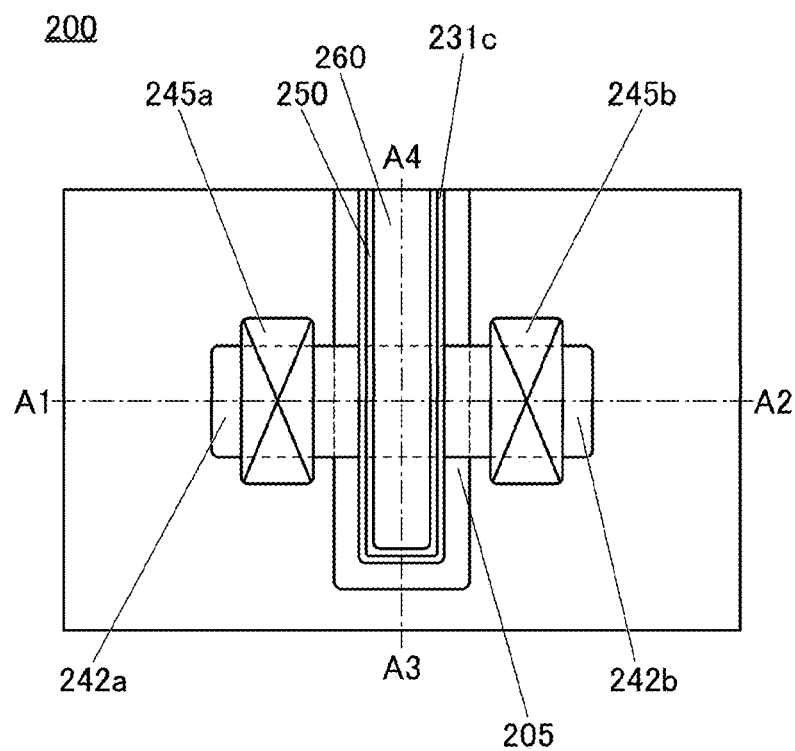
FIG. 18A is a top view illustrating a structure example of a transistor.
Figure 18C:
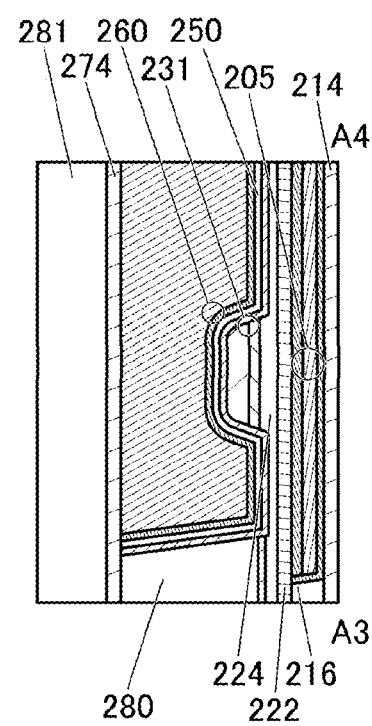
FIG. 18B and FIG. 18C are cross-sectional views illustrating the structure example of the transistor.
Figure 18B:
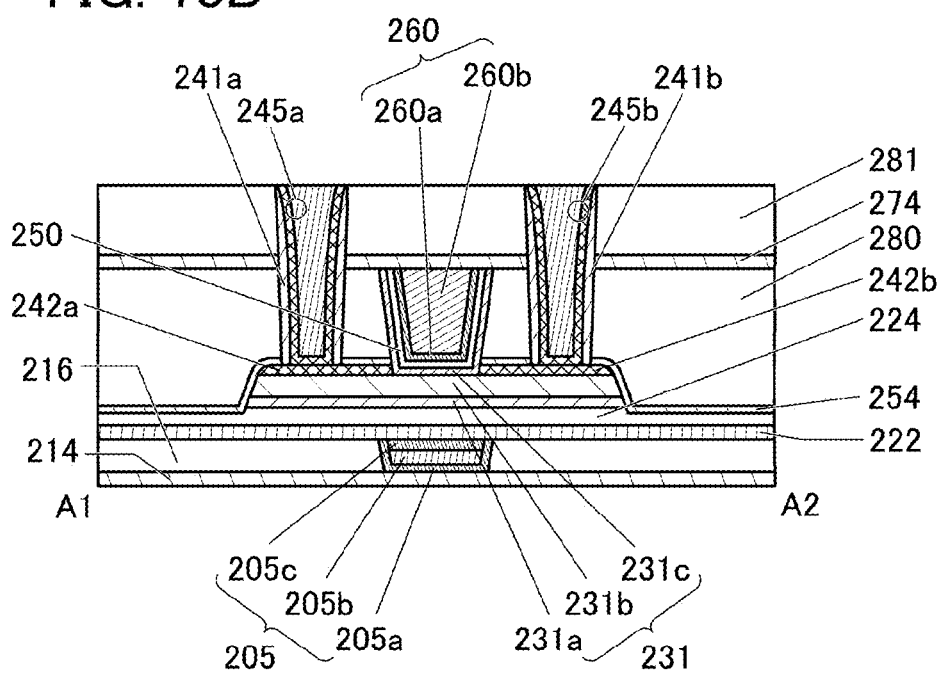

FIG. 18A, FIG. 18B, and FIG. 18C are a top view and cross-sectional views of a transistor 200 that can be used in the display apparatus of one embodiment of the present invention and the periphery of the transistor 200. The transistor 200 can be used in the display apparatus of one embodiment of the present invention.

FIG. 18A is a top view of the transistor 200. FIG. 18B and FIG. 18C are cross-sectional views of the transistor 200. Here, FIG. 18B is a cross-sectional view of a portion indicated by the dashed-dotted line A1-A2 in FIG. 18A and is a cross-sectional view of the transistor 200 in the channel length direction. FIG. 18C is a cross-sectional view of a portion indicated by the dashed-dotted line A3-A4 in FIG. 18A and is a cross-sectional view of the transistor 200 in the channel width direction. Note that some components are omitted in the top view of FIG. 18A for clarity of the drawing.

As illustrated in FIG. 18, the transistor 200 includes a metal oxide 231a placed over a substrate (not illustrated); a metal oxide 231b placed over the metal oxide 231a; a conductor 242a and a conductor 242b that are placed apart from each other over the metal oxide 231b; the insulator 280 that is placed over the conductor 242a and the conductor 242b and has an opening between the conductor 242a and the conductor 242b; a conductor 260 placed in the opening; an insulator 250 placed between the conductor 260 and each of the metal oxide 231b, the conductor 242a, the conductor 242b, and the insulator 280; and a metal oxide 231c placed between the insulator 250 and each of the metal oxide 231b, the conductor 242a, the conductor 242b, and the insulator 280. Here, as illustrated in FIG. 18B and FIG. 18C, preferably, the top surface of the conductor 260 is substantially aligned with the top surfaces of the insulator 250, the insulator 254, the metal oxide 231c, and the insulator 280. Hereinafter, the metal oxide 231a, the metal oxide 231b, and the metal oxide 231c may be collectively referred to as a metal oxide 231. The conductor 242a and the conductor 242b may be collectively referred to as a conductor 242.

In the transistor 200 illustrated in FIG. 18, side surfaces of the conductor 242a and the conductor 242b on the conductor 260 side are substantially perpendicular. Note that the transistor 200 illustrated in FIG. 18 is not limited thereto, and the angle formed between the side surfaces and the bottom surfaces of the conductor 242a and the conductor 242b may be greater than or equal to 10° and less than or equal to 80°, preferably greater than or equal to 30° and less than or equal to 60°. The side surfaces of the conductor 242a and the conductor 242b that face each other may have a plurality of surfaces.

As illustrated in FIG. 18, the insulator 254 is preferably placed between the insulator 280 and each of the insulator 224, the metal oxide 231a, the metal oxide 231b, the conductor 242a, the conductor 242b, and the metal oxide 231c. Here, as illustrated in FIG. 18B and FIG. 18C, the insulator 254 is preferably in contact with the side surface of the metal oxide 231c, the top surface and the side surface of the conductor 242a, the top surface and the side surface of the conductor 242b, the side surfaces of the metal oxide 231a and the metal oxide 231b, and the top surface of the insulator 224.

In the transistor 200, three layers of the metal oxide 231a, the metal oxide 231b, and the metal oxide 231c are stacked in and around the region where the channel is formed (hereinafter also referred to as channel formation region); however, the present invention is not limited thereto. For example, a two-layer structure of the metal oxide 231b and the metal oxide 231c or a stacked-layer structure of four or more layers may be employed. Although the conductor 260 is illustrated to have a stacked-layer structure of two layers in the transistor 200, the present invention is not limited thereto. For example, the conductor 260 may have a single-layer structure or a stacked-layer structure of three or more layers. Furthermore, each of the metal oxide 231a, the metal oxide 231b, and the metal oxide 231c may have a stacked-layer structure of two or more layers.

For example, in the case where the metal oxide 231c has a stacked-layer structure including a first metal oxide and a second metal oxide over the first metal oxide, the first metal oxide preferably has a composition similar to that of the metal oxide 231b and the second metal oxide preferably has a composition similar to that of the metal oxide 231a.

Here, the conductor 260 functions as a gate electrode of the transistor, and the conductor 242a and the conductor 242b each function as a source electrode or a drain electrode. As described above, the conductor 260 is formed to be embedded in the opening of the insulator 280 and the region interposed between the conductor 242a and the conductor 242b. Here, the positions of the conductor 260, the conductor 242a, and the conductor 242b are selected in a self-aligned manner with respect to the opening of the insulator 280. In other words, in the transistor 200, the gate electrode can be placed between the source electrode and the drain electrode in a self-aligned manner. Thus, the conductor 260 can be formed without an alignment margin, resulting in a reduction in the area occupied by the transistor 200. Accordingly, the display apparatus can have higher resolution. In addition, the display apparatus can have a narrow bezel.

As illustrated in FIG. 18, the conductor 260 preferably includes a conductor 260a provided on the inner side of the insulator 250 and a conductor 260b provided to be embedded on the inner side of the conductor 260a.

The transistor 200 preferably includes the insulator 214 placed over the substrate (not illustrated); the insulator 216 placed over the insulator 214; a conductor 205 placed to be embedded in the insulator 216; the insulator 222 placed over the insulator 216 and the conductor 205; and the insulator 224 placed over the insulator 222. The metal oxide 231a is preferably placed over the insulator 224.

The insulator 274 and the insulator 281 functioning as interlayer films are preferably placed over the transistor 200. Here, the insulator 274 is preferably placed in contact with the top surfaces of the conductor 260, the insulator 250, the insulator 254, the metal oxide 231c, and the insulator 280.

The insulator 222, the insulator 254, and the insulator 274 preferably have a function of inhibiting diffusion of at least one of hydrogen (e.g., a hydrogen atom and a hydrogen molecule). For example, the insulator 222, the insulator 254, and the insulator 274 preferably have a lower hydrogen permeability than the insulator 224, the insulator 250, and the insulator 280. Moreover, the insulator 222 and the insulator 254 preferably have a function of inhibiting diffusion of oxygen (e.g., at least one of an oxygen atom and an oxygen molecule). For example, the insulator 222 and the insulator 254 preferably have a lower oxygen permeability than the insulator 224, the insulator 250, and the insulator 280.

Here, the insulator 224, the metal oxide 231, and the insulator 250 are separated from the insulator 280 and the insulator 281 by the insulator 254 and the insulator 274. This can inhibit entry of impurities such as hydrogen contained in the insulator 280 and the insulator 281 and excess oxygen into the insulator 224, the metal oxide 231, and the insulator 250.

A conductor 245 (a conductor 245a and a conductor 245b) that is electrically connected to the transistor 200 and functions as a plug is preferably provided. Note that an insulator 241 (an insulator 241a and an insulator 241b) is provided in contact with the side surface of the conductor 245 functioning as a plug. In other words, the insulator 241 is provided in contact with the inner wall of an opening in the insulator 254, the insulator 280, the insulator 274, and the insulator 281. In addition, a structure may be employed in which a first conductor of the conductor 245 is provided in contact with the side surface of the insulator 241 and a second conductor of the conductor 245 is provided on the inner side of the first conductor. Here, the top surface of the conductor 245 and the top surface of the insulator 281 can be substantially level with each other. Although the transistor 200 has a structure in which the first conductor of the conductor 245 and the second conductor of the conductor 245 are stacked, the present invention is not limited thereto. For example, the conductor 245 may have a single-layer structure or a stacked-layer structure of three or more layers. In the case where a component has a stacked-layer structure, layers may be distinguished by ordinal numbers corresponding to the formation order.

In the transistor 200, a metal oxide functioning as an oxide semiconductor (hereinafter also referred to as an oxide semiconductor) is preferably used as the metal oxide 231 including the channel formation region (the metal oxide 231a, the metal oxide 231b, and the metal oxide 231c). For example, it is preferable to use a metal oxide having a band gap of 2 eV or more, preferably 2.5 eV or more as the metal oxide to be the channel formation region of the metal oxide 231.

The metal oxide preferably contains at least indium (In) or zinc (Zn). In particular, indium (In) and zinc (Zn) are preferably contained. In addition to them, an element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). Furthermore, the element M preferably contains one or both of gallium (Ga) and tin (Sn).

As illustrated in FIG. 18B, the metal oxide 231b in a region that is not overlapped by the conductor 242 sometimes has a smaller thickness than the metal oxide 231b in a region that is overlapped by the conductor 242. The thin region is formed when part of the top surface of the metal oxide 231b is removed at the time of forming the conductor 242a and the conductor 242b. When a conductive film to be the conductor 242 is formed, a low-resistance region is sometimes formed on the top surface of the metal oxide 231b in the vicinity of the interface with the conductive film. Removing the low-resistance region positioned between the conductor 242a and the conductor 242b on the top surface of the metal oxide 231b in the above manner can prevent formation of the channel in the region.

According to one embodiment of the present invention, a display apparatus that includes small-size transistors and has high resolution can be provided. A display apparatus that includes a transistor with a high on-state current and has high luminance can be provided. A display apparatus that includes a transistor operating at high speed and thus operates at high speed can be provided. A display apparatus that includes a transistor having stable electrical characteristics and is highly reliable can be provided. A display apparatus that includes a transistor with a low off-state current and has low power consumption can be provided.

The structure of the transistor 200 that can be used in the display apparatus of one embodiment of the present invention is described in detail.

The conductor 205 is placed to include a region overlapped by the metal oxide 231 and the conductor 260. Furthermore, the conductor 205 is preferably provided to be embedded in the insulator 216.

The conductor 205 includes a conductor 205a, a conductor 205b, and a conductor 205c. The conductor 205a is provided in contact with the bottom surface and a side wall of the opening provided in the insulator 216. The conductor 205b is provided to be embedded in a recessed portion formed by the conductor 205a. Here, the top surface of the conductor 205b is lower in level than the top surface of the conductor 205a and the top surface of the insulator 216. The conductor 205c is provided in contact with the top surface of the conductor 205b and the side surface of the conductor 205a. Here, the top surface of the conductor 205c is substantially level with the top surface of the conductor 205a and the top surface of the insulator 216. That is, the conductor 205b is surrounded by the conductor 205a and the conductor 205c.

Here, for the conductor 205a and the conductor 205c, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom and an oxygen molecule).

When the conductor 205a and the conductor 205c are formed using a conductive material having a function of inhibiting diffusion of hydrogen, impurities such as hydrogen contained in the conductor 205b can be inhibited from diffusing into the metal oxide 231 through the insulator 224 and the like. When the conductor 205a and the conductor 205c are formed using a conductive material having a function of inhibiting diffusion of oxygen, the conductivity of the conductor 205b can be inhibited from being lowered because of oxidation. As the conductive material having a function of inhibiting diffusion of oxygen, for example, titanium, titanium nitride, tantalum, tantalum nitride, ruthenium, ruthenium oxide, or the like is preferably used. Thus, the conductor 205a is a single layer or stacked layers of the above conductive materials. For example, titanium nitride is used for the conductor 205a.

For the conductor 205b, a conductive material containing tungsten, copper, or aluminum as its main component is preferably used. For example, tungsten is used for the conductor 205b.

The conductor 260 sometimes functions as a first gate (also referred to as top gate) electrode. The conductor 205 sometimes functions as a second gate (also referred to as bottom gate) electrode. In that case, by changing a potential applied to the conductor 205 not in synchronization with but independently of a potential applied to the conductor 260, $V_{th}$ of the transistor 200 can be controlled. In particular, by applying a negative potential to the conductor 205, $V_{th}$ of the transistor 200 can be higher than 0 V and the off-state current can be made low. Thus, a drain current at the time when a potential applied to the conductor 260 is 0 V can be lower in the case where a negative potential is applied to the conductor 205 than in the case where the negative potential is not applied to the conductor 205.

The conductor 205 is preferably provided to be larger than the channel formation region in the metal oxide 231. In particular, it is preferable that the conductor 205 extend beyond an end portion of the metal oxide 231 that intersects with the channel width direction, as illustrated in FIG. 18C. In other words, the conductor 205 and the conductor 260 preferably overlap with each other with the insulator placed therebetween, in a region outside the side surface of the metal oxide 231 in the channel width direction.

With the above structure, the channel formation region of the metal oxide 231 can be electrically surrounded by electric fields of the conductor 260 having a function of the first gate electrode and electric fields of the conductor 205 having a function of the second gate electrode.

Furthermore, as illustrated in FIG. 18C, the conductor 205 extends to function as a wiring as well. However, without limitation to this structure, a structure in which a conductor functioning as a wiring is provided below the conductor 205 may be employed.

The insulator 214 preferably functions as a barrier insulating film that inhibits the entry of impurities such as water or hydrogen to the transistor 200 from the substrate side. Accordingly, it is preferable to use, for the insulator 214, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the impurities are less likely to pass). Alternatively, it is preferable to use an insulating material having a function of inhibiting diffusion of oxygen (e.g., at least one of an oxygen atom and an oxygen molecule) (an insulating material through which the oxygen is less likely to pass).

For example, aluminum oxide or silicon nitride is preferably used for the insulator 214. Accordingly, it is possible to inhibit diffusion of impurities such as water or hydrogen to the transistor 200 side from the substrate side through the insulator 214. Alternatively, it is possible to inhibit diffusion of oxygen contained in the insulator 224 and the like to the substrate side through the insulator 214.

The permittivity of each of the insulator 216, the insulator 280, and the insulator 281 functioning as an interlayer film is preferably lower than that of the insulator 214. When a material with a low permittivity is used for an interlayer film, the parasitic capacitance generated between wirings can be reduced. For the insulator 216, the insulator 280, and the insulator 281, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 222 and the insulator 224 have a function of a gate insulator.

Here, the insulator 224 in contact with the metal oxide 231 preferably releases oxygen by heating. In this specification, oxygen that is released by heating is referred to as excess oxygen in some cases. For example, silicon oxide, silicon oxynitride, or the like can be used as appropriate for the insulator 224. When an insulator containing oxygen is provided in contact with the metal oxide 231, oxygen vacancies in the metal oxide 231 can be reduced, leading to improved reliability of the transistor 200.

Specifically, an oxide material that releases part of oxygen by heating is preferably used for the insulator 224. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in the range of 100° C. to 700° C., inclusive or 100° C. to 400° C., inclusive.

As illustrated in FIG. 18C, the insulator 224 is sometimes thinner in a region that is overlapped by neither the insulator 254 nor the metal oxide 231b than in the other regions. In the insulator 224, the region that is overlapped by neither the insulator 254 nor the metal oxide 231b preferably has a thickness with which the above oxygen can be adequately diffused.

Like the insulator 214 and the like, the insulator 222 preferably functions as a barrier insulating film that inhibits the entry of impurities such as water or hydrogen into the transistor 200 from the substrate side. For example, the insulator 222 preferably has a lower hydrogen permeability than the insulator 224. When the insulator 224, the metal oxide 231, the insulator 250, and the like are surrounded by the insulator 222, the insulator 254, and the insulator 274, the entry of impurities such as water or hydrogen into the transistor 200 from outside can be inhibited.

Furthermore, it is preferable that the insulator 222 have a function of inhibiting diffusion of oxygen (e.g., at least one of an oxygen atom and an oxygen molecule) (it is preferable that the oxygen be less likely to pass through the insulator 222). For example, the insulator 222 preferably has a lower oxygen permeability than the insulator 224. The insulator 222 preferably has a function of inhibiting diffusion of oxygen and impurities, in which case oxygen contained in the metal oxide 231 is less likely to diffuse to the substrate side. Moreover, the conductor 205 can be inhibited from reacting with oxygen contained in the insulator 224 and the metal oxide 231.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer inhibiting release of oxygen from the metal oxide 231 and entry of impurities such as hydrogen into the metal oxide 231 from the periphery of the transistor 200.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

The insulator 222 may be a single layer or a stacked layer using an insulator containing a high-k material, such as aluminum oxide, hafnium oxide, tantalum oxide, zirconium oxide, lead zirconate titanate (PZT), strontium titanate (SrTiO$_3$), or (Ba,Sr)TiO$_3$ (BST). With further miniaturization and higher integration of a transistor, a problem such as generation of leakage current may arise because of a thinned gate insulator. When a high-k material is used for the insulator functioning as a gate insulator, a gate potential at the time of operation of the transistor can be reduced while the physical thickness is maintained.

Note that the insulator 222 and the insulator 224 may each have a stacked-layer structure of two or more layers. In that case, without limitation to a stacked-layer structure formed of the same material, a stacked-layer structure formed of different materials may be employed. For example, an insulator similar to the insulator 224 may be provided below the insulator 222.

The metal oxide 231 includes the metal oxide 231a, the metal oxide 231b over the metal oxide 231a, and the metal oxide 231c over the metal oxide 231b. When the metal oxide 231 includes the metal oxide 231a under the metal oxide 231b, it is possible to inhibit diffusion of impurities into the metal oxide 231b from the components formed below the metal oxide 231a. Moreover, when the metal oxide 231 includes the metal oxide 231c over the metal oxide 231b, it is possible to inhibit diffusion of impurities into the metal oxide 231b from the components formed above the metal oxide 231c.

Note that the metal oxide 231 preferably has a stacked-layer structure of a plurality of oxide layers that differ in the atomic ratio of metal atoms. For example, in the case where the metal oxide 231 contains at least indium (In) and the element M, the proportion of the number of atoms of the element M contained in the metal oxide 231a to the number of atoms of all elements that constitute the metal oxide 231a is preferably higher than the proportion of the number of atoms of the element M contained in the metal oxide 231b to the number of atoms of all elements that constitute the metal oxide 231b. In addition, the atomic ratio of the element M to In in the metal oxide 231a is preferably greater than the atomic ratio of the element M to In in the metal oxide 231b. Here, a metal oxide that can be used as the metal oxide 231a or the metal oxide 231b can be used as the metal oxide 231c.

The energy of the conduction band minimum of each of the metal oxide 231a and the metal oxide 231c is preferably higher than the energy of the conduction band minimum of the metal oxide 231b. In other words, the electron affinity of each of the metal oxide 231a and the metal oxide 231c is preferably smaller than the electron affinity of the metal oxide 231b. In this case, a metal oxide that can be used as the metal oxide 231a is preferably used as the metal oxide 231c. Specifically, the proportion of the number of atoms of the element M contained in the metal oxide 231c to the number of atoms of all elements that constitute the metal oxide 231c is preferably higher than the proportion of the number of atoms of the element M contained in the metal oxide 231b to the number of atoms of all elements that constitute the metal oxide 231b. In addition, the atomic ratio of the element M to In in the metal oxide 231c is preferably greater than the atomic ratio of the element M to In in the metal oxide 231b.

Here, the energy level of the conduction band minimum gently changes at junction portions between the metal oxide 231a, the metal oxide 231b, and the metal oxide 231c. In other words, at junction portions between the metal oxide 231a, the metal oxide 231b, and the metal oxide 231c, the energy level of the conduction band minimum continuously changes or the energy levels are continuously connected. This can be achieved by decreasing the density of defect states in a mixed layer formed at the interface between the metal oxide 231a and the metal oxide 231b and the interface between the metal oxide 231b and the metal oxide 231c.

Specifically, when the metal oxide 231a and the metal oxide 231b or the metal oxide 231b and the metal oxide 231c contain the same element (as a main component) in addition to oxygen, a mixed layer with a low density of defect states can be formed. For example, an In—Ga—Zn oxide, a Ga—Zn oxide, gallium oxide, or the like may be used as the metal oxide 231a and the metal oxide 231c, in the case where the metal oxide 231b is an In—Ga—Zn oxide. The metal oxide 231c may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 231c may have a stacked-layer structure of an In—Ga—Zn oxide and an oxide that does not contain In.

Specifically, as the metal oxide 231a, a metal oxide with In:Ga:Zn=1:3:4 [atomic ratio] or 1:1:0.5 [atomic ratio] can be used. As the metal oxide 231b, a metal oxide with In:Ga:Zn=4:2:3 [atomic ratio] or 3:1:2 [atomic ratio] can be used. As the metal oxide 231c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Specific examples of a stacked-layer structure of the metal oxide 231c include a stacked-layer structure of a layer with In:Ga:Zn=4:2:3 [atomic ratio] and a layer with Ga:Zn=2:1 [atomic ratio], a stacked-layer structure of a layer with In:Ga:Zn=4:2:3 [atomic ratio] and a layer with Ga:Zn=2:5 [atomic ratio], and a stacked-layer structure of a layer with In:Ga:Zn=4:2:3 [atomic ratio] and a layer of gallium oxide.

At this time, the metal oxide 231b serves as a main carrier path. When the metal oxide 231a and the metal oxide 231c have the above structure, the density of defect states at the interface between the metal oxide 231a and the metal oxide 231b and the interface between the metal oxide 231b and the metal oxide 231c can be made low. This reduces the influence of interface scattering on carrier conduction, and the transistor 200 can have a high on-state current and high frequency characteristics. Note that in the case where the metal oxide 231c has a stacked-layer structure, not only the effect of reducing the density of defect states at the interface between the metal oxide 231b and the metal oxide 231c, but also the effect of inhibiting diffusion of the constituent element contained in the metal oxide 231c to the insulator 250 side can be expected. Specifically, the metal oxide 231c has a stacked-layer structure in which an oxide not containing In is positioned in the upper layer of the stacked-layer structure, whereby the diffusion of In to the insulator 250 side can be inhibited. Since the insulator 250 functions as a gate insulator, the transistor has defects in characteristics when In diffuses. Thus, the metal oxide 231c having a stacked-layer structure allows a highly reliable display apparatus to be provided.

The conductor 242 (the conductor 242a and the conductor 242b) functioning as the source electrode and the drain electrode is provided over the metal oxide 231b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen.

When the conductor 242 is provided in contact with the metal oxide 231, the oxygen concentration of the metal oxide 231 in the vicinity of the conductor 242 sometimes decreases. In addition, a metal compound layer that contains the metal contained in the conductor 242 and the component of the metal oxide 231 is sometimes formed in the metal oxide 231 in the vicinity of the conductor 242. In such cases, the carrier density of the region in the metal oxide 231 in the vicinity of the conductor 242 increases, and the region becomes a low-resistance region.

Here, the region between the conductor 242a and the conductor 242b is formed to be overlapped by the opening of the insulator 280. Accordingly, the conductor 260 can be placed in a self-aligned manner between the conductor 242a and the conductor 242b.

The insulator 250 functions as a gate insulator. The insulator 250 is preferably placed in contact with the top surface of the metal oxide 231c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 224, the concentration of impurities such as water or hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably inhibits oxygen diffusion from the insulator 250 into the conductor 260. Accordingly, oxidation of the conductor 260 due to oxygen in the insulator 250 can be inhibited.

The metal oxide functions as part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can be thermally stable and have a high dielectric constant. Accordingly, a gate potential applied during operation of the transistor can be reduced while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

Although the conductor 260 is illustrated to have a two-layer structure in FIG. 18, the conductor 260 may have a single-layer structure or a stacked-layer structure of three or more layers.

The conductor 260a is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of an oxygen atom and an oxygen molecule).

When the conductor 260a has a function of inhibiting diffusion of oxygen, the conductivity of the conductor 260b can be inhibited from being lowered by oxidation due to oxygen contained in the insulator 250. As a conductive material having a function of inhibiting oxygen diffusion, for example, tantalum, tantalum nitride, ruthenium, ruthenium oxide, or the like is preferably used.

Moreover, a conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of titanium or titanium nitride and the above conductive material.

As illustrated in FIG. 18A and FIG. 18C, the side surface of the metal oxide 231 is covered with the conductor 260 in a region where the metal oxide 231b is not overlapped by the conductor 242, that is, the channel formation region of the metal oxide 231. Accordingly, electric fields of the conductor 260 functioning as the first gate electrode are likely to act on the side surface of the metal oxide 231. Thus, the on-state current of the transistor 200 can be increased and the frequency characteristics can be improved.

The insulator 254, like the insulator 214 and the like, preferably functions as a barrier insulating film that inhibits the entry of impurities such as water or hydrogen into the transistor 200 from the insulator 280 side. The insulator 254 preferably has a lower hydrogen permeability than the insulator 224, for example. Furthermore, as illustrated in FIG. 18B and FIG. 18C, the insulator 254 is preferably in contact with the side surface of the metal oxide 231c, the top and side surfaces of the conductor 242a, the top and side surfaces of the conductor 242b, side surfaces of the metal oxide 231a and the metal oxide 231b, and the top surface of the insulator 224. Such a structure can inhibit the entry of hydrogen contained in the insulator 280 into the metal oxide 231 through the top surfaces or side surfaces of the conductor 242a, the conductor 242b, the metal oxide 231a, the metal oxide 231b, and the insulator 224.

Furthermore, it is preferable that the insulator 254 have a function of inhibiting diffusion of oxygen (e.g., at least one of an oxygen atom and an oxygen molecule) (it is preferable that the oxygen be less likely to pass through the insulator 254). For example, the insulator 254 preferably has a lower oxygen permeability than the insulator 280 or the insulator 224.

The insulator 254 is preferably formed by a sputtering method. When the insulator 254 is formed by a sputtering method in an oxygen-containing atmosphere, oxygen can be added to the vicinity of a region of the insulator 224 that is in contact with the insulator 254. Thus, oxygen can be supplied from the region to the metal oxide 231 through the insulator 224. Here, with the insulator 254 having a function of inhibiting upward diffusion of oxygen, oxygen can be prevented from diffusing from the metal oxide 231 into the insulator 280. Moreover, with the insulator 222 having a function of inhibiting downward diffusion of oxygen, oxygen diffusion from the metal oxide 231 to the substrate side can be prevented. In the above manner, oxygen is supplied to the channel formation region of the metal oxide 231. Accordingly, oxygen vacancies in the metal oxide 231 can be reduced, so that the transistor can be prevented from having normally-on characteristics.

As the insulator 254, an insulator containing an oxide of one or both of aluminum and hafnium is preferably formed, for example. Note that as the insulator containing an oxide of one or both of aluminum and hafnium, aluminum oxide, hafnium oxide, an oxide containing aluminum and hafnium (hafnium aluminate), or the like is preferably used.

The insulator 224, the insulator 250, and the metal oxide 231 are covered with the insulator 254 having a barrier property against hydrogen, whereby the insulator 280 is isolated from the insulator 224, the metal oxide 231, and the insulator 250 by the insulator 254. This can inhibit the entry of impurities such as hydrogen from outside of the transistor 200, resulting in favorable electrical characteristics and high reliability of the transistor 200.

The insulator 280 is provided over the insulator 224, the metal oxide 231, and the conductor 242 with the insulator 254 therebetween. The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride are preferable because they are thermally stable. In particular, materials such as silicon oxide, silicon oxynitride, and porous silicon oxide are preferably used, in which case a region containing oxygen to be released by heating can be easily formed.

The concentration of impurities such as water or hydrogen in the insulator 280 is preferably reduced. In addition, the top surface of the insulator 280 may be planarized.

Like the insulator 214 and the like, the insulator 274 preferably functions as a barrier insulating film that inhibits the entry of impurities such as water or hydrogen into the insulator 280 from the above. As the insulator 274, for example, the insulator that can be used as the insulator 214, the insulator 254, and the like can be used.

The insulator 281 functioning as an interlayer film is preferably provided over the insulator 274. As in the insulator 224 or the like, the concentration of impurities such as water or hydrogen in the insulator 281 is preferably reduced.

The conductor 245a and the conductor 245b are placed in openings formed in the insulator 281, the insulator 274, the insulator 280, and the insulator 254. The conductor 245a and the conductor 245b are placed to face each other with the conductor 260 interposed therebetween. Note that the top surfaces of the conductor 245a and the conductor 245b may be on the same plane as the top surface of the insulator 281.

The insulator 241a is provided in contact with the inner wall of the opening in the insulator 281, the insulator 274, the insulator 280, and the insulator 254, and the first conductor of the conductor 245a is formed in contact with the side surface of the insulator 241a. The conductor 242a is positioned on at least part of the bottom portion of the opening, and the conductor 245a is in contact with the conductor 242a. Similarly, the insulator 241b is provided in contact with the inner wall of the opening in the insulator 281, the insulator 274, the insulator 280, and the insulator 254, and the first conductor of the conductor 245b is formed in contact with the side surface of the insulator 241b. The conductor 242b is positioned on at least part of the bottom portion of the opening, and the conductor 245b is in contact with the conductor 242b.

The conductor 245a and the conductor 245b are preferably formed using a conductive material containing tungsten, copper, or aluminum as its main component. The conductor 245a and the conductor 245b may have a stacked-layer structure.

In the case where the conductor 245 has a stacked-layer structure, the aforementioned conductor having a function of inhibiting diffusion of impurities such as water or hydrogen is preferably used as the conductor in contact with the metal oxide 231a, the metal oxide 231b, the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or stacked layers. The use of the conductive material can inhibit oxygen added to the insulator 280 from being absorbed by the conductor 245a and the conductor 245b. Moreover, impurities such as water or hydrogen can be inhibited from entering the metal oxide 231 through the conductor 245a and the conductor 245b from a layer above the insulator 281.

As the insulator 241a and the insulator 241b, for example, the insulator that can be used as the insulator 254 or the like can be used. Since the insulator 241a and the insulator 241b are provided in contact with the insulator 254, impurities such as water or hydrogen in the insulator 280 or the like can be inhibited from entering the metal oxide 231 through the conductor 245a and the conductor 245b. Furthermore, oxygen contained in the insulator 280 can be inhibited from being absorbed by the conductor 245a and the conductor 245b.

Although not illustrated, a conductor functioning as a wiring may be placed in contact with the top surface of the conductor 245a and the top surface of the conductor 245b. For the conductor functioning as a wiring, a conductive material containing tungsten, copper, or aluminum as its main component is preferably used. Furthermore, the conductor may have a stacked-layer structure and may be a stack of titanium or a titanium nitride and the above conductive material, for example. Note that the conductor may be formed to be embedded in an opening provided in an insulator.

<Materials for Transistor>

Materials that can be used for the transistor will be described.

[Substrate]

As a substrate where the transistor 200 is formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the elements provided for the substrates include a capacitor, a resistor, a switching element, a light-emitting element, and a memory element.

[Insulator]

Examples of an insulator include an oxide, a nitride, an oxynitride, a nitride oxide, a metal oxide, a metal oxynitride, and a metal nitride oxide, each of which has an insulating property.

With further miniaturization and higher integration of a transistor, for example, a problem such as generation of leakage current may arise because of a thinned gate insulator. When a high-k material is used for the insulator functioning as a gate insulator, the voltage at the time of operation of the transistor can be reduced while the physical thickness is maintained. By contrast, when a material with a low dielectric constant is used for the insulator functioning as an interlayer film, parasitic capacitance generated between wirings can be reduced. Thus, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including an oxide semiconductor is surrounded by insulators having a function of inhibiting the passage of oxygen and impurities such as hydrogen (e.g., the insulator 214, the insulator 222, the insulator 254, and the insulator 274), the electrical characteristics of the transistor can be stable. An insulator having a function of inhibiting the passage of oxygen and impurities such as hydrogen can be formed to have a single layer or a stacked layer including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator is preferably an insulator including a region containing oxygen to be released by heating. For example, when a structure is employed in which silicon oxide or silicon oxynitride that includes a region containing oxygen to be released by heating is provided in contact with the metal oxide 231, oxygen vacancies included in the metal oxide 231 can be compensated.

[Conductor]

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used.

A plurality of conductors formed using any of the above materials may be stacked. For example, a stacked-layer structure combining a material containing the above metal element and a conductive material containing oxygen may be employed. In addition, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably employs a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide where the channel is formed. A conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

This embodiment can be combined with the description of the other embodiments as appropriate.

Embodiment 6

Described in this embodiment is a metal oxide (hereinafter also referred to as an oxide semiconductor) that can be used in an OS transistor described in the above embodiment.

<Classification of Crystal Structure>

First, the classification of crystal structures of an oxide semiconductor is described with reference to FIG. 19A. FIG. 19A is a diagram showing classification of crystal structures of an oxide semiconductor, typically IGZO (a metal oxide containing In, Ga, and Zn).

As shown in FIG. 19A, an oxide semiconductor is roughly classified into "Amorphous", "Crystalline", and "Crystal". "Amorphous" includes completely amorphous. The term "Crystalline" includes CAAC (c-axis-aligned crystalline), nc (nanocrystalline), and CAC (Cloud-Aligned Composite) (excluding single crystal and poly crystal). Note that in the classification of "Crystalline," single crystal, poly crystal, and completely amorphous are excluded. The term "Crystal" includes single crystal and poly crystal.

Note that the structures in the thick frame in FIG. 19A are in an intermediate state between "Amorphous" and "Crystal", and belong to a new crystalline phase. That is, these structures are completely different from "Crystal" and "Amorphous", which is energetically unstable.

A crystal structure of a film or a substrate can be evaluated with an X-Ray Diffraction (XRD) spectrum. FIG. 19B shows an XRD spectrum, which is obtained using GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 19B and obtained by GIXD measurement is hereinafter simply referred to as an XRD spectrum. The CAAC-IGZO film in FIG. 19B has a composition in the vicinity of In:Ga:Zn=4:2:3 [atomic ratio]. The CAAC-IGZO film in FIG. 19B has a thickness of 500 nm.

As shown in FIG. 19B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 19B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 19C shows a diffraction pattern of a CAAC-IGZO film. FIG. 19C shows a diffraction pattern obtained with the NBED method in which an electron beam is incident in the direction parallel to the substrate. The CAAC-IGZO film in FIG. 19C has a composition in the vicinity of In:Ga:Zn=4:2:3 [atomic ratio]. In the nanobeam electron diffraction method, electron diffraction is performed with a probe diameter of 1 nm.

As shown in FIG. 19C, a plurality of spots indicating c-axis alignment are observed in the diffraction pattern of the CAAC-IGZO film.

[Structure of Oxide Semiconductor]

Oxide semiconductors might be classified in a manner different from that in FIG. 19A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the CAAC-OS, the nc-OS, and the a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, reduction in electron mobility due to the crystal grain boundary is less likely to occur. Moreover, since the crystallinity of an oxide semiconductor might be decreased by entry of impurities, formation of defects, and/or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter greater than the diameter of a nanocrystal (e.g., greater than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or less than the diameter of a nanocrystal (e.g., greater than or equal to 1 nm and less than or equal to 30 nm).

[A-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has higher hydrogen concentration than the nc-OS and the CAAC-OS.

[Structure of Oxide Semiconductor]

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] than the second region and has lower [Ga] than the second region. Moreover, the second region has higher [Ga] than the first region and has lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (μ) and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in the oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon and/or carbon, which are each one of Group 14 elements, is contained in the oxide semiconductor, defect states are formed in the oxide semiconductor. Thus, the concentration of silicon and carbon in the oxide semiconductor and the concentration of silicon and carbon in the vicinity of an interface with the oxide semiconductor (the concentrations obtained by SIMS) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor including an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

This embodiment can be combined with the description of the other embodiments as appropriate.

REFERENCE NUMERALS

10: display apparatus, 11: lens, 12: mirror, 13: separator, 14: mirror, 30: layer, 40: layer, 50: sensor portion, 51: sensor portion, 70: light-emitting element, 95: transistor, 96: capacitor, 101: housing, 102: display region, 103: wearing portion, 104: battery, 105: voltage generation portion, 106: control portion, 107: communication portion, 108: antenna, 111: lens, 121: earphone, 122: acoustic device

The invention claimed is:

1. A wearable electronic device comprising:
   a first mirror;
   a second mirror; and
   a display apparatus between the first mirror and the second mirror, the display apparatus comprising:
   a first layer comprising a display portion comprising a plurality of pixels; and
   a second layer comprising a line-of-sight sensor portion and an arithmetic portion,
   wherein each of the plurality of pixels comprises a light-emitting element,
   wherein the first layer is provided over the second layer,
   wherein the line-of-sight sensor portion is configured to obtain first information showing a direction of a user's line of sight, and
   wherein the arithmetic portion is configured to:
      determine a first region comprising a gaze point of the user on the display portion with use of the first information; and
      increase a definition of an image displayed on the first region.

2. The wearable electronic device according to claim 1,
wherein the arithmetic portion is configured to determine a second region adjacent to an outside of the first region, and
wherein the definition of the image displayed on the first region is higher than a definition of an image displayed on the second region.

3. The wearable electronic device according to claim 1, wherein the first information is obtained with use of light emitted from the display portion.

4. The wearable electronic device according to claim 1, wherein the arithmetic portion is configured to increase the definition of the image displayed on the first region with use of a neural network.

5. The wearable electronic device according to claim 1, wherein the arithmetic portion is configured to determine the definition of the image displayed on the first region in accordance with an image scene.

6. The wearable electronic device according to claim 1,
wherein the wearable electronic device is a glasses-type or goggle-type electronic device.

7. A wearable electronic device comprising:
a display apparatus comprising a plurality of pixels in a display region;
a first lens;
a second lens;
a first mirror;
a second mirror;
a third mirror; and
a fourth mirror,
wherein the display region comprises a first display region and a second display region,
wherein the first lens is placed between the first display region and the first mirror,
wherein the first mirror is configured to reflect a first image displayed on the first display region to the third mirror,
wherein the third mirror is configured to reflect the first image and transmit first external light,
wherein the second lens is placed between the second display region and the second mirror,
wherein the second mirror is configured to reflect a second image displayed on the second display region to the fourth mirror,
wherein the fourth mirror is configured to reflect the second image and transmit second external light,
wherein each of the plurality of pixels comprises a light-emitting element, and
wherein the display region is placed between the third mirror and the fourth mirror.

8. The wearable electronic device according to claim 7, wherein the first mirror and the second mirror are convex mirrors.

9. The wearable electronic device according to claim 7, wherein the third mirror and the fourth mirror are concave mirrors.

10. The wearable electronic device according to claim 7, wherein a user sees the first external light, the second external light, the first image, and the second image at the same time.

11. The wearable electronic device according to claim 7, wherein a definition of the display region is 8K.

12. The wearable electronic device according to claim 7, wherein a resolution of the display region is higher than or equal to 1000 ppi and lower than or equal to 10000 ppi.

13. The wearable electronic device according to claim 7, wherein an aspect ratio of the display region is 16:9.

* * * * *